(12) United States Patent
Okada et al.

(10) Patent No.: US 10,917,025 B2
(45) Date of Patent: Feb. 9, 2021

(54) POWER GENERATING ELEMENT CONVERTING VIBRATION ENERGY INTO ELECTRIC ENERGY

(71) Applicant: WACOH CORPORATION, Saitama (JP)

(72) Inventors: Kazuhiro Okada, Saitama (JP); Miho Okada, Saitama (JP)

(73) Assignee: WACOH CORPORATION, Saitama (JP)

( * ) Notice: Subject to any disclaimer, the term of this patent is extended or adjusted under 35 U.S.C. 154(b) by 414 days.

(21) Appl. No.: 15/872,393

(22) Filed: Jan. 16, 2018

(65) Prior Publication Data
US 2019/0115852 A1    Apr. 18, 2019

(30) Foreign Application Priority Data

Oct. 16, 2017 (JP) .................................. 2017-200571

(51) Int. Cl.
*H02N 2/18* (2006.01)
*H01L 41/113* (2006.01)

(52) U.S. Cl.
CPC ......... *H02N 2/186* (2013.01); *H01L 41/1134* (2013.01); *H02N 2/181* (2013.01); *H02N 2/188* (2013.01)

(58) Field of Classification Search
CPC ........ H02N 2/181; H02N 2/186; H02N 2/188; H01L 41/1134
See application file for complete search history.

(56) References Cited

U.S. PATENT DOCUMENTS 3,283,590 A * 11/1966 Shang .................. G01P 15/123
                                                              340/870.16
6,247,371 B1 * 6/2001 Namerikawa ....... G01P 15/0802
                                                              73/862
(Continued)

FOREIGN PATENT DOCUMENTS

JP          7-83667 A       3/1995
JP          10-243667 A    9/1998
(Continued)

OTHER PUBLICATIONS

European Search Report dated Aug. 13, 2018 for Application No. EP 18 15 1807.

(Continued)

*Primary Examiner* — Emily P Pham
(74) *Attorney, Agent, or Firm* — Ladas & Parry LLP

(57) ABSTRACT

A power generating element according to the present invention includes a pedestal formed in a frame shape in plan view, a vibrating body provided inside the pedestal, at least three first bridge supporting portions, each of the first bridge supporting portions extending along a first extending axis and configured to arrange the vibrating body to be supported on a pedestal, and a charge generating element. The first extending axes of a pair of the first bridge supporting portions adjacent to each other form a predetermined angle in a circumferential direction with the vibrating body defined as a center in plan view. At least one first electrode layer of the charge generating element is arranged on each of the first bridge supporting portions.

16 Claims, 29 Drawing Sheets

(56) References Cited

U.S. PATENT DOCUMENTS

| | | | | |
|---|---|---|---|---|
| 6,293,149 | B1* | 9/2001 | Yoshida | G01P 15/0802 73/514.01 |
| 6,396,196 | B1* | 5/2002 | Takeuchi | B32B 18/00 310/324 |
| 6,683,358 | B1* | 1/2004 | Ishida | B81B 3/0018 257/254 |
| 7,318,349 | B2* | 1/2008 | Vaganov | G01P 15/123 73/514.33 |
| 7,827,865 | B2* | 11/2010 | Hattori | G01P 15/123 73/514.33 |
| 7,882,740 | B2* | 2/2011 | Okada | G01C 19/56 73/511 |
| 7,892,876 | B2* | 2/2011 | Mehregany | B81C 1/00182 438/51 |
| 8,067,812 | B2* | 11/2011 | Kai | G01P 15/0802 257/419 |
| 8,319,396 | B2* | 11/2012 | Onishi | B06B 1/0651 310/324 |
| 8,372,677 | B2* | 2/2013 | Mehregany | B81C 1/00182 438/51 |
| 8,997,570 | B2* | 4/2015 | Maekawa | B81B 3/0078 73/514.33 |
| 9,735,710 | B2 | 8/2017 | Hasegawa et al. | |
| 2005/0056096 | A1* | 3/2005 | Ozawa | G01P 15/125 73/514.36 |
| 2005/0217378 | A1* | 10/2005 | Ishikawa | G01P 1/023 73/514.01 |
| 2008/0028855 | A1* | 2/2008 | Kano | G01C 19/5698 73/504.12 |
| 2009/0255339 | A1* | 10/2009 | McNeil | G01P 15/18 73/514.15 |
| 2013/0154439 | A1 | 6/2013 | Lee et al. | |
| 2015/0295520 | A1 | 10/2015 | Hasegawa et al. | |
| 2016/0211439 | A1 | 7/2016 | Najafi et al. | |
| 2016/0211778 | A1 | 7/2016 | Okada et al. | |
| 2018/0162723 | A1* | 6/2018 | Degawa | B81B 7/02 |

FOREIGN PATENT DOCUMENTS

| | | |
|---|---|---|
| JP | 2005-57982 A | 3/2005 |
| JP | 3135181 U | 8/2007 |
| JP | 2008-190892 A | 8/2008 |
| JP | 2011-152010 A | 8/2011 |
| JP | 2013/135596 A | 7/2013 |
| JP | 5529328 B1 | 4/2014 |
| JP | 2016-200467 A | 12/2016 |
| JP | 2017-93118 A | 5/2017 |
| WO | 2014/141557 A1 | 9/2014 |
| WO | 2015/033621 A1 | 3/2015 |
| WO | 2016/199730 AI | 12/2016 |

OTHER PUBLICATIONS

Chinese Office Action dated Nov. 8, 2019 for Application No. CN 201810030846.8.
J-PlatPat English translation of JP 10-243667 A.
J-PlatPat English translation of JP 2011-152010 A.
Japanese Office Action dated Jun. 22, 2018 for Application No. JP 2017-200571.
J-PlatPat English translation of JP 2008-190892 A.
J-PlatPat English translation of JP 7-83667 A.
Japanese Office Action dated Feb. 27, 2018 for Japanese Application No. 2017-200571.
English translation of JP 2016-200467 A.
English translation of JP 2017-93118 A.
English translation of JP 2013/135596 A.
English translation of JP 3135181 U.
English translation of JP 2005-57982 A.

* cited by examiner

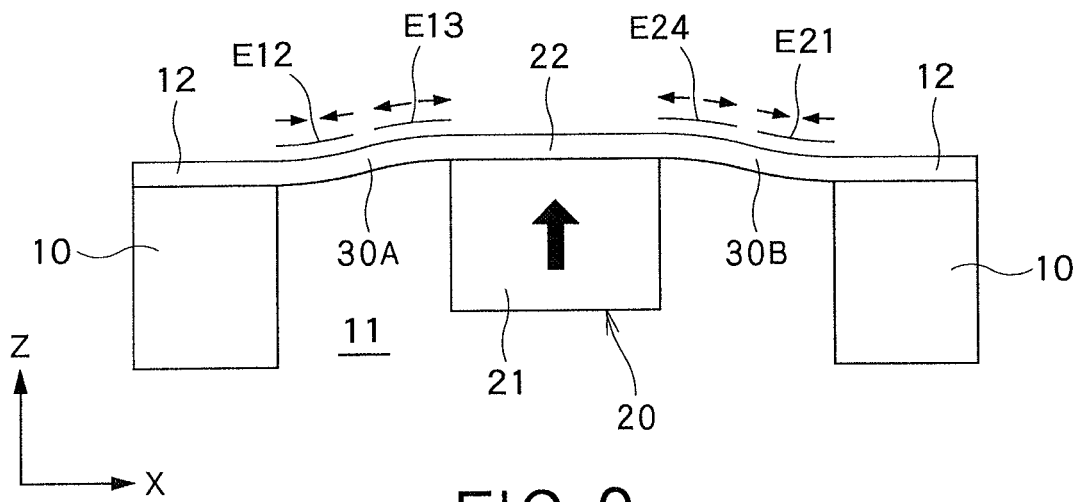
FIG.9
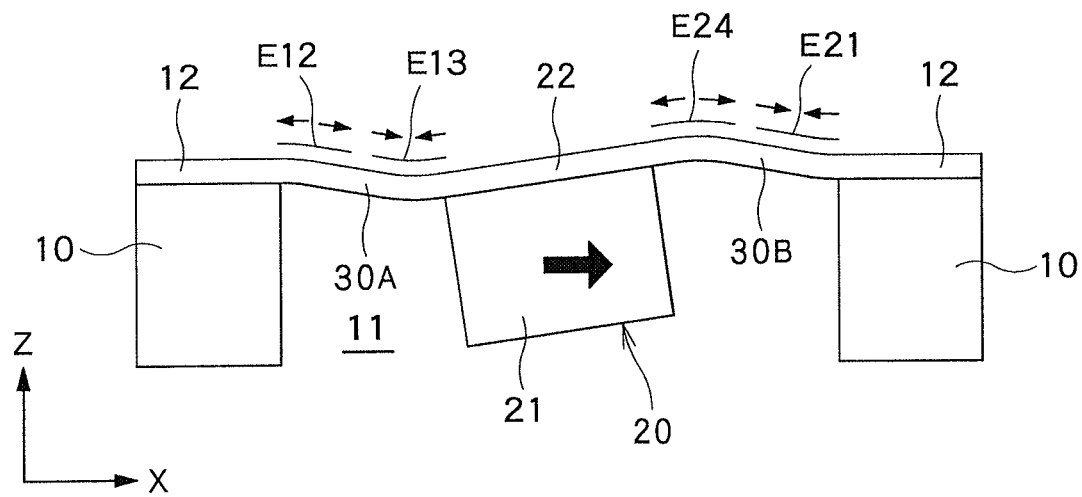
FIG.10
| | E11 | E12 | E13 | E14 | E21 | E22 | E23 | E24 | E31 | E32 | E33 | E34 | E41 | E42 | E43 | E44 |
|---|---|---|---|---|---|---|---|---|---|---|---|---|---|---|---|---|
| Fx | + | + | − | − | − | − | + | + | + | − | + | − | − | + | − | + |
| Fy | + | − | + | − | − | + | − | + | − | − | + | + | + | + | − | − |
| Fz | − | − | + | + | − | − | + | + | − | − | + | + | − | − | + | + |
FIG.11

|    | E1-1 | E1-2 | E2-1 | E2-2 | E3-1 | E3-2 | E4-1 | E4-2 |
|----|------|------|------|------|------|------|------|------|
| Fx | +    | −    | −    | +    | 0    | 0    | 0    | 0    |
| Fy | 0    | 0    | 0    | 0    | −    | +    | +    | −    |
| Fz | −    | +    | −    | +    | −    | +    | −    | +    |

FIG.41

POWER GENERATING ELEMENT CONVERTING VIBRATION ENERGY INTO ELECTRIC ENERGY

CROSS-REFERENCE TO RELATED APPLICATIONS

This application is based upon and claims the benefit of priority from Japanese Patent Application No. 2017-200571, filed on Oct. 16, 2017; the entire contents of which are incorporated herein by reference.

FIELD

The present invention relates to a power generating element.

BACKGROUND

In order to make effective use of limited resources, there are proposed techniques for converting various forms of energy into electric energy and extracting the converted energy. This includes a technique of converting vibration energy into electric energy and extracting converted energy. For example, JP 10-243667 A discloses a piezoelectric power generating element in which layered piezoelectric elements are laminated to form a power generating piezoelectric element and power generation is performed by causing the power generating piezoelectric element to vibrate by an external force. JP 2011-152010 A discloses a power generating element having a Micro Electro Mechanical System (MEMS) structure using a silicon substrate.

US Patent Publication No. 2013/0154439 discloses a power generating element having a hammer head type structure supporting a weight body. In this power generating element, the weight body constituting a head portion is vibrated and power is generated by a power generating piezoelectric element arranged in a handle portion. WO2015/033621 discloses a piezoelectric element having a structural body that supports a weight body by a plate bridge portion bent in an L shape together with the power generating element having the hammer head type structure.

The basic principle of these power generating elements is to generate periodic deflection in the piezoelectric element by vibrations of the weight body and extract a charge generated on the basis of a stress applied to the piezoelectric element to the outside. By mounting such a power generating element on an automobile, a train, a ship, for example, it is possible to extract vibration energy applied during transportation as electric energy. Moreover, it is also possible to generate power by attaching the power generating element to a vibration source such as a refrigerator and an air conditioner.

SUMMARY OF THE INVENTION

In the power generating elements in the above-described patent documents, a weight body is supported by a bridge portion having a cantilever structure with one end being fixed. With such a power generating element, efficient power generation can be performed against external vibration in a predetermined direction. It is difficult, however, to perform efficient power generation against external vibration in a direction different from the predetermined direction. In order to enhance power generation efficiency of the power generating element, it is desired to enable highly efficient power generation in any direction in three-dimensions (three-axis power generation).

The present invention has been made in view of these points, and is intended to provide a power generating element capable of efficiently performing three-axis power generation.

The present invention provides, as a first solution, a power generating element including: a pedestal formed in a frame shape in plan view; a vibrating body provided inside the pedestal; at least three first bridge supporting portions, each of the first bridge supporting portions extending along a first extending axis and configured to arrange the vibrating body to be supported on the pedestal; and a charge generating element that generates a charge at the time of displacement of the vibrating body, in which the first extending axes of a pair of the first bridge supporting portions adjacent to each other in a circumferential direction with the vibrating body defined as a center in plan view form a predetermined angle, the charge generating element includes a plurality of first electrode layers being electrically independent from each other, and at least one of the first electrode layers is arranged on each of the first bridge supporting portions.

The power generating element according to the first solution described above may be configured such that the first extending axes of the plurality of first bridge supporting portions are arranged radially with respect to the vibrating body in plan view.

The power generating element according to the first solution described above may be configured such that the angles formed by the first extending axes of the first bridge supporting portions adjacent to each other in the circumferential direction with the vibrating body defined as a center in plan view are equal.

The power generating element according to the first solution described above may be configured such that the vibrating body is supported by four first bridge supporting portions.

The power generating element according to the first solution described above may be configured such that the vibrating body is supported by three first bridge supporting portions.

The power generating element according to the first solution described above may be configured such that the vibrating body includes a first weight body.

The power generating element according to the first solution described above may be configured such that a top plate coupled to the pedestal is provided above the first weight body, the top plate includes a top plate facing surface facing the first weight body, and the top plate facing surface includes a top plate-side projection to which the first weight body can abut in a case where the first weight body is displaced upward.

The power generating element according to the first solution described above may be configured such that a bottom plate coupled to the pedestal is provided below the first weight body, the bottom plate includes a bottom plate facing surface facing the first weight body, and the bottom plate facing surface includes a bottom plate-side projection to which the first weight body can abut in a case where the first weight body is displaced downward.

The power generating element according to the first solution described above may be configured such that the first weight body includes: a first weight body central portion; and a plurality of first weight body protrusions coupled to the first weight body central portion and protruding from the first weight body central portion toward the pedestal.

The power generating element according to the first solution described above may be configured such that the first weight body protrusion is arranged between the first bridge supporting portions adjacent to each other in a circumferential direction with the first weight body central portion defined as a center in plan view.

The power generating element according to the first solution described above may be configured such that an outer edge of the first weight body protrusion on the pedestal side is formed along an inner edge of the pedestal, and an outer edge of the first weight body protrusion on the opposing first bridge supporting portion side is formed along a side edge of said first bridge supporting portion.

The power generating element according to the first solution described above may be configured such that the first bridge supporting portion includes: a first direction portion extending along the first extending axis; and a second direction portion provided on more toward the pedestal side than the first direction portion and extending in a direction different from the first extending axis.

The power generating element according to the first solution described above may be configured such that the second direction portion extends in a direction perpendicular to the first extending axis.

The power generating element according to the first solution described above may be configured such that the first bridge supporting portion includes a vibrating body-side portion, an intermediate portion, and a pedestal-side portion, being arranged at mutually different positions in a direction perpendicular to the first extending axis, an end of the vibrating body-side portion on the pedestal side is coupled with an end of the intermediate portion on the vibrating body side by a first coupling portion, and an end of the intermediate portion on the pedestal side is coupled with an end of the pedestal-side portion on the vibrating body side by a second coupling portion.

The power generating element according to the first solution described above may be configured such that the first coupling portion and the second coupling portion extend in a direction different from the first extending axis.

The power generating element according to the first solution described above may be configured such that the first coupling portion and the second coupling portion extend in a direction perpendicular to the first extending axis The power generating element according to the first solution described above may be configured such that a first additional weight body is provided on a lower surface of the first weight body.

The power generating element according to the first solution described above may be configured such that the first additional weight body includes a first stopper portion that regulates displacement of the first weight body.

The power generating element according to the first solution described above may be configured such that the pedestal includes a first seat to which the first stopper portion can abut in a case where the first weight body is displaced upward.

The power generating element according to the first solution described above may be configured such that an additional pedestal facing the first additional weight body is provided on the pedestal, and the additional pedestal includes a second seat to which the first stopper portion can abut in a case where the first weight body is displaced in a direction along a plane including each of the first extending axes of the first bridge supporting portions.

The power generating element according to the first solution described above may be configured such that an additional pedestal facing the first additional weight body is provided on the pedestal, a bottom plate coupled to the pedestal via the additional pedestal is provided below the first additional weight body, and the bottom plate includes a third seat to which the first additional weight body can abut in a case where the first weight body is displaced downward.

The power generating element according to the first solution described above may be configured such that the third seat includes: a bottom plate facing surface facing the first additional weight body; and a bottom plate-side projection provided on the bottom plate facing surface and to which the first stopper portion can abut in a case where the first weight body is displaced downward.

The power generating element according to the first solution described above may be configured such that, in each of the first bridge supporting portions, the plurality of first electrode layers is arranged at mutually different positions in a direction along the first extending axis.

The power generating element according to the first solution described above may be configured such that, in each of the first bridge supporting portions, the plurality of first electrode layers is arranged at mutually different positions in a direction perpendicular to the first extending axis.

The power generating element according to the first solution described above may be configured such that the vibrating body includes: a first weight body; a second weight body; and at least three second bridge supporting portions coupling the first weight body with the second weight body, and the first weight body and the second weight body are spaced apart from each other.

The power generating element according to the first solution described above may be configured such that the second weight body is formed in a frame shape in plan view, and the first weight body is provided inside the second weight body.

The power generating element according to the first solution described above may be configured such that a resonance system defined on the basis of the first weight body and the second bridge supporting portion has a resonance frequency different from a resonance frequency of a resonance system defined on the basis of the second weight body and the first bridge supporting portion.

The power generating element according to the first solution described above may be configured such that a first weight body supporting portion that supports the first weight body extends from the first bridge supporting portion, a second weight body supporting portion that supports the second weight body extends from the second bridge supporting portion, a top plate coupled to the pedestal is provided above the first weight body supporting portion, the top plate includes a top plate facing surface facing the first weight body supporting portion and the second weight body supporting portion, and the top plate facing surface includes one or both of: a first top plate-side projection to which the first weight body can abut via the first weight body supporting portion in a case where the first weight body is displaced upward; and a second top plate-side projection to which the second weight body can abut via the second weight body supporting portion in a case where the second weight body is displaced upward.

The power generating element according to the first solution described above may be configured such that the top plate facing surface includes the first top plate-side projection and the second top plate-side projection, and when the vibrating body is in a neutral position, a distance between the first weight body supporting portion and the first top plate-side projection is longer than a distance between the second weight body supporting portion and the second top plate-side projection.

The power generating element according to the first solution described above may be configured such that a bottom plate coupled to the pedestal is provided below the first weight body, the bottom plate includes a bottom plate facing surface facing the first weight body and the second weight body, and the bottom plate facing surface includes one or both of: a first bottom plate-side projection to which the first weight body can abut in a case where the first weight body is displaced downward; and; a second bottom plate-side projection to which the second weight body can abut in a case where the second weight body is displaced downward.

The power generating element according to the first solution described above may be configured such that the bottom plate facing surface includes the first bottom plate-side projection and the second bottom plate-side projection, and when the vibrating body is in a neutral position, a distance between the first weight body and the first bottom plate-side projection is longer than a distance between the second weight body and the second bottom plate-side projection.

The power generating element according to the first solution described above may be configured such that the first weight body includes: a first weight body central portion; and a first weight body protrusion coupled to the first weight body central portion and protruding from the first weight body central portion toward the second weight body.

The power generating element according to the first solution described above may be configured such that the first weight body protrusion is arranged between the second bridge supporting portions adjacent to each other in a circumferential direction with the first weight body central portion defined as a center in plan view.

The power generating element according to the first solution described above may be configured such that an outer edge of the first weight body protrusion on the second weight body side is formed along an inner edge of the second weight body, and an outer edge of the first weight body protrusion on the opposing second bridge supporting portion side is formed along a side edge of said second bridge supporting portion.

The power generating element according to the first solution described above may be configured such that the second weight body includes: a second weight body frame portion; and a second weight body protrusion coupled to the second weight body frame portion and protruding from the second weight body frame portion toward the pedestal.

The power generating element according to the first solution described above may be configured such that the second weight body protrusion is arranged between the first bridge supporting portions adjacent to each other in a circumferential direction with the first weight body defined as a center in plan view.

The power generating element according to the first solution described above may be configured such that an outer edge of the second weight body protrusion on the pedestal side is formed along an inner edge of the pedestal, and an outer edge of the second weight body protrusion on the opposing first bridge supporting portion side is formed along a side edge of said first bridge supporting portion.

The power generating element according to the first solution described above may be configured such that a first additional weight body is provided on a lower surface of the first weight body.

The power generating element according to the first solution described above may be configured such that the first additional weight body includes a first stopper portion that regulates displacement of the first weight body.

The power generating element according to the first solution described above may be configured such that the second weight body includes a first seat for first weight body to which the first stopper portion can abut in a case where the first weight body is displaced upward.

The power generating element according to the first solution described above may be configured such that a second additional weight body is provided on a lower surface of the second weight body, and the second additional weight body includes a second seat for first weight body to which the first stopper portion can abut in a case where the first weight body is displaced in a direction along a plane including each of the first extending axes of the first bridge supporting portions.

The power generating element according to the first solution described above may be configured such that a second additional weight body is provided on a lower surface of the second weight body, and a bottom plate coupled to the pedestal is provided below the first additional weight body, and the bottom plate includes a third seat for first weight body to which the first additional weight body can abut in a case where the first weight body is displaced downward.

The power generating element according to the first solution described above may be configured such that the third seat for first weight body includes: a first bottom plate facing surface facing the first additional weight body; and a first bottom plate-side projection provided on the first bottom plate facing surface and to which the first additional weight body can abut in a case where the first weight body is displaced downward.

The power generating element according to the first solution described above may be configured such that a second additional weight body is provided on a lower surface of the second weight body, and the second additional weight body includes a fourth seat for first weight body to which the first stopper portion can abut in a case where the first weight body is displaced upward.

The power generating element according to the first solution described above may be configured such that a second additional weight body is provided on a lower surface of the second weight body.

The power generating element according to the first solution described above may be configured such that the second additional weight body includes a second stopper portion that regulates displacement of the second weight body.

The power generating element according to the first solution described above may be configured such that the pedestal includes a first seat for second weight body to which the second stopper portion can abut in a case where the second weight body is displaced upward.

The power generating element according to the first solution described above may be configured such that an additional pedestal that faces the second additional weight body is provided on the pedestal, and the additional pedestal includes a second seat for second weight body to which the second stopper portion can abut in a case where the second weight body is displaced in a direction along a plane including each of the first extending axes of the first bridge supporting portions.

The power generating element according to the first solution described above may be configured such that a bottom plate coupled to the pedestal is provided below the second additional weight body, and the bottom plate includes a third seat for second weight body to which the second additional weight body can abut in a case where the second weight body is displaced downward.

The power generating element according to the first solution described above may be configured such that the third seat for second weight body includes: a second bottom plate facing surface facing the second additional weight body; and a second bottom plate-side projection provided on the second bottom plate facing surface and to which the second additional weight body can abut in a case where the second weight body is displaced downward.

The power generating element according to the first solution described above may be configured such that an additional pedestal that faces the second additional weight body is provided on the pedestal, and the additional pedestal includes a fourth seat for second weight body to which the second stopper portion can abut in a case where the second weight body is displaced upward.

The power generating element according to the first solution described above may be configured such that a first additional weight body is provided on a lower surface of the first weight body, a second additional weight body is provided on a lower surface of the second weight body, a bottom plate coupled to the pedestal is provided below the first additional weight body and the second additional weight body, the bottom plate includes a bottom plate facing surface facing the first additional weight body and the second additional weight body, the bottom plate facing surface includes a first bottom plate-side projection to which the first additional weight body can abut in a case where the first weight body is displaced downward, and includes a second bottom plate-side projection to which the second additional weight body can abut in a case where the second weight body is displaced downward, and when the vibrating body is in a neutral position, a distance between the first additional weight body and the first bottom plate-side projection is longer than a distance between the second additional weight body and the second bottom plate-side projection.

The power generating element according to the first solution described above may be configured such that each of the second bridge supporting portions extends along a second extending axis, and the second extending axis of the second bridge supporting portion is extended along the first extending axis of the corresponding first bridge supporting portion.

The power generating element according to the first solution described above may be configured such that each of the second bridge supporting portions extends along a second extending axis, and the second extending axis of the second bridge supporting portion is arranged between the first extending axes of a pair of the first bridge supporting portions adjacent to each other in the circumferential direction with the vibrating body defined as a center in plan view.

The power generating element according to the first solution described above may be configured such that an angle formed by the second extending axis of the second bridge supporting portion and the first extending axis of one of the first bridge supporting portions adjacent to each other in the circumferential direction with the vibrating body defined as a center in plan view is equal to an angle formed by said second extending axis and the first extending axis of the other first bridge supporting portion.

The power generating element according to the first solution described above may be configured such that the second weight body includes a first draw-in recessed portion that draws in an end of the first bridge supporting portion on the second weight body side in plan view.

The power generating element according to the first solution described above may be configured such that the second weight body includes a second draw-in recessed portion that draws in an end of the second bridge supporting portion on the second weight body side in plan view.

The power generating element according to the first solution described above may be configured such that at least one of the first electrode layers is arranged on each of the second bridge supporting portions.

The power generating element according to the first solution described above may be configured such that, in each of the second bridge supporting portions, the plurality of first electrode layers is arranged at mutually different positions in a direction along the first extending axis of the corresponding first bridge supporting portion.

The power generating element according to the first solution described above may be configured such that, in each of the first bridge supporting portions, the plurality of first electrode layers is arranged at mutually different positions in a direction perpendicular to the first extending axis.

The present invention provides, as a second solution, a power generating element including: a vibrating body formed in a frame shape in plan view; a pedestal provided inside the vibrating body; at least three first bridge supporting portions, each of the first bridge supporting portions extending along a first extending axis and configured to arrange the vibrating body to be supported on the pedestal; and a charge generating element that generates a charge at the time of displacement of the vibrating body, in which the first extending axes of a pair of the first bridge supporting portions adjacent to each other in a circumferential direction with the pedestal defined as a center in plan view form a predetermined angle, the charge generating element includes a plurality of first electrode layers being electrically independent from each other, and at least one of the first electrode layers is arranged on each of the first bridge supporting portions.

The power generating element according to the second solution described above may be configured such that the vibrating body includes a first weight body.

The power generating element according to the second solution described above may be configured such that the first weight body includes: a first weight body frame portion; and a first weight body inner side portion coupled to the first weight body frame portion and protruding from the first weight body frame portion toward the pedestal.

The power generating element according to the second solution described above may be configured such that the first weight body inner side portion is arranged between the first bridge supporting portions adjacent to each other in the circumferential direction with the pedestal defined as a center in plan view.

The power generating element according to the second solution described above may be configured such that an inner edge of the first weight body inner side portion on the pedestal side is formed along an outer edge of the pedestal, and an inner edge of the first weight body inner side portion on the opposing first bridge supporting portion side is formed along a side edge of said first bridge supporting portion.

The power generating element according to the second solution described above may be configured such that the charge generating element further includes: a second electrode layer provided between the first bridge supporting portion and the first electrode layer; and a charge generating material layer provided between the first electrode layer and the second electrode layer.

The present invention provides, as a third solution, a power generating element including: a pedestal; a vibrating body provided so as to be able to vibrate with respect to the pedestal; a diaphragm supporting portion configured to arrange the vibrating body to be supported on the pedestal; and a charge generating element provided on the diaphragm supporting portion and configured to generate a charge at the time of displacement of the vibrating body, in which one of the pedestal and the vibrating body is formed in a frame shape in plan view, and the other is arranged inside the one.

The power generating element according to the third solution described above may be configured such that the vibrating body includes a first weight body.

The power generating element according to the third solution described above may be configured such that the pedestal is formed in a frame shape in plan view, the vibrating body is arranged inside the pedestal, the charge generating element includes a plurality of first electrode layers electrically independent from each other, and the each of the first electrode layers is arranged on each of both sides of the vibrating body in a direction along a first axis.

The power generating element according to the third solution described above may be configured such that, in a direction along the first axis, the plurality of first electrode layers is arranged at mutually different positions on one side with respect to the vibrating body, and the plurality of first electrode layers is arranged at mutually different positions on the other side with respect to the vibrating body.

The power generating element according to the third solution described above may be configured such that each of the first electrode layers is arranged on each of both sides of the vibrating body in a direction along a second axis orthogonal to the first axis.

The power generating element according to the third solution described above may be configured such that, in a direction along the second axis, the plurality of first electrode layers is arranged at mutually different positions on one side with respect to the vibrating body, and the plurality of first electrode layers is arranged at mutually different positions on the other side with respect to the vibrating body.

The power generating element according to the third solution described above may be configured such that the pedestal includes a pedestal opening formed in a circular shape in plan view, the vibrating body is formed in a circular shape in plan view, and the pedestal opening is formed concentrically with the vibrating body.

The power generating element according to the third solution described above may be configured such that the first electrode layer extends in a circumferential direction with the vibrating body defined as a center in plan view and is formed concentrically with the vibrating body.

The power generating element according to the third solution described above may be configured to further comprise a power generating circuit that rectifies a current based on a charge generated by the charge generating element and extracts electric power.

The present invention provides, as a fourth solution, a power generating element including: a pedestal; a vibrating body provided so as to be able to vibrate with respect to the pedestal; a supporting portion configured to arrange the vibrating body to be supported on the pedestal; and a charge generating element provided in the supporting portion and configured to generate a charge at the time of displacement of the vibrating body, in which the vibrating body includes a first weight body, a top plate coupled to the pedestal is provided above the first weight body, the top plate includes a top plate-facing surface facing the first weight body, and the top plate facing surface includes a top plate-side projection which the first weight body can abut in a case where the first weight body is displaced upward.

The present invention provides, as a fifth solution, a power generating element comprising: a pedestal; a vibrating body provided so as to be able to vibrate with respect to the pedestal; a supporting portion configured to arrange the vibrating body to be supported on the pedestal; and a charge generating element provided in the supporting portion and configured to generate a charge at the time of displacement of the vibrating body, in which the vibrating body includes a first weight body, a bottom plate coupled to the pedestal is provided below the first weight body, the bottom plate includes a bottom plate facing surface facing the first weight body, and the bottom plate facing surface includes a bottom plate-side projection to which the first weight body can abut in a case where the first weight body is displaced downward.

According to the present invention, it is possible to efficiently perform three-axis power generation.

BRIEF DESCRIPTION OF THE DRAWINGS

FIG. 9 is a diagram illustrating a displacement of a first weight body in a case where vibration acceleration toward a positive side on the Z-axis is applied in the power generating element illustrated in FIG. 1;

FIG. 10 is a diagram illustrating a displacement of a first weight body in a case where vibration acceleration toward a positive side on the X-axis is applied in the power generating element illustrated in FIG. 1;

FIG. 11 is a table illustrating a polarity of a charge generated in each of upper electrode layers in a case where vibration acceleration is applied to the positive side on the X-axis, the positive side on the Y-axis, and the positive side on the Z-axis in the power generating element illustrated in FIG. 1;

FIG. 41 is a table illustrating a polarity of a charge generated in each of upper electrode layers in a case where vibration acceleration is applied to the positive side on the X-axis, the positive side on the Y-axis, and the positive side on the Z-axis in the power generating element illustrated in FIG. 39;

DETAILED DESCRIPTION

Figure 1:
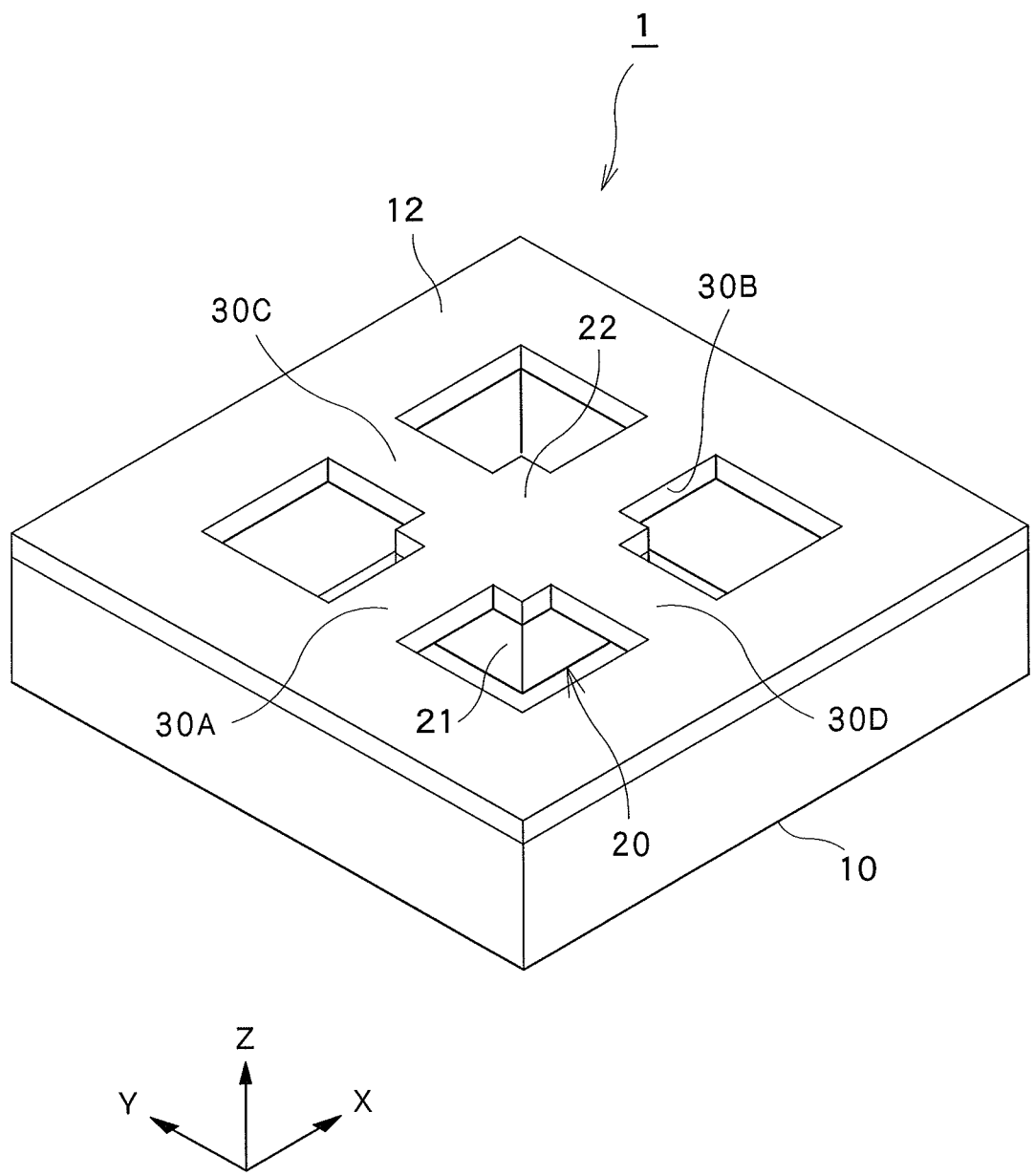
FIG. 1 is a perspective view illustrating a power generating element according to a first embodiment of the present invention.

Hereinafter, embodiments of the present invention will be described with reference to the drawings. In the drawings attached hereto, for convenience of illustration and ease of understanding, the scales, the aspect ratios in the vertical and horizontal directions or the like have been exaggerated being changed from those of the actual ones.

Terms such as "parallel", "orthogonal", "vertical", "perpendicular", "equal", "even" that specify shapes, geometric conditions and physical characteristics and degrees thereof, dimensions and values of physical characteristics or the like are to be interpreted inclusive of scopes to the extent that similar functions can be expected without being bound by a strict sense.

First Embodiment

A power generating element according to a first embodiment of the present invention will be described with reference to FIGS. 1 to 15. The power generating element according to the present embodiment is an element that converts vibration energy into electric energy thereby generating power.

Figure 2:
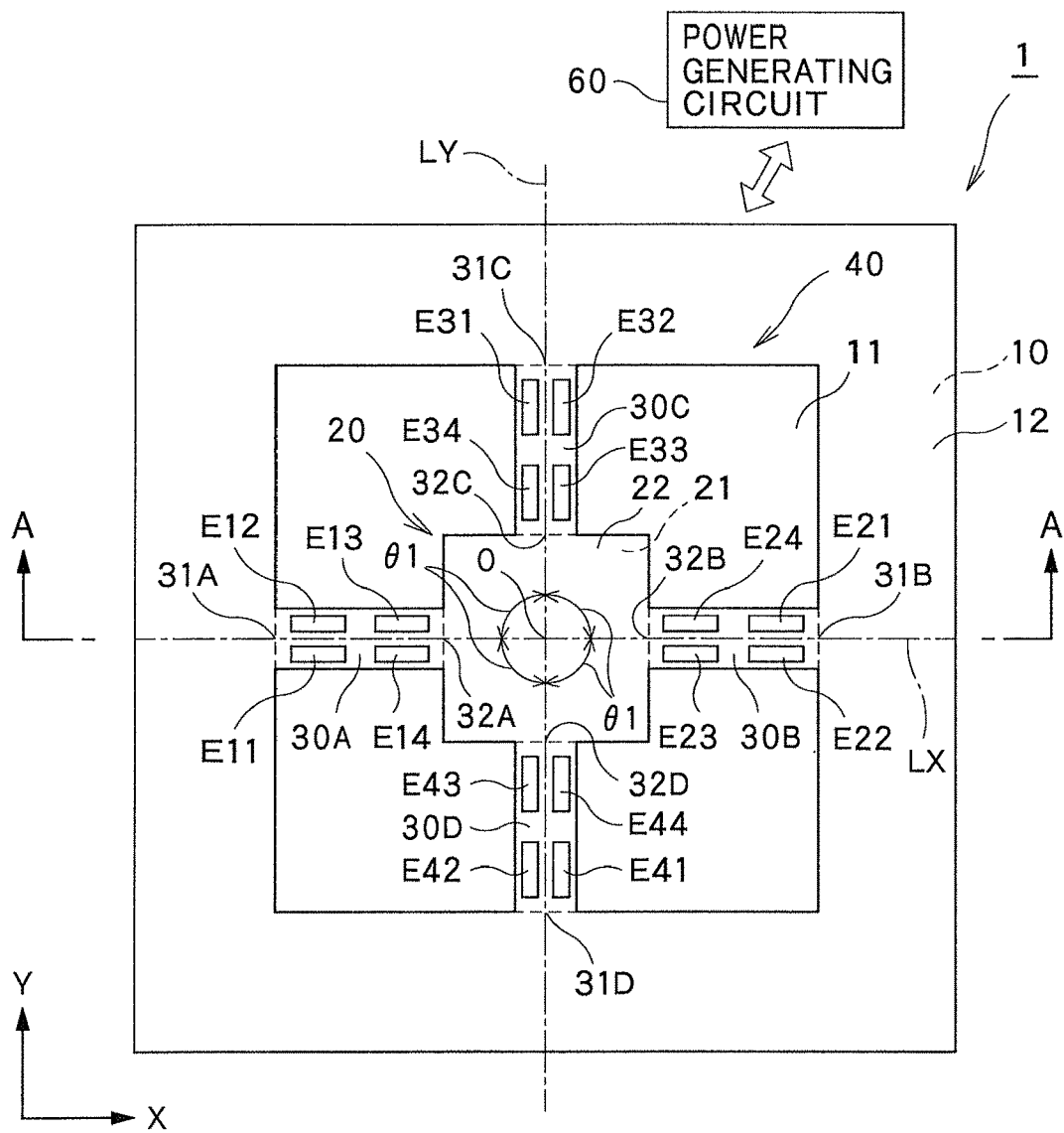
FIG. 2 is a plan view illustrating the power generating element of FIG. 1.
Figure 3:
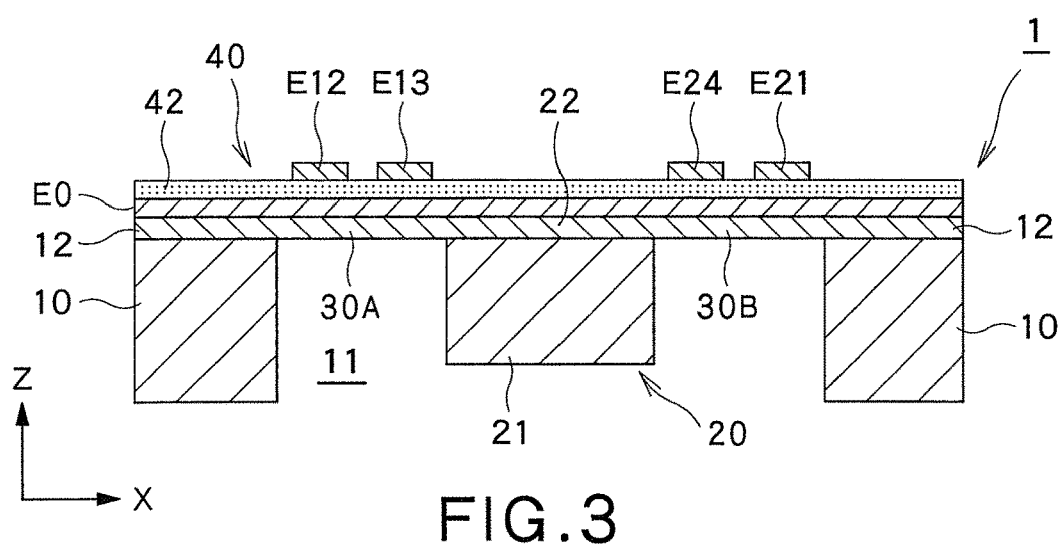
FIG. 3 is a cross-sectional view taken along line A-A in FIG. 2.

FIG. 1 is a perspective view illustrating the power generating element according to the first embodiment of the present invention. FIG. 2 is a plan view of the power generating element of FIG. 1. FIG. 3 is a cross-sectional view taken along line A-A in FIG. 2. As illustrated in FIGS. 1 to 3, a power generating element 1 according to the present embodiment includes a pedestal 10 formed in a frame shape in plan view, a vibrating body 20 capable of vibrating and provided inside the pedestal 10, and at least three first bridge supporting portions 30A to 30D (supporting portions) for allowing the vibrating body 20 to be supported on the pedestal 10. Among these, the pedestal 10 is formed in a rectangular frame shape and includes a rectangular pedestal opening 11 in the present embodiment. In addition, a first weight body 21 (described below) of the vibrating body 20 is supported on the pedestal 10 by the four first bridge supporting portions 30A to 30D. Herein, the plan view represents a state as seen in the Z-axis direction illustrated in FIGS. 1 to 3, that is, a state of the power generating element 1 viewed from above as illustrated in FIG. 2. For clarity of explanation, as illustrated in FIG. 2, an XYZ coordinate system having a center O of the first weight body 21 as an origin is defined, and the following description will be provided with the power generating element 1 arranged with the Z-axis direction being defined as a vertical direction. Therefore, the power generating element 1 according to the present embodiment is not limited to being used in a posture with the Z-axis direction being defined as the vertical direction.

As illustrated in FIG. 2, each of the first bridge supporting portions 30A to 30D includes a first extending axis, and extends from the first weight body 21 toward the pedestal 10 (or from the pedestal 10 to the first weight body 21) along the corresponding first extending axis. In the mode illustrated in FIG. 2, the first bridge supporting portions 30A to 30D extend in an elongated shape from the first weight body 21 toward the pedestal 10, and the first extending axis extends in the longitudinal direction of the first bridge supporting portions 30A to 30D. Alternatively, however, the first bridge supporting portions 30A to 30D may be formed to be wide. In this case, the first extending axis extends in a direction perpendicular to the longitudinal direction of the first bridge supporting portions 30A to 30D.

As illustrated in FIG. 2, in the circumferential direction (circumferential direction with respect to the center O) with the vibrating body 20 defined as a center in plan view, the first extending axes of a pair of the first bridge supporting portions 30A to 30D adjacent to each other form a predetermined angle ($\theta 1$ illustrated in FIG. 2). The predetermined angle is an angle other than 0°, meaning that a pair of the first bridge supporting portions 30A to 30D adjacent to each other form at least an angle allowing them to be spaced apart from each other. This configuration allows the first extending axes of the first bridge supporting portions 30A to 30D to extend in mutually different directions. The angle formed by a pair of the first bridge supporting portions adjacent to each other and the angle formed by another pair of the first bridge supporting portions adjacent to each other are preferably equal, but not limited to being equal.

In the present embodiment, the first extending axes of the four first bridge supporting portions 30A to 30D are radially arranged with respect to the first weight body 21 in plan view. Herein, the term "radial" is used as a term representing a state in which the first extending axes are arranged so as to extend in different directions from the first weight body 21 with the first weight body 21 defined as a center. Preferably, the first extending axes of the first bridge supporting portions 30A to 30D are substantially evenly arranged in the circumferential direction. In the present embodiment, the angles formed by the first extending axes of each pair of the first bridge supporting portions 30A to 30D ($\theta 1$) adjacent to each other in the circumferential direction with the first weight body 21 defined as a center in plan view are equal.

More specifically, the first extending axes of the first bridge supporting portions 30A and 30B are a center axis LX (described below) extending in the X-axis direction, and the first bridge supporting portions 30A and 30B are arranged on the center axis LX (first axis) extending in the X-axis direction of the first weight body 21 in plan view. The first bridge supporting portion 30A is arranged on the negative side on the X-axis with respect to the first weight body 21, while the first bridge supporting portion 30B is arranged on the positive side on the X-axis with respect to the first weight body 21. This configuration allows the first bridge supporting portions 30A and 30B to be formed symmetrically to each other with respect to a center axis LY (second axis) extending in the Y-axis direction of the first weight body 21 in plan view. The center axis LY is orthogonal to the center axis LX.

The first extending axis of the first bridge supporting portions 30C and 30D is the center axis LY extending in the Y-axis direction, and the first bridge supporting portions 30C and 30D are arranged on the center axis LY in plan view. The first bridge supporting portion 30C is arranged on the positive side on the Y-axis with respect to the first weight body 21. The first bridge supporting portion 30D is arranged on the negative side on the Y-axis with respect to the first weight body 21. Therefore, the first bridge supporting portions 30C and 30D are formed symmetrically to each other with respect to the center axis LX in plan view.

In this manner, the first bridge supporting portions 30A to 30D according to the present embodiment are formed symmetrically with respect to the center axis LX while being formed symmetrically with respect to the center axis LY in plan view. This allows the four first bridge supporting portions 30A to 30D to be arranged in a cross shape. In other words, the angle ($\theta 1$) formed by the first extending axes of the first bridge supporting portions 30A to 30D adjacent to each other in every case in the circumferential direction with the first weight body 21 of the vibrating body 20 defined as a center in plan view is 90°. This allows the power generating element 1 according to the present embodiment to have a double-supported beam structure in each of the X-axis direction and the Y-axis direction. Note that the angles formed by the first extending axes of the first bridge supporting portions 30A to 30D adjacent to each other are not limited to being equal. For example, the angle ($\theta 1$) may be 80° to 100° instead of 90°. In this case, the first extending axes of the four first bridge supporting portions 30A to 30D can also be considered to be radially arranged with respect to the first weight body 21 in plan view.

As illustrated in FIG. 2, an end 31A on the negative side on the X-axis (end on the pedestal 10 side, a root end) of the first bridge supporting portion 30A is coupled to the pedestal 10, while an end 32A on the positive side on the X-axis (end on the first weight body 21 side, a tip end) is coupled to the first weight body 21 of the vibrating body 20. An end 31B (root end) of the first bridge supporting portion 30B on the positive side on the X-axis is coupled to the pedestal 10, while an end 32B (tip end) on the negative side on the X-axis is coupled to the first weight body 21. An end 31C (root end) on the positive side on the Y-axis of the first bridge supporting portion 30C is coupled to the pedestal 10, while an end 32C (tip end) on the negative side on the Y-axis is coupled to the first weight body 21. An end 31D (root end) on the negative side on the Y-axis of the first bridge supporting portion 30D is coupled to the pedestal 10, while an end 32D (tip end) on the positive side on the Y-axis is coupled to the first weight body 21. Note that the positive side on the X-axis represents a direction of the arrow indicating the X-axis illustrated in FIG. 1, while the negative side on the X-axis represents a direction opposite the direction of the positive side on the X-axis. Similar definition will also apply to the positive side on the Y-axis, the negative side on the Y-axis, the positive side on the Z-axis, and the negative side on the Z-axis described below.

As illustrated in FIGS. 1 to 3, the vibrating body 20 according to the present embodiment includes the first weight body 21, a first weight body supporting portion 22 provided on an upper surface (surface on the positive side on the Z-axis) of the first weight body 21. Among these, the first weight body 21 is formed in a rectangular shape (or a square shape) in plan view. That is, the first weight body 21 is formed so as to be arranged along the pedestal opening 11, concentrically with the pedestal opening 11. Note that the planar shape of the first weight body 21 is not limited to a rectangular shape and may be any shape.

The first weight body supporting portion 22 extends from the first bridge supporting portions 30A to 30D to the upper surface of the first weight body 21 and is formed continuously and integrally with the first bridge supporting portions 30A to 30D. The first weight body supporting portion 22 is formed on the entire upper surface of the first weight body 21, and the first weight body 21 is joined to a lower surface of the first weight body supporting portion 22 (surface on the negative side on the Z-axis) and supported by the first weight body supporting portion 22. With this configuration, the first weight body 21 is coupled to the end 32A of the first bridge supporting portion 30A on the positive side on the X-axis, the end 32B of the first bridge supporting portion 30B on the negative side on the X-axis, the end 32C of the first bridge supporting portion 30C on the negative side on the Y-axis, and the end 32D of the first bridge supporting portion 30D on the positive side on the Y-axis, via the first weight body supporting portion 22. In this manner, the first weight body 21 is supported by each of the first bridge supporting portions 30A to 30D via the first weight body supporting portion 22.

As illustrated in FIG. 3, the lower surface of the first weight body 21 is positioned above the lower surface of the pedestal 10. The first weight body 21 can be displaced downward (negative side on the Z-axis) until it abuts a bottom plate 74 (refer to FIG. 7) of a casing 70 described below.

As illustrated in FIGS. 1 to 3, a pedestal supporting portion 12 is provided on the upper surface of the pedestal 10. The pedestal supporting portion 12 is formed continuously and integrally with the first bridge supporting portions 30A to 30D, and is formed on the entire upper surface of the pedestal 10. The pedestal supporting portion 12 is joined to the upper surface of the pedestal 10, and each of the first bridge supporting portions 30A to 30D is supported on the pedestal 10 via the pedestal supporting portion 12.

As illustrated in FIG. 2, the power generating element 1 according to the present embodiment further includes a piezoelectric element 40 (charge generating element) that generates a charge at the time of displacement of the vibrating body 20. As illustrated in FIGS. 2 and 3, the piezoelectric element 40 includes a lower electrode layer E0 (second electrode layer) provided on each of the first bridge supporting portions 30A to 30D, a piezoelectric material layer 42 (charge generating material layer) provided on the lower electrode layer E0, and a plurality of upper electrode layers E11 to E44 (first electrode layers) provided on the piezoelectric material layer 42. That is, the lower electrode layer EU is provided between the first bridge supporting portions 30A to 30D and the upper electrode layers E11 to E44, and the piezoelectric material layer 42 is provided between the lower electrode layer E0 and the upper electrode layers E11 to E44. In the present embodiment, the lower electrode layer E0 is provided over the entire upper surface of the first bridge supporting portions 30A to 30D, the entire upper surface of the first weight body supporting portion 22, and the entire upper surface of the pedestal supporting portion 12, being formed integrally. Note that there is no need to provide the lower electrode layer E0 on the upper surface of the pedestal supporting portion 12. The piezoelectric material layer 42 is provided on the entire upper surface of the lower electrode layer E0. In FIG. 1, the piezoelectric element 40 is omitted to simplify the drawing.

It is preferable that the upper electrode layers E11 to E44 are arranged in a region where a stress is generated at the time of displacement of the first weight body 21 (region where the first bridge supporting portions 30A to 30D themselves are deformed) in the first bridge supporting portions 30A to 30D. In the present embodiment, four of the upper electrode layers E11 to E44 are provided in each of the first bridge supporting portions 30A to 30D. These upper electrode layers E11 to E44 are electrically independent from each other.

In the mode illustrated in FIG. 2, four upper electrode layers E11 to E14 are arranged above the first bridge supporting portion 30A (positive side on the Z-axis) and are arranged at mutually different positions in the X-axis direction (direction along the first extending axis of the first bridge supporting portion 30A) and are arranged at mutually different positions in the Y-axis direction (direction perpendicular to the first extending axis). More specifically, the upper electrode layers E11 and E12 are arranged on the negative side on the X-axis, while the upper electrode layers E13 and E14 are arranged on the positive side on the X-axis. In addition, the upper electrode layers E11 and E14 are arranged on the negative side on the Y-axis, while the upper electrode layers E12 and E13 are arranged on the positive side on the Y-axis. The four upper electrode layers E11 to E14 arranged above the first bridge supporting portion 30A are formed symmetrically with respect to the center axis LX, while being formed symmetrically with respect to a line passing through an intermediate point in the X-axis direction of the first bridge supporting portion 30A and extending along the center axis LY.

Four upper electrode layers E21 to E24 are arranged above the first bridge supporting portion 30B and are arranged at mutually different positions in the X-axis direction (direction along the first extending axis of the first bridge supporting portion 30B) while being arranged at mutually different positions in the Y-axis direction (direction perpendicular to the first extending axis). More specifically, the upper electrode layers E21 and E22 are arranged on the positive side on the X-axis, while the upper electrode layers E23 and E24 are arranged on the negative side on the X-axis. Moreover, the upper electrode layers E21 and E24 are arranged on the positive side on the Y-axis, while the upper electrode layers E22 and E23 are arranged on the negative side on the Y-axis. The four upper electrode layers E21 to E24 arranged above the first bridge supporting portion 30B are formed symmetrically with respect to the center axis LX while being formed symmetrically with respect to a line passing through an intermediate point in the X-axis direction of the first bridge supporting portion 30B and extending along the center axis LY.

Four upper electrode layers E31 to E34 are arranged above the first bridge supporting portion 30C and are arranged at mutually different positions in the X-axis direction (direction perpendicular to the first extending axis of the first bridge supporting portion 30C) while being arranged at mutually different positions in the Y-axis direction (direction along the first extending axis). More specifically, the upper electrode layers E31 and E32 are arranged on the positive side on the Y-axis, while the upper electrode layers E33 and E34 are arranged on the negative side on the Y-axis. In addition, the upper electrode layers E31 and E34 are arranged on the negative side on the X-axis, while the upper electrode layers E32 and E33 are arranged on the positive side on the X-axis. The four upper electrode layers E31 to E34 arranged above the first bridge supporting portion 30C are formed symmetrically with respect to the center axis LX, while being formed symmetrically with respect to a line passing through an intermediate point in the Y-axis direction of the first bridge supporting portion 30C and extending along the center axis LY.

Four upper electrode layers E41 to E44 are arranged above the first bridge supporting portion 30D and are arranged at mutually different positions in the X-axis direction (direction perpendicular to the first extending axis of the first bridge supporting portion 30D) while being arranged at mutually different positions in the Y-axis direction (direction along the first extending axis). More specifically, the upper electrode layers E41 and E42 are arranged on the negative side on the Y-axis, while the upper electrode layers E43 and E44 are arranged on the positive side on the Y-axis. Moreover, the upper electrode layers E41 and E44 are arranged on the positive side on the X-axis, while the upper electrode layers E42 and E43 are arranged on the negative side on the X-axis. The four upper electrode layers E41 to E44 arranged above the first bridge supporting portion 30D are formed symmetrically with respect to the center axis LX, while being formed symmetrically with respect to a line passing through an intermediate point in the Y-axis direction of the first bridge supporting portion 30D and extending along the center axis LY.

In this manner, the upper electrode layers E11 to E44 according to the present embodiment are formed as a whole symmetrically with respect to the center axis LX while being formed symmetrically with respect to the center axis LY in plan view.

Figure 4:
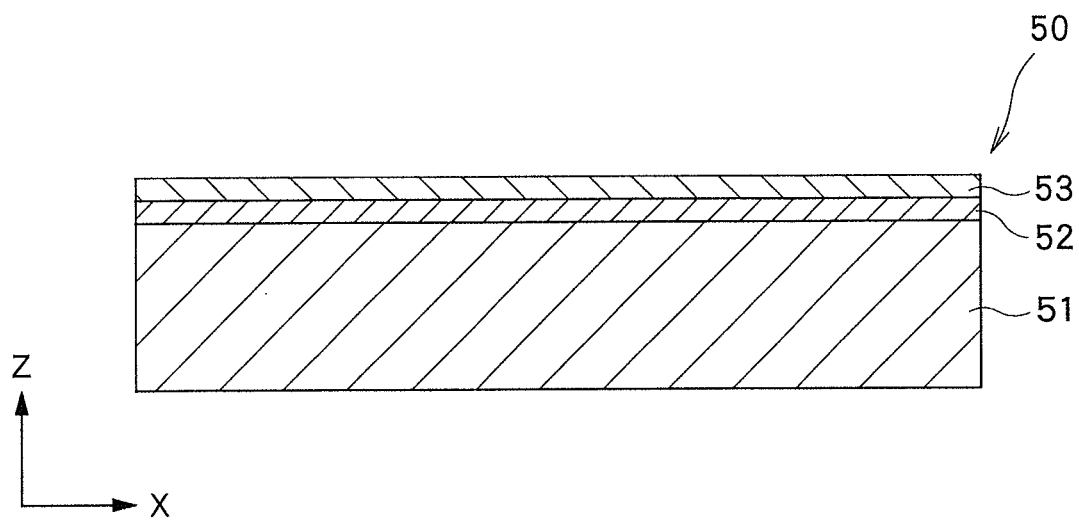
FIG. 4 is a cross-sectional view illustrating an SOI substrate used for manufacturing a power generating element in a method for manufacturing the power generating element illustrated in FIG. 1.

FIG. 4 is a cross-sectional view of an SOI substrate used for manufacturing the power generating element 1 in a method for manufacturing the power generating element 1 illustrated in FIG. 1. The power generating element 1 can be manufactured by etching processing on the SOI substrate 50 illustrated in FIG. 4, for example. The SOI substrate 50 includes a silicon base layer 51, a silicon oxide layer 52 provided on the silicon base layer 51, and a silicon active layer 53 provided on the silicon oxide layer 52, so as to form a laminated substrate having a three-layer structure. This type of SOI substrate 50 is used as a material for manufacturing various semiconductor devices. While the thickness of each of the layers is not particularly limited, an exemplary thickness of the silicon base layer 51 is 525 μm to 725 μm, an exemplary thickness of the silicon oxide layer 52 is 1 μm, and an exemplary thickness of the silicon active layer 53 is 10 μm to 15 μm.

During the etching processing, the silicon active layer 53 is etched from above the SOI substrate 50 to remove unnecessary portion so as to leave a portion to be formed into the first bridge supporting portions 30A to 30D, the first weight body supporting portion 22 and the pedestal supporting portion 12. At this time, the silicon oxide layer 52 functions as an etching stopper.

Moreover, by etching from below the SOI substrate 50, an unnecessary portion of the silicon base layer 51 is removed by etching so as to leave a portion to be formed into the pedestal 10 and the first weight body 21. In this case, the silicon oxide layer 52 also functions as an etching stopper. In the portion of the silicon base layer 51 where the first weight body 21 is to be formed, it is preferable that the silicon base layer 51 is etched twice. This makes it possible to position the lower surface of the first weight body 21 above the lower surface of the pedestal 10.

Figure 5:
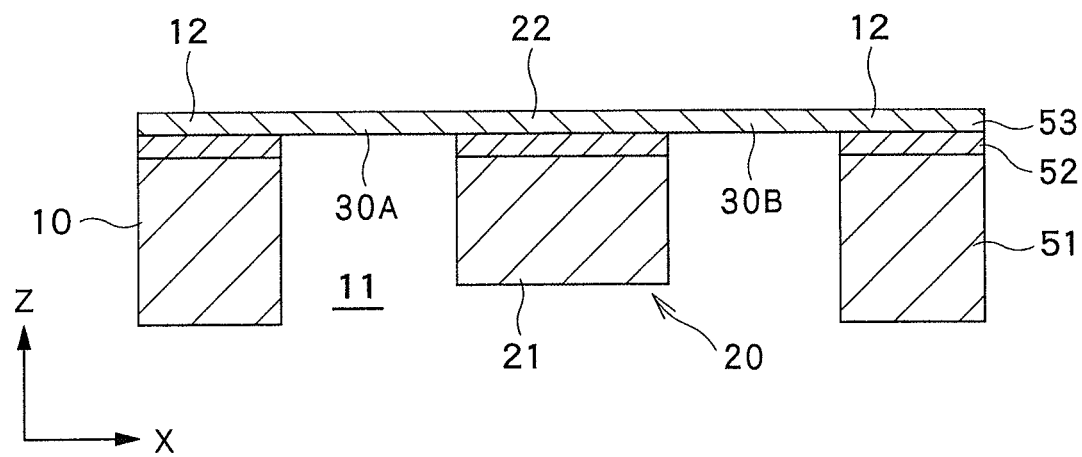
FIG. 5 is a cross-sectional view of a power generating element obtained by etching the SOI substrate illustrated in FIG. 4 in the method of manufacturing the power generating element illustrated in FIG. 1.

Next, an exposed portion of the silicon oxide layer 52 is etched away by etching the silicon active layer 53 and the silicon base layer 51. In this manner, the structure of the power generating element 1 as illustrated in FIG. 5 is obtained. FIG. 5 illustrates a cross-sectional view of a power generating element 1 obtained by etching the SOI substrate illustrated in FIG. 4 in the method of manufacturing the power generating element 1 illustrated in FIG. 1. Herein, each of the pedestal 10 and the first weight body 21 is formed by the silicon base layer 51 and the silicon oxide layer 52. While the first bridge supporting portions 30A to 30D, the first weight body supporting portion 22 and the pedestal supporting portion 12 are formed by the silicon active layer 53, they may be formed by the silicon oxide layer 52 and the silicon active layer 53.

Thereafter, constituents of the piezoelectric element 40, namely, the lower electrode layer E0, the piezoelectric material layer 42, and the upper electrode layers E11 to E44 are formed on the silicon active layer 53 in this order. In this manner, the power generating element 1 according to the present embodiment can be manufactured. The method of manufacturing the power generating element 1 is not limited to the above-described method. It is allowable to first form the lower electrode layer E0, the piezoelectric material layer 42, and the upper electrode layers E11 to E44 on the silicon base layer 51 of the SOI substrate 50, and thereafter, perform etching from below the SOI substrate 50 to etch out the silicon base layer 51, the silicon oxide layer 52, the silicon active layer 53, the lower electrode layer EU, and the piezoelectric material layer 42 so as to manufacture the power generating element 1.

As illustrated in FIG. 2, the power generating element 1 according to the present embodiment further includes a power generating circuit 60. The power generating circuit 60 is configured to rectify a current based on the charge generated by the piezoelectric element 40 to extract electric power, and supply the extracted electric power to a load ZL (refer to FIG. 6). The power generating circuit 60 can be configured using a rectifying element (diode) and a smoothing capacitative element (capacitor).

Figure 6:
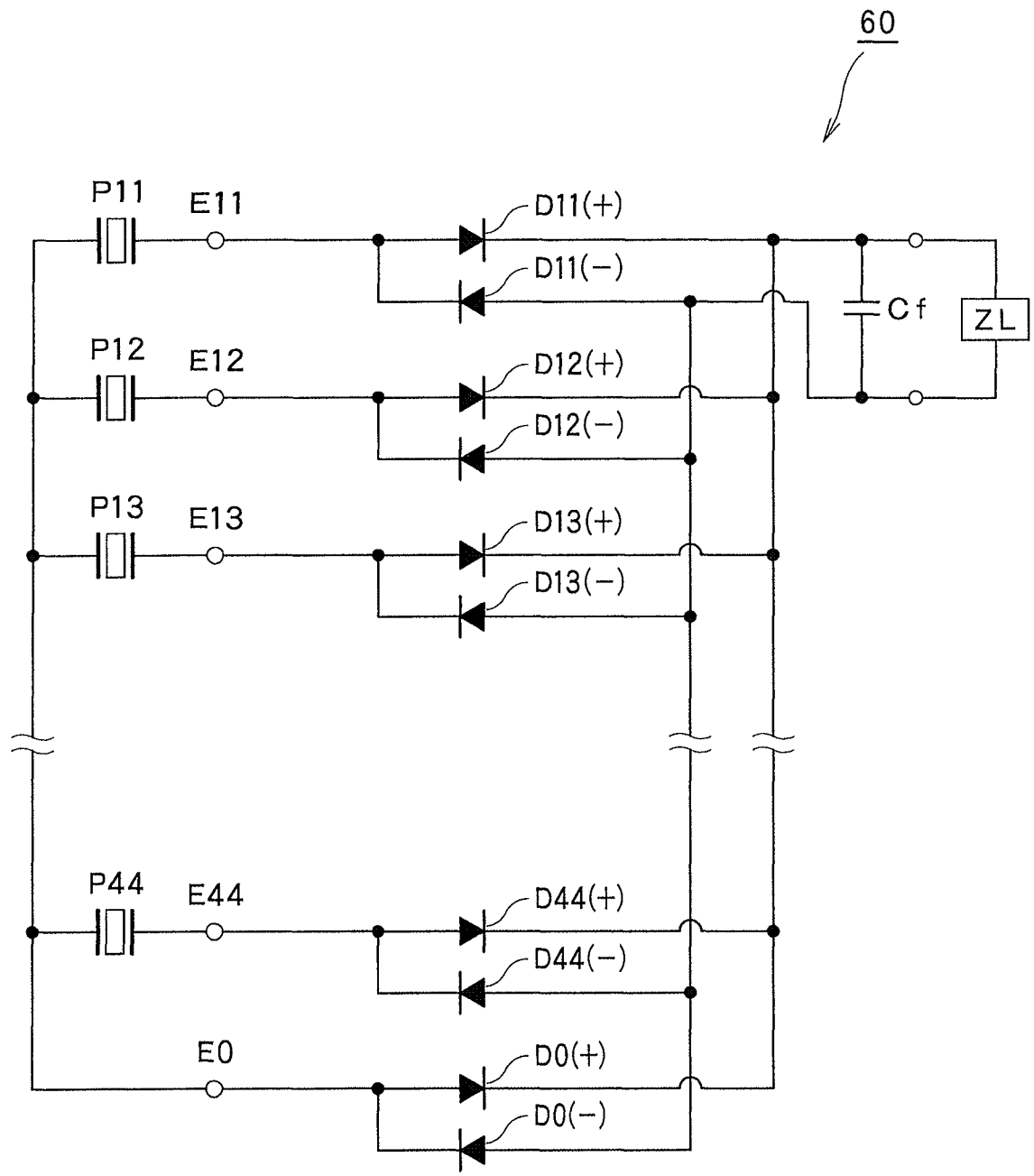
FIG. 6 is a diagram illustrating a configuration of a power generating circuit of the power generating element of FIG. 1.

FIG. 6 illustrates a configuration of the power generating circuit 60 of the power generating element 1 in FIG. 2. The power generating circuit 60 according to the present embodiment can include an exemplary configuration as illustrated in FIG. 6. In FIG. 6, P11 to P44 correspond to portions of the piezoelectric material layer 42 positioned below the upper electrode layers E11 to E44. The vertical lines illustrated on the left side of P11 to P44 correspond to the common lower electrode layer E0 while the vertical lines illustrated on the right side of P11 to P44 correspond to the corresponding upper electrode layers E11 to E44. While FIG. 6 omits illustration of the upper electrode layers E14 to E43 in order to simplify the drawing, it is possible to configure the circuit for extracting a charge in a similar manner, also with respect to these upper electrode layers E14 to E43.

The power generating circuit 60 includes a rectifying element (diode) and a smoothing capacitative element (capacitor). Among these, each of rectifying elements D11(+) to D44(+) has a function of extracting a positive charge generated in each of the upper electrode layers E11 to E44, respectively. In addition, each of rectifying elements D11(−) to D44(−) has a function of extracting a negative charge generated in each of the upper electrode layers E11 to E44, respectively.

The positive charges extracted by the rectifying elements D11(+) to D44(+) are supplied to a positive electrode (electrode on the upper side in FIG. 6) of the smoothing capacitative element Cf, and the negative charges extracted by the rectifying elements D11(−) to D44(−) are supplied to a negative electrode (electrode on the lower side in FIG. 6). The capacitative element Cf has a function of smoothing a pulsating flow of the generated charge. Moreover, rectifying elements D0(+) and D0(−) facing in opposite directions are connected as rectifying elements between the both electrodes of the capacitative element Cf and the lower electrode layer E0.

The ZL connected in parallel to the capacitative element Cf indicates a load of the equipment that receives the supply of the electric power generated by the power generating element 1. Positive charges extracted by the rectifying elements D11(+) to D44(+) and the negative charges extracted by the rectifying elements D11(−) to D44(−) are supplied to the load ZL. Therefore, in principle, it would be possible to enhance power generation efficiency by configuring the total amount of positive charges generated in each of the upper electrode layers E11 to E44 to be equal to the total amount of negative charges at each of individual instances.

Figure 7:
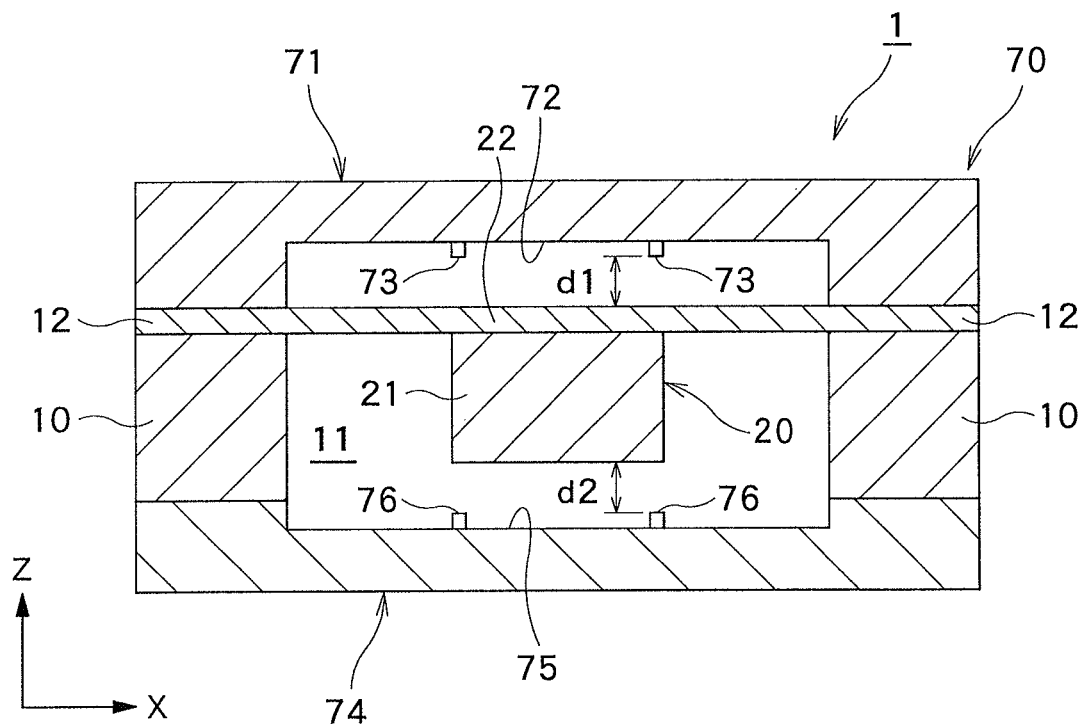
FIG. 7 is a cross-sectional view illustrating the power generating element of FIG. 1 including a casing.

FIG. 7 illustrates a cross-sectional view of the power generating element 1 including the casing 70 in FIG. 1. The pedestal 10 described above is a member constituting a portion of the casing 70. That is, the casing 70 includes the pedestal 10, a recessed top plate 71 provided above the pedestal 10, and a recessed bottom plate 74 provided below the pedestal 10. Among them, the top plate 71 is provided above the first weight body supporting portion 22 (opposite side of the first weight body 21 side) and is coupled to the pedestal 10. The bottom plate 74 is provided below the first weight body 21 (opposite side of the first weight body supporting portion 22 side) and is coupled to the pedestal 10. The top plate 71 and the bottom plate 74 are fabricated separately from the pedestal 10. The top plate 71 is joined to the upper surface of the pedestal 10 via the pedestal supporting portion 12, the lower electrode layer E0 and the piezoelectric material layer 42 described above, while the bottom plate 74 is joined to the lower surface of the pedestal 10. The above-configured casing 70 accommodates the first bridge supporting portions 30A to 30D and the first weight body 21.

The top plate 71 of the casing 70 is formed so as to cover the region inside the pedestal 10 from above. The top plate 71 is constituted to allow the first weight body 21 to abut the top plate 71 via the first weight body supporting portion 22 and functions as a stopper that regulates upward displacement of the first weight body 21.

The top plate 71 includes a top plate facing surface 72 in flat shape facing the first weight body supporting portion 22. The top plate facing surface 72 includes a plurality of top plate-side projections 73. In a case where the first weight body 21 is displaced upward (toward the top plate 71 side), the first weight body 21 can abut the top plate-side projections 73 via the first weight body supporting portion 22.

When the first weight body 21 is in a neutral position, the first weight body supporting portion 22 is spaced apart from the top plate-side projection 73 by a predetermined distance d1, and the first weight body 21 can be displaced upward until it abuts the top plate 71 via the first weight body supporting portion 22. Here, the neutral position is a position in a state where acceleration including gravity is not applied to the first weight body 21, that is, a position of the first weight body 21 in a case where the first bridge supporting portions 30A to 30D are not deflected.

The bottom plate 74 of the casing 70 is formed so as to cover the region inside the pedestal 10 from below. The bottom plate 74 is constituted to allow the first weight body 21 to abut the bottom plate 74 and functions as a stopper that regulates downward displacement of the first weight body 21.

The bottom plate 74 includes a bottom plate facing surface 75 in flat shape facing the first weight body 21. The bottom plate facing surface 75 includes a plurality of bottom plate-side projections 76. The first weight body 21 can abut the bottom plate-side projection 76 in a case where the first weight body 21 is displaced downward.

When the first weight body 21 is in the neutral position, the first weight body 21 is spaced apart from the bottom plate-side projection 76 by a predetermined distance d2, and the first weight body 21 can be displaced downward until it abuts the bottom plate 74.

Figure 8:
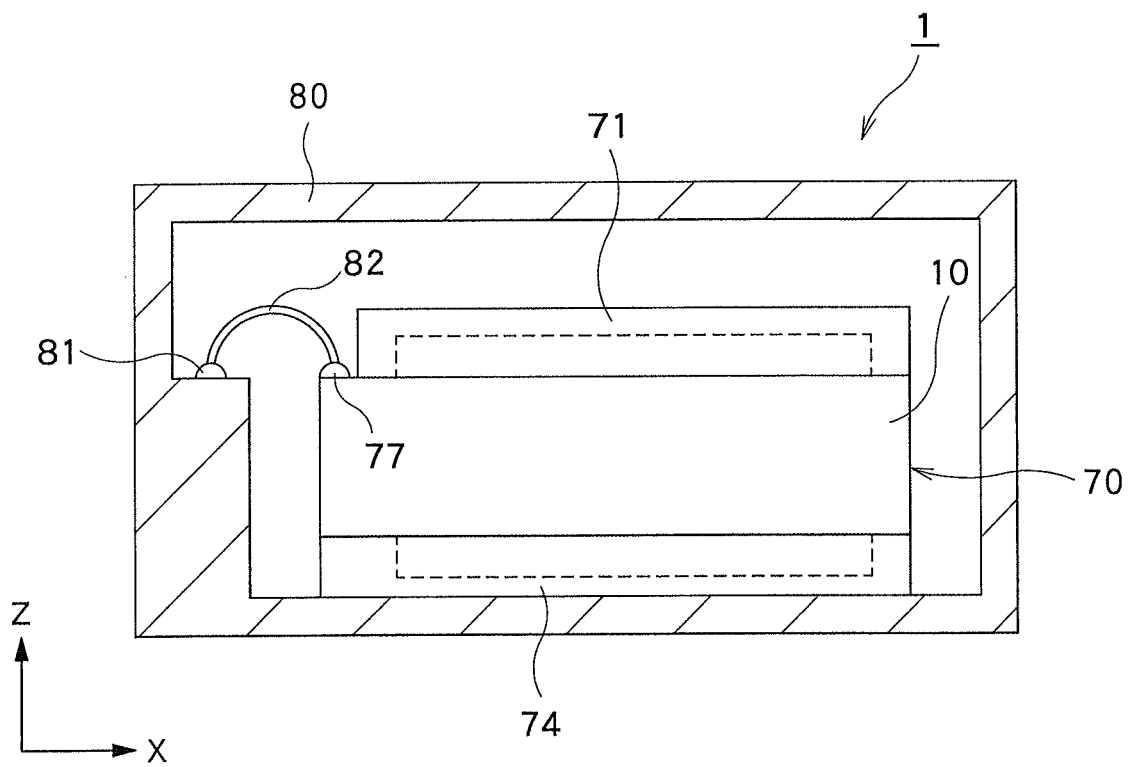
FIG. 8 is a cross-sectional view illustrating the power generating element of FIG. 7 including an outer package.

FIG. 8 is a cross-sectional view of the power generating element 1 including an outer package 80 in FIG. 7. In the power generating element 1 illustrated in FIG. 8, the casing 70 is accommodated in the outer package 80. It is preferable that the power generating circuit 60 described above is provided in the outer package 80. In this case, the casing 70 includes a plurality of bonding pads 77 electrically connected to each of the electrode layers E0, E11 to E44 of the piezoelectric element 40, while the outer package 80 includes a plurality of bonding pads 81 to be electrically connected to the outside of the power generating element 1. Each of the bonding pads 77 and the corresponding bonding pad 81 are connected by a bonding wire 82. Here, the casing 70 includes the number of bonding pads which is the total of the number of the upper electrode layers E11 to E44 and the number of the lower electrode layers EU. The outer package 80 also includes the same number of bonding pads 81 as the number of bonding pads 77 provided in the casing 70. The internal space of the outer package 80 may be a hollow space or may be filled with resin, or the like.

Next, actions in the present embodiment having such a configuration will be described.

When external vibration in a certain direction is applied to the power generating element 1 illustrated in FIGS. 1 and 2, vibration acceleration in the same direction is applied to the first weight body 21, so as to allow the first weight body 21 to be displaced together with the first weight body supporting portion 22, resulting in deflection and deformation of the first bridge supporting portions 30A to 30D.

During deflection of the first bridge supporting portions 30A to 30D, stress is generated in each of the first bridge supporting portions 30A to 30D. Generation of the stress leads to generation of a charge corresponding to the generated stress in a portion of the piezoelectric material layer 42 arranged above each of the first bridge supporting portions 30A to 30D.

The generated charges are supplied from the upper electrode layers E11 to E44 of the piezoelectric element 40 to the power generating circuit 60 (refer to FIG. 6) and are smoothed by the power generating circuit 60. The smoothed electric power is supplied to the load ZL. More specifically, charges are generated in the upper electrode layers E11 to E44 due to the stress generated in the first bridge supporting portions 30A to 30D.

Hereinafter, how the charges are generated in a case where vibration acceleration is applied in a specific direction will be described in more detail using FIGS. 9 to 11. FIG. 9 illustrates a state of displacement of the first weight body 21 in a case where vibration acceleration to the positive side on the Z-axis (upward) is applied. FIG. 10 illustrates a state of displacement of the first weight body 21 in a case where vibration acceleration to the positive side on the X-axis is applied. FIG. 11 illustrates a polarity of the charge generated in each of the upper electrode layers E11 to E44 in a case where vibration acceleration is applied to the positive side on the X-axis, the positive side on the Y-axis, and the positive side on the Z-axis.

When the vibration acceleration to the positive side on the Z-axis is applied, the first weight body 21 is displaced to the positive side on the Z-axis, leading to generation of deflection in the first bridge supporting portions 30A to 30D, as illustrated in FIG. 9.

The upper electrode layers E11 and E12 provided in the first bridge supporting portion 30A are arranged in the region of the first bridge supporting portion 30A where a compressive stress is generated, leading to generation of a negative charge in the upper electrode layer E11 and E12 as illustrated in FIG. 11. The upper electrode layers E13 and E14 are arranged in the region of the first bridge supporting portion 30A where a tensile stress is generated, leading to generation of a positive charge in the upper electrode layers E13 and E14. This makes it possible to avoid the canceling of the charge due to simultaneous reception of the compressive stress and the tensile stress at the portion of the piezoelectric material layer 42 overlapping with one upper electrode layer, leading to generation of the charge efficiently from the stress generated in the first bridge supporting portion 30A. Note that it is allowable to cause the positive charge to be generated from the compressive stress, and negative charges to be generated from the tensile stress in accordance with the type of the material of the piezoelectric material layer 42.

The upper electrode layers E21 and E22 provided in the first bridge supporting portion 30B are arranged in the region of the first bridge supporting portion 30B where compressive stress is generated, leading to generation of a negative charge in the upper electrode layers E21 and E22. The upper electrode layers E23 and E24 are arranged in the region of the first bridge supporting portion 30B where a tensile stress is generated, leading to generation of a positive charge in the upper electrode layers E23 and E24. In this manner, it is possible to efficiently generate a charge from the stress generated in the first bridge supporting portion 30B.

The upper electrode layers E31 and E32 provided in the first bridge supporting portion 30C are arranged in the region of the first bridge supporting portion 30C where a compressive stress is generated, leading to generation of a negative charge in the upper electrode layers E31 and E32. The upper electrode layers E33 and E34 are arranged in a region of the first bridge supporting portion 30C where a tensile stress is generated, leading to generation of a positive charge in the upper electrode layers E33 and E34. In this manner, it is possible to efficiently generate a charge from the stress generated in the first bridge supporting portion 30C.

The upper electrode layers E41 and E42 provided on the first bridge supporting portion 30D are arranged in the region of the first bridge supporting portion 30D where a compressive stress is generated, leading to generation of a negative charge in the upper electrode layers E41 and E42. The upper electrode layers E43 and E44 are arranged in a region of the first bridge supporting portion 30D where a tensile stress is generated, leading to generation of a positive charge in the upper electrode layers E43 and E44. In this manner, it is possible to efficiently generate a charge from the stress generated in the first bridge supporting portion 30D.

Although not illustrated, even in a case where the vibration acceleration is applied to the negative side on the Z-axis (downward), it is possible to efficiently generate a charge by the upper electrode layers E11 to E44 in a similar manner.

Meanwhile, in a case where the vibration acceleration applied in the Z-axis direction is high, the first weight body 21 abuts the top plate 71 via the first weight body supporting portion 22, or abuts the bottom plate 74. When abutting the top plate 71, the first weight body 21 abuts the top plate-side projection 73 provided on the top plate facing surface 72 of the top plate 71. When abutting the bottom plate 74, the first weight body 21 abuts the bottom plate-side projection 76 provided on the bottom plate facing surface 75 of the bottom plate 74. In this manner, displacement of the first weight body 21 in the vertical direction is regulated so as to prevent plastic deformation and breakage of the first bridge supporting portions 30A to 30D.

The first weight body 21 of the power generating element 1 according to the present embodiment is supported on the pedestal 10 by the four first bridge supporting portions 30A to 30D. This configuration makes it possible to reduce the displacement of the first weight body 21 in a case where the vibration acceleration is applied, compared with a case of using a power generating element having a cantilever structure (structure in which the first weight body 21 is supported by one first bridge supporting portion) and a power generating element having a double-supported beam structure (structure in which the first weight body 21 is supported by two first bridge supporting portions). This enables expansion of an acceleration range in which the first weight body 21 can be displaced without abutting the top plate 71 or the bottom plate 74 of the casing 70, making it possible to avoid abutment of the first weight body 21 to the top plate 71 or the bottom plate 74 in a wider acceleration range. This makes it possible to suppress an escape of the force received by the first weight body 21 to the top plate 71 or the bottom plate 74, and to increase the stress generated in the first bridge supporting portions 30A to 30D. As a result, the vibration energy applied to the first weight body 21 can be efficiently converted into electric energy, achieving an increase in the charge generated from the piezoelectric element 40.

Moreover, when vibration acceleration is applied to the positive side on the X-axis, the first weight body 21 swings in an XZ plane as illustrated in FIG. 10. That is, the first weight body 21 swings such that a lower end of the first weight body deflects toward the positive side on the X-axis. This configuration generates deflection in the first bridge supporting portions 30A and 30B as illustrated in FIG. 10, leading to generation of a bending stress in the first bridge supporting portions 30A and 30B greater than the bending stress generated in the first bridge supporting portions 30C and 30D. Here, deflection toward the positive side on the X-axis is generated also in the first bridge supporting portions 30C and 30D by the swing of the first weight body 21. The first extending axes of the first bridge supporting portions 30C and 30D, however, are perpendicular to the direction of the vibration acceleration. This configuration causes the stress generated in the first bridge supporting portions 30C and 30D to mainly become a torsional stress, which is smaller than the bending stress generated in the first bridge supporting portions 30A and 30B.

The upper electrode layers E11 and E12 provided in the first bridge supporting portion 30A are arranged in a region of the first bridge supporting portion 30A where a tensile stress is generated, leading to generation of a positive charge in the upper electrode layers E11 and E12 as illustrated in FIG. 11. The upper electrode layers E13 and E14 are arranged in a region of the first bridge supporting portion 30A where compressive stress is generated, leading to generation of a negative charge in the upper electrode layers E13 and E14. This makes it possible to avoid the canceling of the charge due to simultaneous reception of the compressive stress and the tensile stress at the portion of the piezoelectric material layer 42 overlapping with one upper electrode layer, leading to generation of the charge efficiently from the stress generated in the first bridge supporting portion 30A.

The upper electrode layers E21 and E22 provided in the first bridge supporting portion 30B are arranged in a region of the first bridge supporting portion 30B where a compressive stress is generated, leading to generation of a negative charge in the upper electrode layers E21 and E22. The upper electrode layers E23 and E24 are arranged in a region of the first bridge supporting portion 30B where a tensile stress is generated, leading to generation of a positive charge in the upper electrode layers E23 and E24. In this manner, it is possible to efficiently generate a charge from the stress generated in the first bridge supporting portion 30B.

The upper electrode layers E31 and E33 provided in the first bridge supporting portion 30C are arranged in a region of the first bridge supporting portion 30C where a tensile stress is generated, leading to generation of a positive charge in the upper electrode layers E31 and E33. The upper electrode layers E32 and E34 are arranged in a region of the first bridge supporting portion 30C where a compressive stress is generated, leading to generation of a negative charge in the upper electrode layers E32 and E34. In this manner, it is possible to efficiently generate a charge from the stress generated in the first bridge supporting portion 30C.

The upper electrode layers E41 and E43 provided on the first bridge supporting portion 30D are arranged in the region of the first bridge supporting portion 30D where a compressive stress is generated, leading to generation of a negative charge in the upper electrode layers E41 and E43. The upper electrode layers E42 and E44 are arranged in a region of the first bridge supporting portion 30D where a tensile stress is generated, leading to generation of a positive charge in the upper electrode layers E42 and E44. In this manner, it is possible to efficiently generate a charge from the stress generated in the first bridge supporting portion 30D.

Although not illustrated, even in a case where the vibration acceleration is applied to the negative side on the X-axis, it is possible to efficiently generate a charge by the upper electrode layers E11 to E44 in a similar manner.

Moreover, in a case where vibration acceleration is applied to the positive side on the Y-axis or the negative side on the Y-axis, the first bridge supporting portion 30A and the first bridge supporting portion 30B deform similarly to the first bridge supporting portion 30C and the first bridge supporting portion 30D in a case where vibration acceleration to the positive side on the X-axis or the negative side on the X-axis is applied. The first bridge supporting portion 30C and the first bridge supporting portion 30D deform similarly to the first bridge supporting portion 30A and the first bridge supporting portion 30B in a case where vibration acceleration to the positive side on the X-axis or the negative side on the X-axis is applied. Therefore, even in a case where the vibration acceleration is applied to the positive side on the Y-axis or the negative side on the Y-axis, it is possible to efficiently generate a charge by the upper electrode layers E11 to E44 in a similar manner. Note that a bending stress greater than the bending stress generated in the first bridge supporting portions 30A and 30B is generated in the first bridge supporting portions 30C and 30D. The first extending axes of the first bridge supporting portions 30A and 30B are perpendicular to the direction of the vibration acceleration, and thus, the stress generated in the first bridge supporting portions 30A and 30B mainly becomes a torsional stress, which is smaller than the bending stress generated in the first bridge supporting portions 30C and 30D.

Moreover, even in a case where the vibration acceleration is applied in the X-axis direction and the Y-axis direction, the first weight body 21 is supported on the pedestal 10 by the four first bridge supporting portions 30A to 30D. This configuration makes it possible to reduce the displacement of the first weight body 21.

In FIG. 11, the charge generated in the upper electrode layers E11 to E44 is represented by a positive charge (+) or a negative charge (−). The stress generated in the first bridge supporting portions 30A to 30D and the charge generated in the upper electrode layers E11 to E44 are often uniquely determined in the case of the thin film-formed piezoelectric material layer 42. In general, spontaneous polarization in the piezoelectric ceramic formed by sintering has a random direction, leading to no charge generation even in a case where a compressive stress or a tensile stress has been received. In this case, however, by performing polarization treatment with application of a high voltage, it is possible to align the directions of the spontaneous polarization of the piezoelectric ceramic. In a case where the piezoelectric material layer 42 is formed of such a piezoelectric ceramic, it is possible to intentionally change, by the polarization treatment, the positive-negative of the charge generated by the compressive stress and the tensile stress. This makes the present embodiment advantageous from a viewpoint that it is possible to generate a charge in all the upper electrode layers E11 to E44 in any direction in three-dimensions, regardless of positive-negative of the charge generated in the upper electrode layers E11 to E44. This makes it possible to efficiently perform three-axis power generation.

In this manner, according to the present embodiment, the first extending axes of a pair of the first bridge supporting portions 30A to 30D adjacent to each other in the circumferential direction with the first weight body 21 defined as a center in plan view form a predetermined angle. This makes it possible to arrange the first bridge supporting portions 30A to 30D such that the corresponding first extending axes of the four first bridge supporting portions 30A to 30D extend in mutually different directions. Therefore, even in a case where the first extending axes of the two first bridge supporting portions 30A and 30B among the four first bridge supporting portions 30A to 30D are arranged on a straight line, it is possible to arrange the first extending axes of the other two first bridge supporting portions 30C and 30D in a direction different from the first extending axes of the first bridge supporting portions 30A and 30B (direction different by 90° in the present embodiment). This makes it possible to avoid a state in which all of the first extending axes of the four first bridge supporting portions 30A to 30D are perpendicular to the direction of the vibration acceleration in a case where vibration acceleration is applied from any direction on the XY plane. Therefore, even in a case where vibration acceleration is applied from any direction in three-dimensions, it is possible to generate a relatively great bending stress in at least one first bridge supporting portion of the first bridge supporting portions 30A to 30D. This makes it possible to increase the charge generated in the upper electrode layers E11 to E44. As a result, it is possible to efficiently generate a charge in each of the upper electrode layers E11 to E44 from the stress generated in the first bridge supporting portions 30A to 30D by the displacement of the first weight body 21, leading to achievement of efficient three-axis power generation.

Moreover, according to the present embodiment, the first extending axes of the four first bridge supporting portions 30A to 30D are radially arranged with respect to the first weight body 21 of the vibrating body 20 in plan view. This makes it possible to equalize the angles formed by the first extending axes of the first bridge supporting portions 30A to 30D adjacent to each other in the circumferential direction with the first weight body 21 defined as a center. With this configuration, it is possible to suppress generation of directivity with respect to the direction of the vibration acceleration in the XY plane in the charge generated in the upper electrode layers E11 to E44. As a result, it is possible to further efficiently generate a charge in each of the upper electrode layers E11 to E44 and further efficiently perform three-axis power generation. In particular, according to the present embodiment, the angles formed by the first extending axes of the first bridge supporting portions 30A to 30D adjacent to each other in plan view are equal to each other. This makes it possible to further suppress generation of the directivity related to a planar direction of the vibration acceleration in the charges generated in the upper electrode layers E11 to E44, and it is possible to further efficiently perform three-axis power generation.

Moreover, according to the present embodiment, the first weight body 21 is supported by the four first bridge supporting portions 30A to 30D. This makes it possible to configure such that the first extending axes of the two first bridge supporting portions 30A and 30B are perpendicular to the first extending axes of the two first bridge supporting portions 30C and 30D. This configuration can further suppress generation of the directivity related to the planar direction of the vibration acceleration in the charges generated in the upper electrode layers E11 to E44, in a case where vibration acceleration is applied from any of the directions in plan view. Moreover, symmetry can be applied to the deformation state of the four first bridge supporting portions 30A to 30D. For example, in a case where the vibration acceleration is applied in the X-axis direction, it is possible to deform the four first bridge supporting portions 30A to 30D symmetrically with respect to the center axis LY. Moreover, in a case where the vibration acceleration is applied in the Y-axis direction, it is possible to deform the four first bridge supporting portions 30A to 30D symmetrically with respect to the center axis LX. In a case where the vibration acceleration is applied in the Z-axis direction, it is possible to deform the four first bridge supporting portions 30A to 30D symmetrically with respect to each of the center axis LX and the center axis LY. This makes it possible to equalize the total amount of positive charges and the total amount of negative charges generated in each of the upper electrode layers E11 to E44, leading to enhancement of the power generation efficiency.

Moreover, according to the present embodiment, since the first weight body 21 is supported by the four first bridge supporting portions 30A to 30D as described above, it is possible to suppress the amount of displacement of the first weight body 21 in a case where the vibration acceleration is applied. This makes it possible to prevent the first weight body 21 from abutting the top plate 71 or the bottom plate 74 of the casing 70 in a wider acceleration range. With this configuration, it is possible to suppress an escape of the force received by the first weight body 21 to the top plate 71 and the bottom plate 74 and increase the stress generated in the first bridge supporting portions 30A to 30D, leading to an increase in the charge generated from the piezoelectric element 40. As a result, it is possible to suppress the displacement of the first weight body 21 and increase the power generation amount.

Moreover, according to the present embodiment, the first weight body 21 is supported by the four first bridge supporting portions 30A to 30D, making it possible to suppress generation of warpage in the first bridge supporting portions 30A to 30D. In a case where the power generating element has a cantilever structure, the lower electrode layer E0, the piezoelectric material layer 42, and the upper electrode layer are laminated on the first bridge supporting portion, leading to the possibility of generation of warpage in the first bridge supporting portions due to a difference in a linear expansion coefficient of each of the layers. In the case of having a cantilever structure, the end on the side of the first weight body 21 of the first bridge supporting portion becomes a free end, leading to an increased warpage in some cases. This might hinder the element from being accommodated in the semiconductor manufacturing apparatus, which is not preferable in view of the manufacturing process. In contrast, the power generating element 1 according to the present embodiment is configured such that the first weight body 21 is supported by the above-described four first bridge supporting portions 30A to 30D, making it possible to reduce the warpage generated in the first bridge supporting portions 30A to 30D, which is advantageous in terms of manufacturing.

Moreover, according to the present embodiment, the four upper electrode layers E11 to E44 are arranged at mutually different positions in directions along the corresponding first extending axes in each of the first bridge supporting portions 30A to 30D. This makes it possible to allow the upper electrode layers E11 to E44 to be arranged in a portion where the compressive stress is generated and a portion where the tensile stress is generated, in a case where the first bridge supporting portions 30A to 30D are deformed. Therefore, it is possible to prevent the charge generated in one upper electrode layer from being canceled due to simultaneous generation of the negative charge caused by the compressive stress and the positive charge caused by the tensile stress. As a result, it is possible to efficiently generate a charge from the stress generated in each of the first bridge supporting portions 30A to 30D, and to further efficiently perform three-axis power generation.

Moreover, according to the present embodiment, the four upper electrode layers E11 to E44 are arranged at mutually different positions in directions perpendicular to the corresponding first extending axes in each of the first bridge supporting portions 30A to 30D. This makes it possible to allow the upper electrode layers E11 to E44 to be arranged in a portion where the compressive stress is generated and a portion where the tensile stress is generated, in a case where the first bridge supporting portions 30A to 30D are deformed. Therefore, it is possible to prevent the charge generated in one upper electrode layer from being canceled due to simultaneous generation of the negative charge caused by the compressive stress and the positive charge caused by the tensile stress. As a result, it is possible to efficiently generate a charge from the stress generated in each of the first bridge supporting portions 30A to 30D, and to further efficiently perform three-axis power generation.

Moreover, according to the present embodiment, the top plate facing surface 72 of the top plate 71 includes the plurality of top plate-side projections 73 to which the first weight body 21 can abut in a case where it is displaced upward. There would be a case where the first weight body supporting portion 22 is arranged in the vicinity of the top plate facing surface 72 without the top plate-side projection 73. In this case, the viscosity of the air existing in the space between the first weight body supporting portion 22 and the top plate facing surface 72 would generate damping action and might suppress the vibration of the first weight body 21. This might lose the vibration energy of the first weight body 21 and deteriorate the power generation efficiency. In contrast, the present embodiment includes the top plate-side projection 73 on the top plate facing surface 72, and thus, even in a case where the first weight body 21 abuts the top plate-side projection 73 via the first weight body supporting portion 22, it is possible to ensure a gap between the first weight body supporting portion 22 and the top plate facing surface 72. This makes it possible to prevent generation of damping action of air between the first weight body supporting portion 22 and the top plate facing surface 72, leading to prevention of suppression of the vibration of the first weight body 21. As a result, it is possible to prevent deterioration of the power generation efficiency of the power generating element 1.

Furthermore, according to the present embodiment, the bottom plate facing surface 75 of the bottom plate 74 includes a plurality of bottom plate-side projections 76 to which the first weight body 21 can abut in a case where it is displaced downward. There would be a case where the first weight body 21 is arranged in the vicinity of the bottom plate facing surface 75 without the bottom plate-side projection 76. In this case, the viscosity of the air existing in the space between the first weight body 21 and the bottom plate facing surface 75 would generate damping action and might suppress the vibration of the first weight body 21. This might lose the vibration energy of the first weight body 21 and deteriorate the power generation efficiency. In contrast, the present embodiment includes the bottom plate-side projection 76 on the bottom plate facing surface 75, and thus, even in a case where the first weight body 21 abuts the bottom plate-side projection 76, it is possible to ensure a gap between the first weight body 21 and the bottom plate facing surface 75. This makes it possible to prevent generation of damping action of air between the first weight body 21 and the bottom plate facing surface 75, leading to prevention of suppression of the vibration of the first weight body 21. This makes it possible to prevent deterioration of the power generation efficiency of the power generating element 1.

The above-described embodiment is an exemplary case in which the piezoelectric element 40 is used as the charge generating element. It is not, however, limited to the use of the piezoelectric element 40 as long as a charge can be generated at the time of displacement of the vibrating body 20, and electret or the like may be used, for example.

Figure 12:
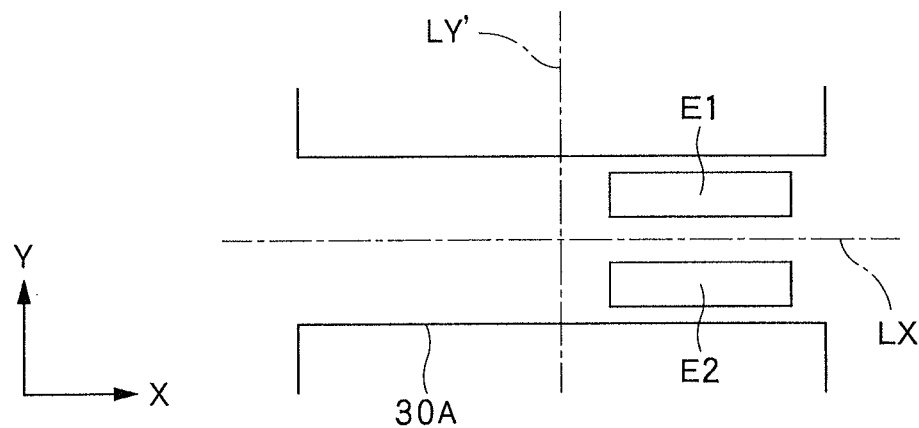
FIG. 12 is a plan view illustrating a modification of the upper electrode layer of the piezoelectric element illustrated in FIG. 2.
Figure 13:
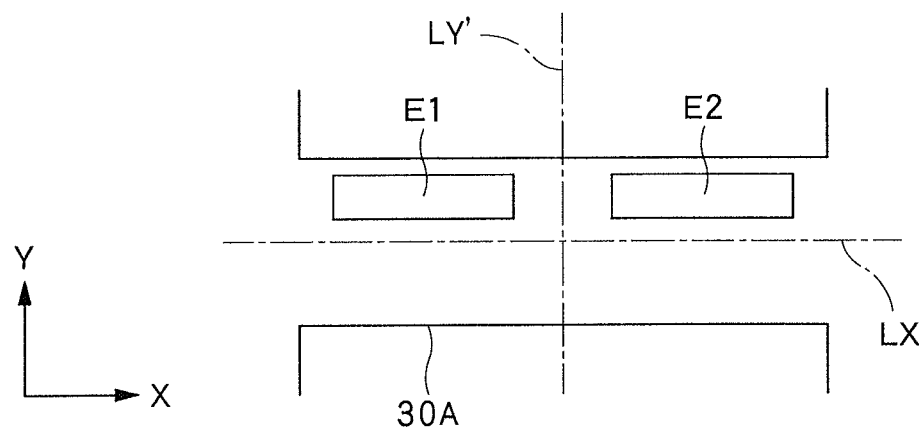
FIG. 13 is a plan view illustrating a modification of the upper electrode layer of the piezoelectric element illustrated in FIG. 2.
Figure 14:
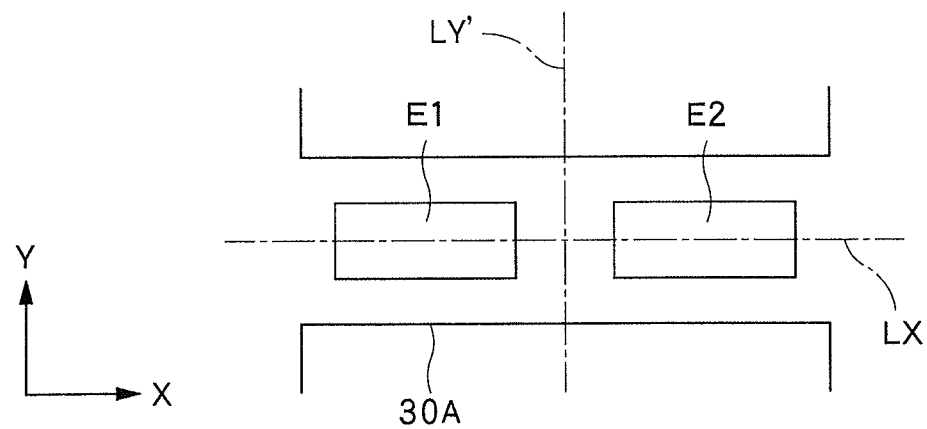
FIG. 14 is a plan view illustrating a modification of the upper electrode layer of the piezoelectric element illustrated in FIG. 2.

Moreover, the above-described embodiment is an exemplary case in which four of the upper electrode layers E11 to E44 are provided in each of the first bridge supporting portions 30A to 30D. However, the number and arrangement of the upper electrode layers arranged in each of the first bridge supporting portions 30A to 30D are optional, and for example, the number or arrangement as illustrated in FIGS. 12 to 14 may be adopted. FIGS. 12 to 14 are plan views illustrating modifications of the upper electrode of the piezoelectric element 40 illustrated in FIG. 2.

As illustrated in FIGS. 12 to 14, it is allowable to provide two upper electrode layers E1 and E2 on each of the first bridge supporting portions 30A to 30D. The following is a representative explanation of the upper electrode layers E1 and E2 as an example provided in the first bridge supporting portion 30A.

The upper electrode layers E1 and E2 illustrated in FIG. 12 are arranged at mutually different positions in a direction (here, the Y-axis direction) perpendicular to the first extending axis (center axis LX). More specifically, in FIG. 12, the upper electrode layer E1 is arranged on the positive side on the Y-axis with respect to the center axis LX, while the upper electrode layer E2 is arranged on the negative side on the Y-axis with respect to the center axis LX. Forming the two upper electrode layers E1 and E2 in elongated shapes in the direction along the first extending axis (here, the X-axis direction) might cancel the charge by simultaneously receiving the compressive stress and the tensile stress. Therefore, it is preferable that the upper electrode layers E1 and E2 are formed so as not to receive the compressive stress and the tensile stress simultaneously. For example, as in the case of the upper electrode layers E11 to E14 as illustrated in FIG. 2, it is preferable that the two upper electrode layers E1 and E2 are arranged on one side (positive side on the X-axis) or the other side (negative side on the X-axis) with respect to an axis LY' extending in the direction (herein, Y-axis direction) perpendicular to the first extending axis passing through an intermediate point in the direction (herein, X-axis direction) along the first extending axis of the first bridge supporting portion 30A. FIG. 12 illustrates an exemplary case in which each of the two upper electrode layers E1 and E2 is arranged on the positive side on the X-axis with respect to the axis LY'. Alternatively, however, each of the two upper electrode layers E1 and E2 may be arranged on the negative side of the X-axis with respect to the axis LY'. Still alternatively, one of the two upper electrode layers E1 and E2 may be formed on the positive side on the X-axis with respect to the axis LY' with the other being formed on the negative side on the X-axis with respect to the axis LY'.

The upper electrode layers E1 and E2 illustrated in FIG. 13 are arranged at mutually different positions in a direction (herein, X-axis direction) along the first extending axis (center axis LX). More specifically, in FIG. 13, the upper electrode layer E1 is arranged on the negative side on the X-axis with respect to the center axis LY', while the upper electrode layer E2 is arranged on the positive side on the X-axis with respect to the center axis LY'. It is also preferable in the example illustrated in FIG. 13 that the two upper electrode layers E1 and E2 are arranged so as not to receive the compressive stress and the tensile stress simultaneously. For example, as in the case of the upper electrode layers E11 to E14 as illustrated in FIG. 2, it is preferable that the upper electrode layers E1 and E2 are arranged on one side (positive side on the Y-axis) or the other side (negative side on the Y-axis) with respect to the axis (center axis LX) extending along the first extending axis passing through an intermediate point in the direction (herein, Y-axis direction) perpendicular to the first extending axis of the first bridge supporting portion 30A. FIG. 13 illustrates an exemplary case in which each of the two upper electrode layers E1 and E2 is arranged on the positive side on the Y-axis with respect to the center axis LX. Alternatively, however, each of the two upper electrode layers E1 and E2 may be arranged on the negative side on the Y-axis with respect to the center axis LX. Moreover, as illustrated in FIG. 14, the upper electrode layers E1 and E2 may be arranged so as to straddle the center axis LX from the positive side on the Y-axis to the negative side on the Y-axis with respect to the center axis LX. In this case, the upper electrode layers E1 and E2 are arranged on the center axis LX. Moreover, one of the two upper electrode layers E1 and E2 may be formed on the positive side on the Y-axis with respect to the center axis LX with the other being formed on the negative side on the Y-axis with respect to the center axis LX.

Furthermore, as long as it is possible to achieve arrangement capable of avoiding reception of compressive stress and tensile stress at the same time, the number of upper electrode layers provided in each of the first bridge supporting portions 30A to 30D may be one.

Figure 15:
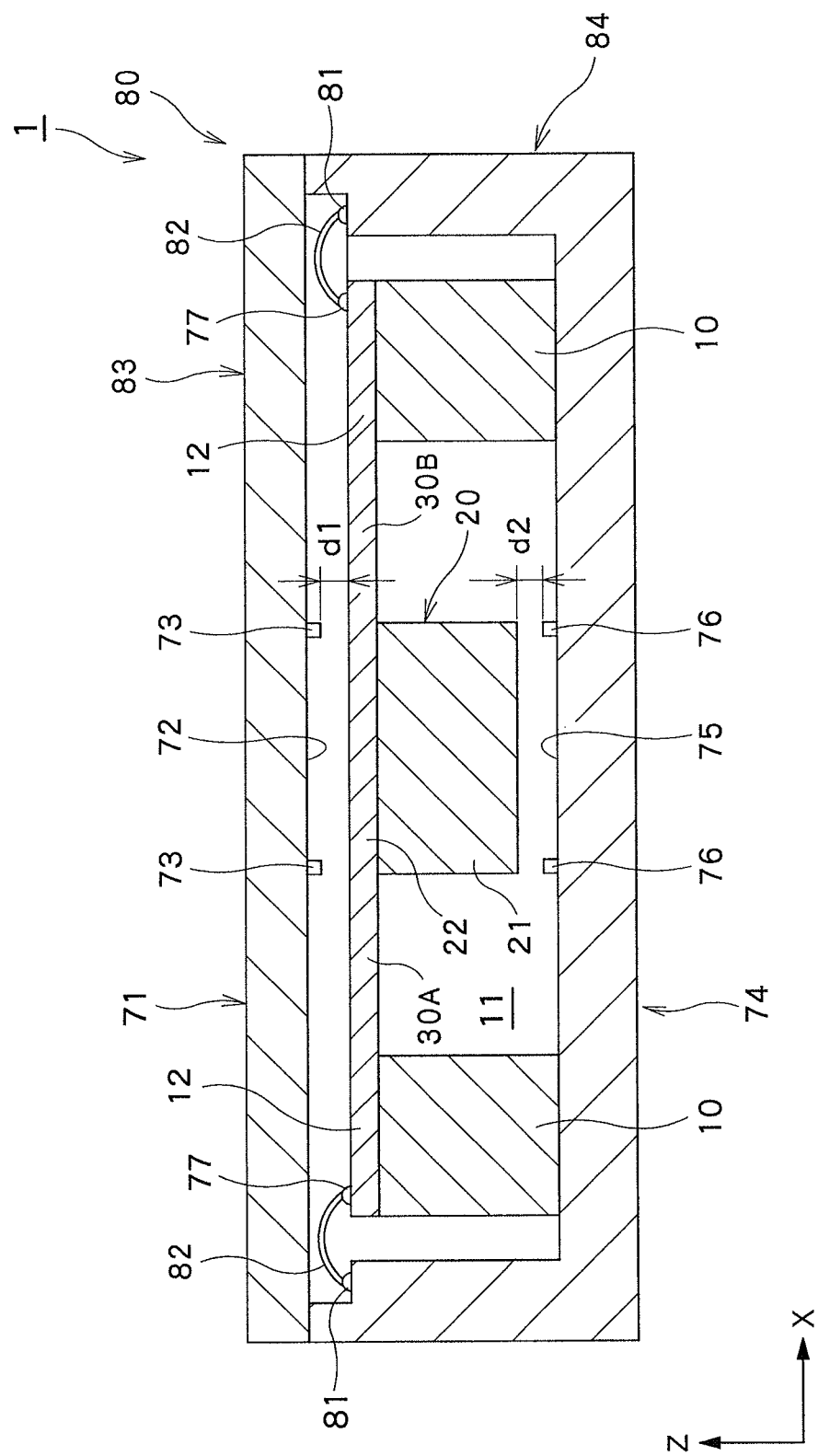
FIG. 15 is a cross-sectional view illustrating a modification of the power generating element of FIG. 8 including an outer package.

As illustrated in FIG. 8, the above-described present embodiment is an exemplary case of the power generating element 1 including the outer package 80 in which the casing 70 constituted with the pedestal 10, the top plate 71, and the bottom plate 74 is accommodated in the outer package 80. The mode of accommodation in the outer package 80, however, is not limited to this. For example, it is allowable to adopt a mode of accommodation illustrated in FIG. 15. FIG. 15 is a diagram illustrating a modification of the power generating element including an outer package illustrated in FIG. 8.

In the modification illustrated in FIG. 15, the outer package 80 includes a lid 83 and a container 84, the lid 83 includes the top plate 71, and the container 84 includes the bottom plate 74. In this case, the casing 70 as illustrated in FIG. 7 is not included in the configuration, and the pedestal 10 is joined to the bottom plate 74 of the container 84. In the mode illustrated in FIG. 15, when the first weight body 21 is in a neutral position, the top plate 71 is spaced apart from the first weight body supporting portion 22 by the predetermined distance d1, and the first weight body 21 can be displaced upward until it abuts the top plate 71 via the first weight body supporting portion 22. Similarly, the bottom plate 74 is spaced apart from the first weight body 21 by the predetermined distance d2, and the first weight body 21 can be displaced downward until it abuts the bottom plate 74. The bonding pad 77 on the piezoelectric element 40 side is provided on the pedestal 10 and the bonding pad 81 on the external side is provided in the container 84. These bonding pads 77 and 81 are connected with each other by the bonding wire 82.

Moreover, the above-described embodiment is an exemplary case in which the vibrating body 20 is supported on the pedestal 10 by the four first bridge supporting portions 30A to 30D. However, not limited thereto, the number of the first bridge supporting portions may be three (refer to FIG. 20), or may be five or more. With the configuration having three or more number of first bridge supporting portions, in any case where vibration acceleration is applied from any direction on the XY plane, it is possible to avoid a state in which all of the first extending axes of the three or five or more first bridge supporting portions are perpendicular to the direction of the vibration acceleration. Therefore, even in a case where vibration acceleration is applied from any direction in three-dimensions, it is possible to generate a charge efficiently at each of the upper electrode layers from the stress generated in the first bridge supporting portion by the displacement of the first weight body 21. This makes it possible to efficiently perform three-axis power generation.

Moreover, the above-described present embodiment is a case where the first extending axes of the four first bridge supporting portions 30A to 30D are radially arranged with respect to the first weight body 21 in plan view. However, not limited thereto, the four first bridge supporting portions 30A to 30D may be arranged arbitrarily as long as the first extending axes of the first bridge supporting portions 30A to 30D adjacent to each other in plan view form a predetermined angle. In this case, as long as the first extension axes of the first bridge supporting portions 30A to 30D adjacent to each other in plan view form a predetermined angle, the first extending axes can be arranged in mutually different directions even in a case where the angles formed by the first bridge supporting portions 30A to 30D adjacent to each other are not equal. This makes it possible to avoid a state in which all of the first extending axes of the four first bridge supporting portions 30A to 30D are perpendicular to the direction of the vibration acceleration in a case where vibration acceleration is applied from any direction on the XY plane. Therefore, it is possible to generate a relatively great bending stress in at least one first bridge supporting portion of the first bridge supporting portions 30A to 30D, achieving an increase in the charge generated in the upper electrode layers E11 to E44.

Moreover, the above-described present embodiment is a case where the top plate facing surface 72 of the top plate 71 includes the plurality of top plate-side projections 73. However, not limited thereto, as long as the first weight body 21 can be brought into abutment, the number of the top plate-side projections 73 provided on the top plate facing surface 72 is not limited to the plurality. Moreover, the above-described present embodiment is a case where the bottom plate facing surface 75 of the bottom plate 74 includes the plurality of bottom plate-side projections 76. However, not limited thereto, as long as the first weight body 21 can be brought into abutment, the number of the bottom plate-side projections 76 provided on the bottom plate facing surface 75 is not limited to the plurality.

Furthermore, the above-described embodiment includes a description that in a case where the top plate 71 includes the top plate-side projection 73 and the bottom plate 74 includes the bottom plate-side projection 76, it is possible to prevent suppression of the vibration of the vibrating body 20 due to the damping action of air. This action and effect can be obtained regardless of the shape, arrangement, or the like, of the first bridge supporting portion. That is, in the case of providing the top plate-side projection 73 and/or the bottom plate-side projection 76 in order to prevent suppression of the vibration of the vibrating body 20 by the damping action of air, it is possible to use any mode for supporting the vibrating body 20 on the pedestal 10 (for example, arrangement and shape of the first bridge supporting portion and a second bridge supporting portion described below) and use any shape, or the like, of the pedestal 10 and the vibrating body 20.

Second Embodiment

Next, a power generating element according to a second embodiment of the present invention will be described with reference to FIGS. 16 to 20.

In the second embodiment illustrated in FIGS. 16 to 20, a main difference is in that the first weight body of the vibrating body includes a first weight body central portion and a first weight body protrusion coupled to the first weight body central portion. The other configurations are substantially the same as those of the first embodiment illustrated in FIGS. 1 to 15. In FIGS. 16 to 20, the same portions as those of the first embodiment illustrated in FIGS. 1 to 15 will be denoted by the same reference numerals, and a detailed description thereof will be omitted.

Figure 16:
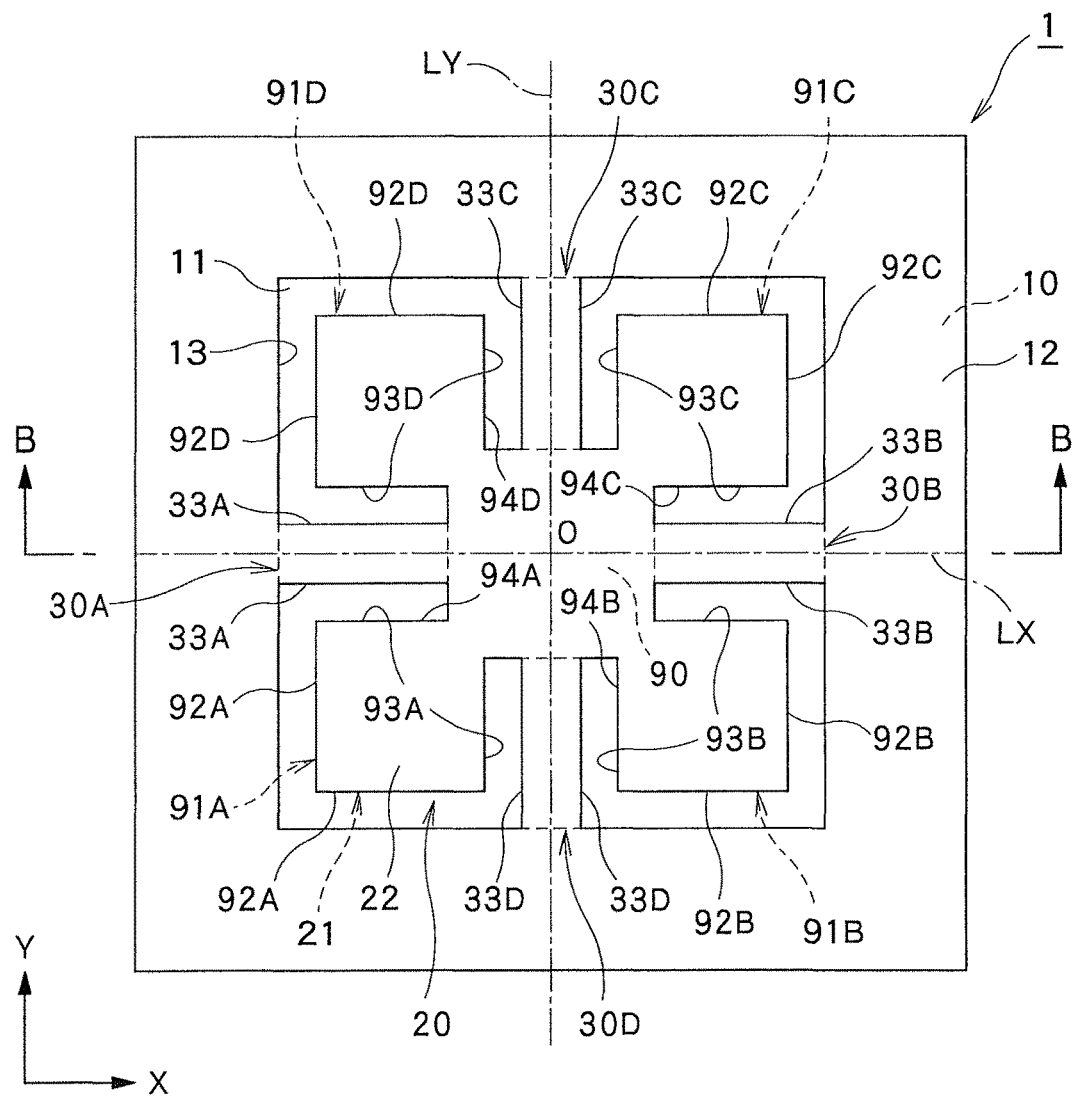
FIG. 16 is a plan view illustrating a power generating element according to a second embodiment of the present invention.
Figure 17:
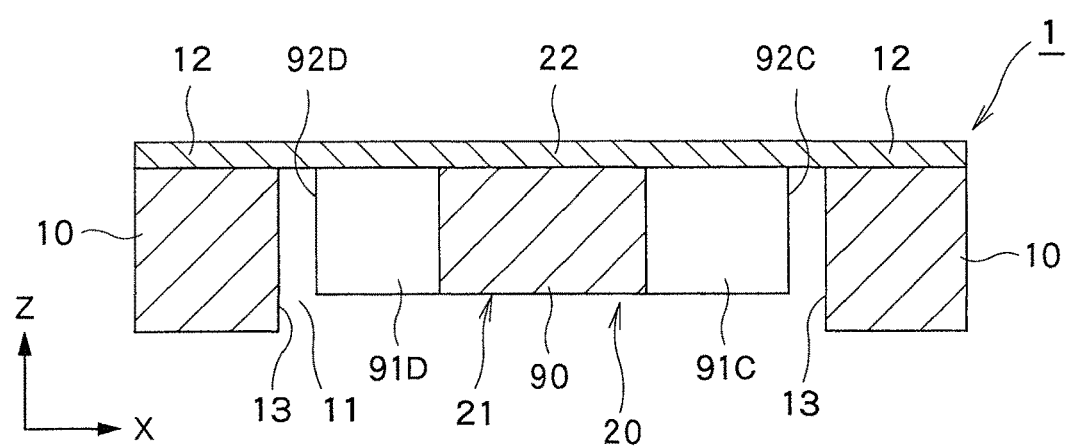
FIG. 17 is a cross-sectional view taken along line B-B of FIG. 16.

FIG. 16 is a plan view of a power generating element according to the second embodiment of the present invention. FIG. 17 illustrates a cross section taken along line B-B in FIG. 16. In FIG. 16, illustration of the upper electrode layer of the piezoelectric element 40 is omitted for clarity of the drawing. In FIG. 16, the four upper electrode layers E11 to E44 may also be provided in each of the first bridge supporting portions 30A to 30D as illustrated in FIG. 2, or the two upper electrode layers E1 and E2 may be provided as illustrated in FIGS. 12 to 14. Furthermore, the number of upper electrode layers may be one. This also applies to the modification illustrated in FIGS. 18 to 20 described below.

In the present embodiment, as illustrated in FIG. 16, the first weight body 21 of the vibrating body 20 includes a first weight body central portion 90 and a plurality of first weight body protrusions 91A to 91D coupled to the first weight body central portion 90. Among these, the first weight body protrusions 91A to 91D protrude from the first weight body central portion 90 toward the pedestal 10. In the present embodiment, the first weight body central portion 90 is formed in a rectangular shape (or a square shape) in plan view, and the first weight body protrusions 91A to 91D are formed so as to bulge from corner portions of the first weight body central portion 90. The first weight body protrusions 91A to 91D are also formed in rectangular shapes (or square shapes) in plan view. As a result, the planar shape of the first weight body 21 is a clover shape as a whole. The first weight body central portion 90 and the first weight body protrusions 91A to 91D are continuously and integrally formed. The first weight body supporting portion 22 is integrally formed and joined to the entire upper surface of the first weight body central portion 90 and the entire upper surface of each of the first weight body protrusions 91A to 91D.

The first weight body protrusions 91A to 91D are arranged between the first bridge supporting portions 30A to 30D adjacent to each other in the circumferential direction (circumferential direction with respect to the center O) with the first weight body central portion 90 defined as a center in plan view. In other words, there are provided draw-in recesses 94A to 94D that draw in the ends 32A to 32D (refer to FIG. 2) of the first bridge supporting portions 30A to 30D on the first weight body central portion 90 side, at a portion between the first weight body protrusions 91A to 91D adjacent to each other in the circumferential direction. The draw-in recesses 94A to 94D are formed so as to be recessed from an outer edge of the first weight body 21 toward the inner side. The draw-in recesses 94A to 94D are formed so as to extend in an elongated shape along the first extending axis of the corresponding first bridge supporting portions 30A to 30D. In the example illustrated in FIG. 16, the draw-in recesses 94A to 94D draw in a large area including the ends 32A to 32D, of the corresponding first bridge supporting portions 30A to 30D. As a result, the first bridge supporting portions 30A to 30D are arranged between the first weight body protrusions 91A to 91D adjacent to each other in the circumferential direction.

Outer edges 92A to 92D of the first weight body protrusions 91A to 91D on the pedestal 10 side are formed along (or parallel to) an inner edge 13 (inner edge 13 defining the pedestal opening 11) of the pedestal 10. Outer edges 93A to 93D of the first weight body protrusions 91A to 91D on the opposing first bridge supporting portions 30A to 30D sides are formed along (or parallel to) side edges 33A to 33D of the first bridge supporting portions 30A to 30D.

More specifically, one first weight body protrusion 91A is arranged between the first bridge supporting portion 30A and the first bridge supporting portion 30D. The first weight body protrusion 91A is surrounded by the two first bridge supporting portions 30A and 30D and the pedestal 10. The outer edge 92A of the first weight body protrusion 91A on the pedestal 10 side is formed along the inner edge 13 of the pedestal 10. The outer edge 93A of the first weight body protrusion 91A on the opposing first bridge supporting portion 30A side is formed along the side edge 33A of the first bridge supporting portion 30A while the outer edge 93A on the opposing first bridge supporting portion 30D side is formed along the side edge 33D of the first bridge supporting portion 30D.

One first weight body protrusion 91B is arranged between the first bridge supporting portion 30D and the first bridge supporting portion 30B. The first weight body protrusion 91B is surrounded by the two first bridge supporting portions 30B and 30D and the pedestal 10. The outer edge 92B of the first weight body protrusion 91B on the pedestal 10 side is formed along the inner edge 13 of the pedestal 10. The outer edge 93B of the first weight body protrusion 91B on the opposing first bridge supporting portion 30D side is formed along the side edge 33D of the first bridge supporting portion 30D while the outer edge 93B on the opposing first bridge supporting portion 30B side is formed along the side edge 33B of the first bridge supporting portion 30B.

One first weight body protrusion 91C is arranged between the first bridge supporting portion 30B and the first bridge supporting portion 30C. The first weight body protrusion 91C is surrounded by the two first bridge supporting portions 30B and 30C and the pedestal 10. The outer edge 92C of the first weight body protrusion 91C on the pedestal 10 side is formed along the inner edge 13 of the pedestal 10. The outer edge 93C of the first weight body protrusion 91C on the opposing first bridge supporting portion 30B side is formed along the side edge 33B of the first bridge supporting portion 30B while the outer edge 93C on the opposing first bridge supporting portion 30C side is formed along the side edge 33C of the first bridge supporting portion 30C.

One first weight body protrusion 91D is arranged between the first bridge supporting portion 30C and the first bridge supporting portion 30A. The first weight body protrusion 91D is surrounded by the two first bridge supporting portions 30A and 30C and the pedestal 10. The outer edge 92D of the first weight body protrusion 91D on the pedestal 10 side is formed along the inner edge 13 of the pedestal 10. The outer edge 93D of the first weight body protrusion 91D on the opposing first bridge supporting portion 30C side is formed along the side edge 33C of the first bridge supporting portion 30C while the outer edge 93D on the opposing first bridge supporting portion 30A side is formed along the side edge 33A of the first bridge supporting portion 30A.

As illustrated in FIG. 17, the lower surface of the first weight body central portion 90 is positioned above the lower surface of the pedestal 10. The lower surfaces of the first weight body protrusions 91A to 91D are flush with the lower surface of the first weight body central portion 90. In this manner, the first weight body 21 can be displaced downward until it abuts the above-described bottom plate 74 (refer to FIG. 7 or the like).

In this manner, according to the present embodiment, the first weight body 21 of the vibrating body 20 includes the first weight body central portion 90 and the plurality of first weight body protrusions 91A to 91D coupled to the first weight body central portion 90. This makes it possible to increase the planar area of the first weight body 21 so as to increase the mass of the first weight body 21, achieving an increase in the stress generated in the first bridge supporting portions 30A to 30D in a case where the vibration acceleration is applied. This makes it possible to increase the charge generated from the upper electrode layers E11 to E44 of the piezoelectric element 40, leading to enhancement of the power generation efficiency of three-axis power generation.

According to the present embodiment, the first weight body protrusions 91A to 91D are arranged between the first bridge supporting portions 30A to 30D adjacent to each other in the circumferential direction with the first weight body central portion 90 defined as a center in plan view. This makes it possible to position the ends 32A to 32D of the first bridge supporting portions 30A to 30D on the first weight body central portion 90 side so as to be away from the ends 31A to 31D on the pedestal 10 side while increasing the planar area of the first weight body 21. This makes it possible to increase the lengths of the first bridge supporting portions 30A to 30D while increasing the mass of the first weight body 21, leading to achievement of a lower resonance frequency.

Moreover, according to the present embodiment, the outer edges 92A to 92D of the first weight body protrusions 91A to 91D on the pedestal 10 side are formed along the inner edge 13 of the pedestal 10, while the outer edges 93A to 93D of the first weight body protrusions 91A to 91D on the opposing first bridge supporting portions 30A to 30D sides are formed along the side edges 33A to 33D of the first bridge supporting portions 30A to 30D. This makes it possible to increase the occupancy of the first weight body protrusions 91A to 91D in a space between the first bridge supporting portions 30A to 30D adjacent to each other in the circumferential direction with the first weight body central portion 90 defined as a center. This makes it possible to effectively increase the mass of the first weight body protrusions 91A to 91D, leading to a further increase in the mass of the first weight body 21.

Figure 18:
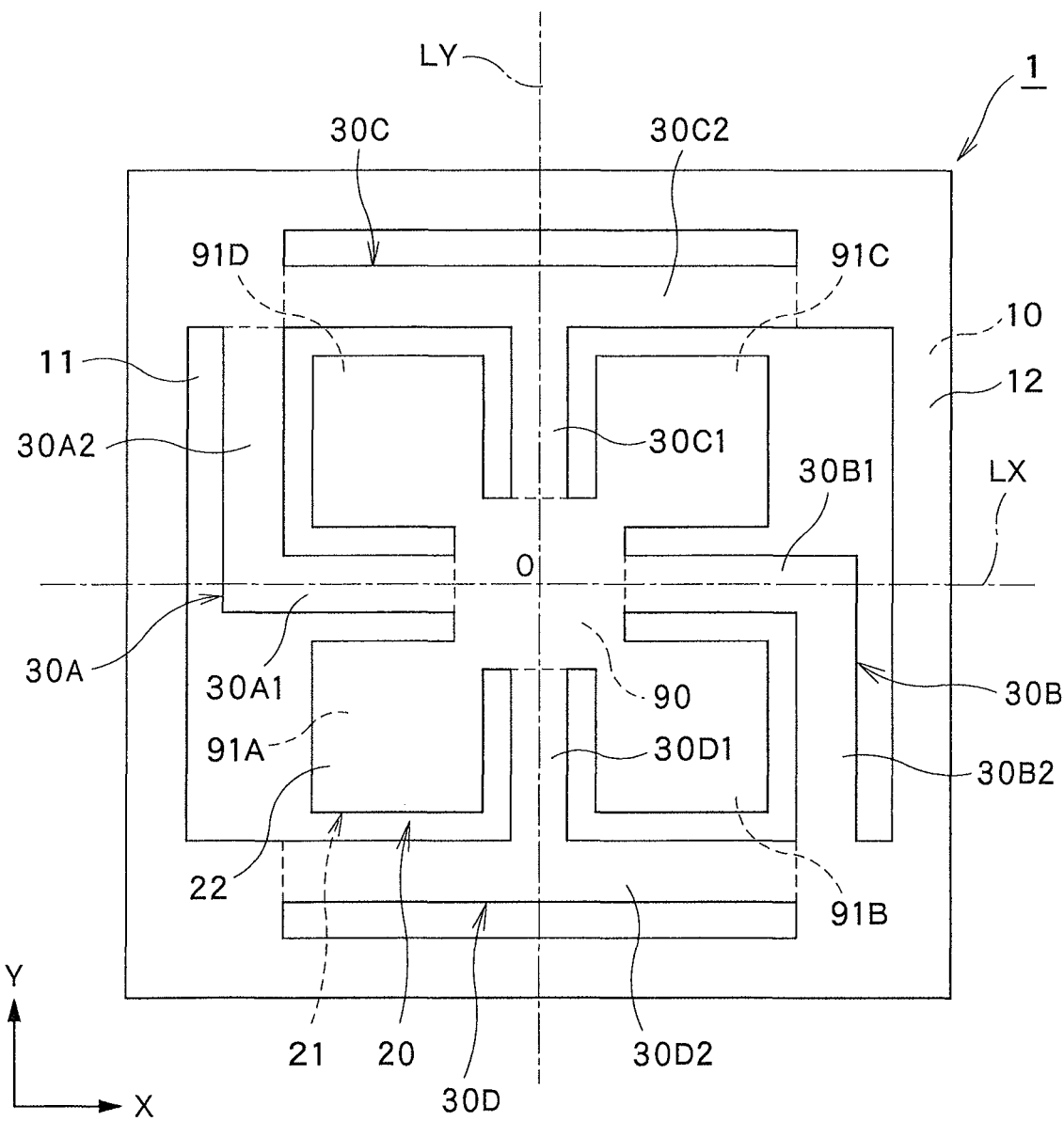
FIG. 18 is a plan view illustrating a modification of the power generating element illustrated in FIG. 16.

The above-described present embodiment is an exemplary case where each of the first extending axes of the first bridge supporting portions 30A and 30B is the center axis LX while each of the first extending axes of the first bridge supporting portions 30C and 30D is the center axis LY. The planar shape of each of the first bridge supporting portions 30A to 30D is not limited to this, however, and may be a planar shape as illustrated in FIG. 18, for example. FIG. 18 is a plan view illustrating a modification of the power generating element 1 illustrated in FIG. 16.

In the modification illustrated in FIG. 18, the first bridge supporting portion 30A includes a first direction portion 30A1 extending in the X-axis direction (direction along the first extending axis) and a second direction portion 30A2 provided more toward the pedestal 10 side than the first direction portion 30A1. The second direction portion 30A2 extends in a direction different from the first extending axis. In the modification illustrated in FIG. 18, the direction in which the second direction portion 30A2 extends is the Y-axis direction perpendicular to the first extending axis, and the planar shape of the first bridge supporting portion 30A is L-shaped. Similarly, the first bridge supporting portion 30B also includes a first direction portion 30B1 and a second direction portion 30B2, and the planar shape of the first bridge supporting portion 30B is also L-shaped. According to the modification illustrated in FIG. 18, it is possible to increase the lengths of the first bridge supporting portions 30A and 30B, leading to achievement of a lower resonance frequency.

In the modification illustrated in FIG. 18, the first bridge supporting portion 30C includes a first direction portion 30C1 extending in the Y-axis direction (direction along the first extending axis) and a second direction portion 30C2 extending in a direction different from the first extending axis. Among them, the direction in which the second direction portion 30C2 extends is the X-axis direction perpendicular to the first extending axis, and the planar shape of the first bridge supporting portion 30C is T-shaped. This configuration allows both ends of the second direction portion 30C2 to be coupled to the pedestal 10 as the ends 31C (refer to FIG. 2) of the first bridge supporting portion 30C on the pedestal 10 side. The first direction portion 30C1 is coupled to an intermediate position of the second direction portion 30C2 or in the vicinity thereof. Similarly, the first bridge supporting portion 30D also includes a first direction portion 30D1 and a second direction portion 30D2, and the planar shape of the first bridge supporting portion 30D is also T-shaped. According to the modification illustrated in FIG. 18, it is possible to increase the lengths of the first bridge supporting portions 30C and 30D, leading to achievement of a lower resonance frequency.

Figure 19:
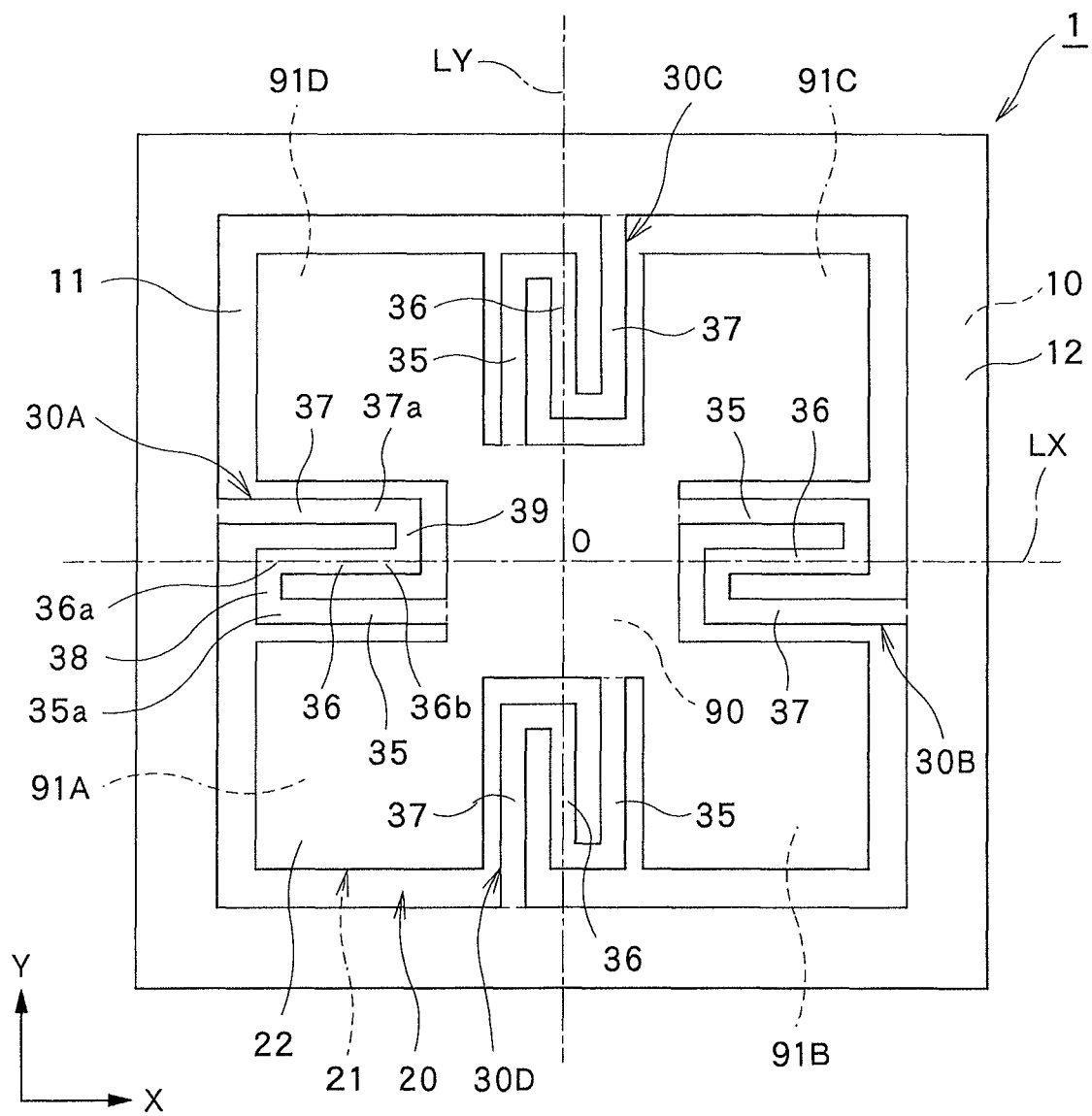
FIG. 19 is a plan view illustrating another modification of the power generating element illustrated in FIG. 16.

Moreover, the planar shape of the first bridge supporting portions 30A to 30D may be a planar shape as illustrated in FIG. 19, for example. FIG. 19 is a plan view illustrating another modification of the power generating element 1 illustrated in FIG. 16.

In the modification illustrated in FIG. 19, the first bridge supporting portion 30A includes a vibrating body-side portion 35, an intermediate portion 36, and a pedestal-side portion 37, arranged at mutually different positions in a direction perpendicular to the first extending axis. The vibrating body-side portion 35 is a portion coupled to the first weight body 21 of the vibrating body 20 and is a portion including the end 32A on the positive side on the X-axis illustrated in FIG. 2. The pedestal-side portion 37 is a portion coupled to the pedestal 10 and includes the end 31A on the negative side on the X-axis illustrated in FIG. 2. The intermediate portion 36 is arranged between the vibrating body-side portion 35 and the pedestal-side portion 37. The vibrating body-side portion 35, the intermediate portion 36, and the pedestal-side portion 37 extend along the first extending axis of the first bridge supporting portion 30A (X-axis direction), arranged parallel to each other in this order toward the positive side on the Y-axis.

An end 35a (left end in FIG. 19) of the vibrating body-side portion 35 on the pedestal 10 side is coupled to an end 36a (left end in FIG. 19) of the intermediate portion 36 on the first weight body 21 side by a first coupling portion 38. An end 36b (right end in FIG. 19) of the intermediate portion 36 on the pedestal 10 side is coupled to an end 37a (right end in FIG. 19) of the pedestal-side portion 37 on the vibrating body 20 side by a second coupling portion 39. Note that the term "first weight body 21 side" and the term "pedestal 10 side" are used to indicate coupled directions instead of directions when viewed as a planar shape.

The first coupling portion 38 and the second coupling portion 39 extend in a direction different from the first extending axis of the first bridge supporting portion 30A. In the modification illustrated in FIG. 19, the first coupling portion 38 and the second coupling portion 39 extend in a direction (Y-axis direction) perpendicular to the first extending axis.

The first bridge supporting portions 30B to 30D are also formed in the similar manner as the first bridge supporting portion 30A, and thus, a detailed description thereof will be omitted.

According to the modification illustrated in FIG. 19, it is possible to increase the lengths of the first bridge supporting portions 30A to 30D, leading to achievement of a lower resonance frequency.

Figure 20:
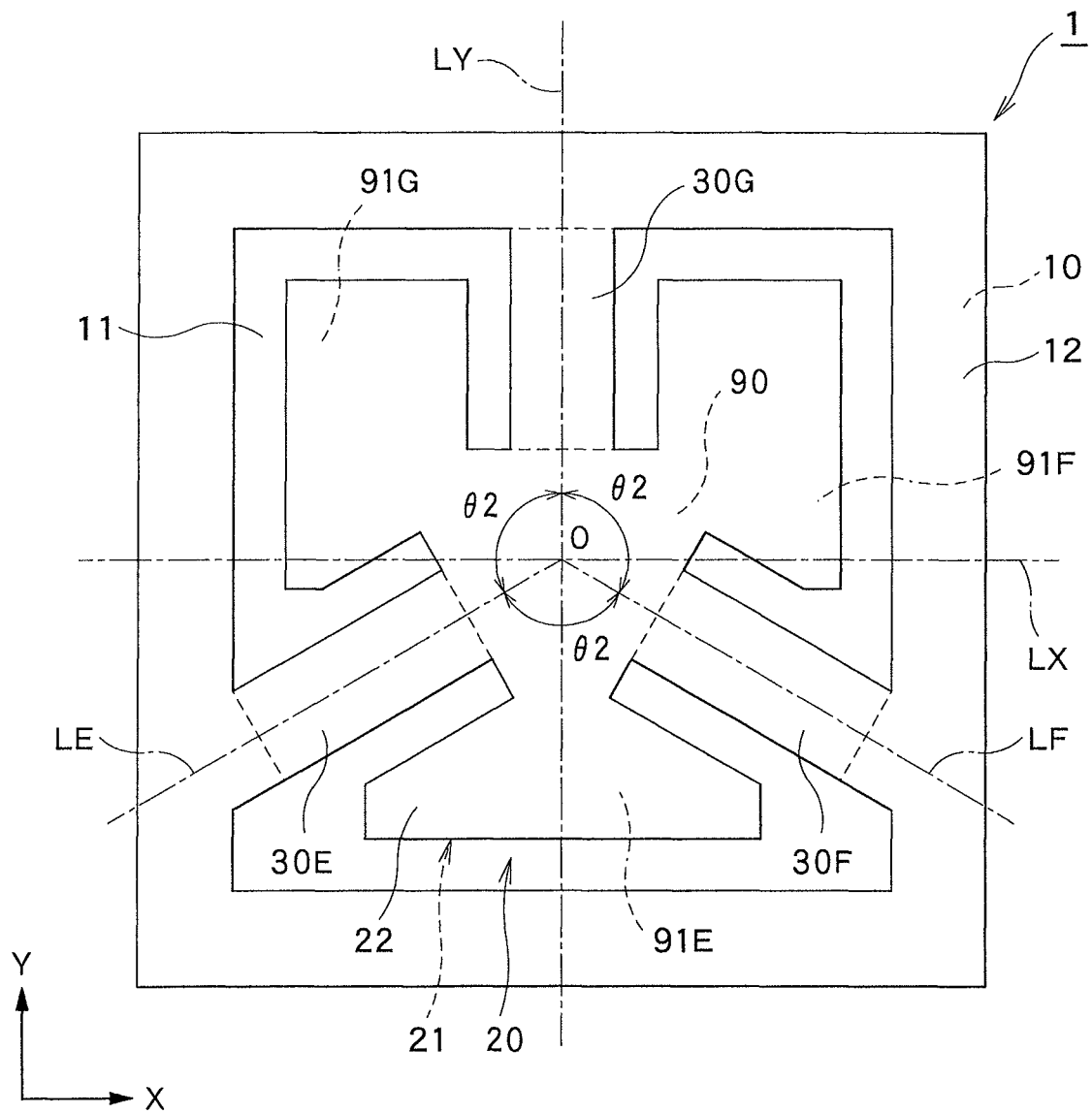
FIG. 20 is a plan view illustrating another modification of the power generating element illustrated in FIG. 16.

Moreover, the above-described embodiment is an exemplary case in which the first weight body 21 of the vibrating body 20 is supported on the pedestal 10 by the four first bridge supporting portions 30A to 30D. However, not limited thereto, the first weight body 21 may be supported on the pedestal 10 by the three first bridge supporting portions 30E to 30G as illustrated in FIG. 20. FIG. 20 is a plan view illustrating another modification of the power generating element 1 illustrated in FIG. 16.

In the modification illustrated in FIG. 20, the first extending axes of a pair of first bridge supporting portions 30E to 30G adjacent to each other in plan view form a predetermined angle (θ2 illustrated in FIG. 20). In this manner, the first extending axes of the first bridge supporting portions 30E to 30G extend in mutually different directions. Moreover, the first extending axes of the three first bridge supporting portions 30E to 30G are radially arranged with respect to the first weight body 21 in plan view, and the first bridge supporting portions 30E to 30G are arranged evenly in the circumferential direction with the first weight body 21 defined as a center. In FIG. 20, the first extending axis of the first bridge supporting portion 30E is indicated by LE, while the first extending axis of the first bridge supporting portion 30F is indicated by LF. The first extending axis of the first bridge supporting portion 30G is the center axis LY.

More specifically, in the modification illustrated in FIG. 20, the angles (θ2) formed by the first extending axes of a pair of the first bridge supporting portions 30E to 30G adjacent to each other in the circumferential direction with the first weight body central portion 90 defined as a center in plan view are an equal angle of 120°. The angles formed by the first extending axes of the first bridge supporting portions 30E to 30G adjacent to each other are not limited to being equal. For example, the angle may be 110° to 130° instead of 120°. In this case, the first extending axes of the three first bridge supporting portions 30E to 30G can also be considered to be radially arranged with respect to the first weight body 21 in plan view.

The planar shape of the first weight body central portion is substantially triangular. Three first weight body protrusions 91E to 91G are coupled to the first weight body central portion 90.

In the modification illustrated in FIG. 20, in any case where vibration acceleration is applied from any direction on the XY plane, it is possible to avoid a state in which all of the first extending axes of the three first bridge supporting portions 30E to 30G are perpendicular to the direction of the vibration acceleration. Therefore, it is possible to generate a relatively great bending stress in at least one first bridge supporting portion of the first bridge supporting portions 30E to 30G. This makes it possible to increase the charge generated in the upper electrode layer. As a result, it is possible to efficiently generate a charge in each of the upper electrode layers from the stress generated in the first bridge supporting portions 30E to 30G by the displacement of the first weight body 21 and efficiently perform three-axis power generation.

The modification illustrated in FIGS. 18 to 20 is an exemplary case where the first weight body 21 includes the first weight body protrusions 91A to 91D, 91E to 91G. However, not limited thereto, the first weight body 21 may not include the first weight body protrusions 91A to 91D and 91E to 91G. That is, the shape of the first bridge supporting portion illustrated in FIGS. 18 to 20 may be applied to the power generating element 1 illustrated in FIG. 2 in the first embodiment.

Third Embodiment

Next, a power generating element according to a third embodiment of the present invention will be described with reference to FIGS. 21 and 22.

Figure 21:
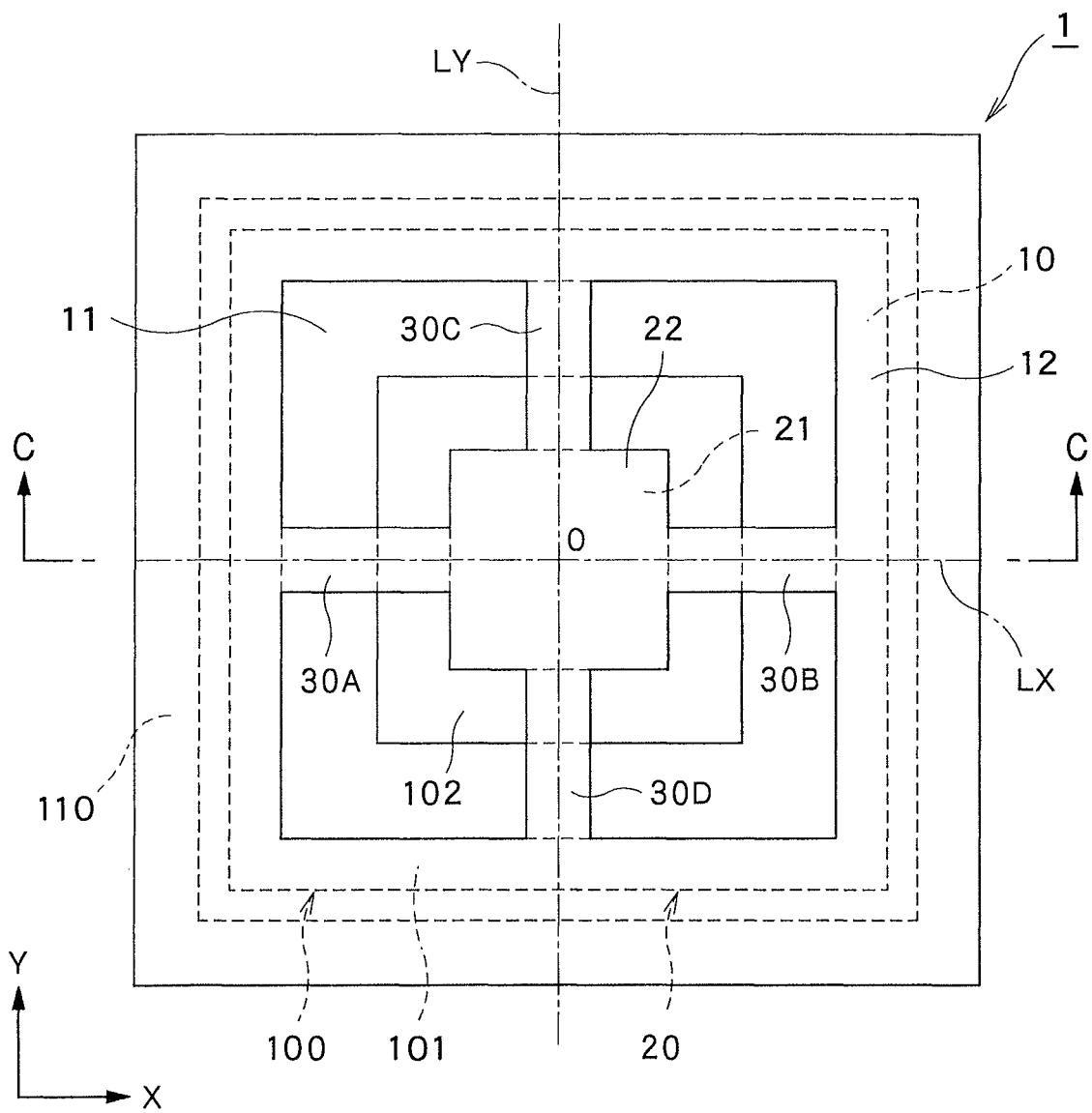
FIG. 21 is a plan view illustrating a power generating element according to a third embodiment of the present invention.
Figure 22:
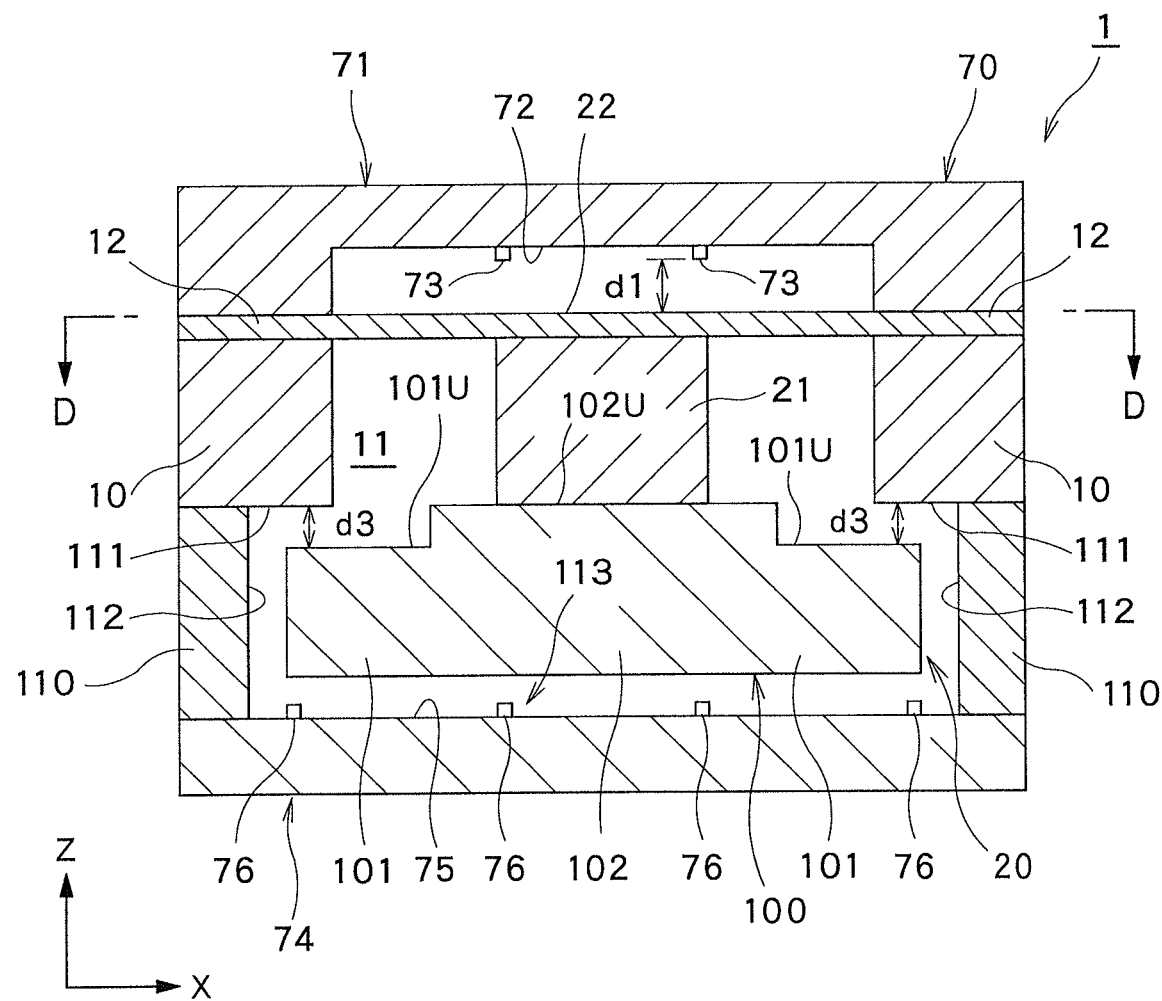
FIG. 22 is a cross-sectional view taken along line C-C of FIG. 21.

In the third embodiment illustrated in FIGS. 21 and 22, a main difference is in that a first additional weight body is provided on the lower surface of the first weight body. The other configurations are substantially the same as those of the first embodiment illustrated in FIGS. 1 to 15. In FIGS. 21 and 22, the same portions as those of the first embodiment illustrated in FIGS. 1 to 15 will be denoted by the same reference numerals, and a detailed description thereof will be omitted.

FIG. 21 is a plan view of a power generating element according to the third embodiment of the present invention. FIG. 22 illustrates a cross section taken along line C-C in FIG. 21. Note that FIG. 21 corresponds to the plan view seen from line D-D in FIG. 22. In FIG. 21, illustration of the upper electrode layer of the piezoelectric element 40 is omitted for clarity of the drawing. In FIG. 21, the four upper electrode layers E11 to E44 may also be provided in each of the first bridge supporting portions 30A to 30D as illustrated in FIG. 2, or the two upper electrode layers E1 and E2 may be provided as illustrated in FIGS. 12 to 14. Furthermore, the number of upper electrode layers may be one.

In the present embodiment, as illustrated in FIGS. 21 and 22, a first additional weight body 100 is provided on a lower surface of the first weight body 21 (opposite side of the first weight body supporting portion 22 side). This configuration allows the first weight body 21 and the first additional weight body 100 to be coupled to the tip ends of the first bridge supporting portions 30A to 30D, increasing the mass of the vibrating body 20 coupled to the first bridge supporting portions 30A to 30D. Moreover, a combined center of gravity of the first weight body 21 and the first additional weight body 100 (position of the center of gravity of the vibrating body 20 formed by the first weight body 21 and the first additional weight body 100) is at a position lower than the center of gravity of the first weight body 21 in a case where the first additional weight body 100 is not provided (refer to FIGS. 1 to 3).

As illustrated in FIG. 22, the first additional weight body 100 includes a first stopper portion 101 that regulates the displacement of the first weight body 21. The first stopper portion 101 can abut a first seat 111 (described below) of the pedestal 10 in a case where the first weight body 21 is displaced upward (first weight body supporting portion 22 side, the positive side on the Z-axis). The first additional weight body 100 is formed so as to outwardly extend more toward the pedestal 10 than the first weight body 21 in plan view, and the first stopper portion 101 is formed at an outer peripheral side portion of the first additional weight body 100. More specifically, the first additional weight body 100 includes a first main body portion 102 joined to the first weight body 21, and the first stopper portion 101 arranged on more toward the outer peripheral side than the first main body portion 102.

An additional pedestal 110 is provided on the lower surface of the pedestal 10. The additional pedestal 110 is formed in a rectangular frame shape in plan view so as to arrange the first additional weight body 100 inside the additional pedestal 110. This arrangement allows the additional pedestal 110 to face the first stopper portion 101 of the first additional weight body 100. The lower surface of the first additional weight body 100 is positioned above the lower surface of the additional pedestal 110.

The lower surface of the pedestal 10 includes a first seat 111 to which the first stopper portion 101 abuts. The first seat 111 is formed on an inner peripheral side portion of the pedestal 10 in plan view. The inner surface of the additional pedestal 110 is retreated more outwardly than the inner surface of the pedestal 10 so as to expose the first seat 111 downward.

The inner surface of the additional pedestal 110 includes a second seat 112 to which the first stopper portion 101 can abut. The first stopper portion 101 abuts the second seat 112 in a case where the first weight body 21 is displaced in the direction along the XY plane (plane including the first extending axis of each of the first bridge supporting portions 30A to 30D).

The above-described bottom plate 74 is coupled to the pedestal 10 via the additional pedestal 110. With this configuration, the first weight body 21 and the first additional weight body 100 can be displaced downward until they abut the bottom plate 74. The bottom plate 74 includes a third seat 113 to which the first stopper portion 101 can abut in a case where the first weight body 21 is displaced downward. The third seat 113 is constituted with the bottom plate facing surface 75 and the plurality of bottom plate-side projections 76 illustrated in FIG. 7. In the present embodiment, the bottom plate facing surface 75 faces the first additional weight body 100. The first additional weight body 100 can abut the bottom plate-side projection 76 in a case where the first weight body 21 is displaced downward.

Additionally, as illustrated in FIG. 22, it is allowable to provide the top plate 71 similar to that of FIG. 7 in the present embodiment. The top plate 71 includes the top plate facing surface 72 that faces the first weight body supporting portion 22 and includes the plurality of top plate-side projections 73. When the first weight body 21 is in a neutral position, the first weight body supporting portion 22 is spaced apart from the top plate-side projection 73 by the predetermined distance d1. As described above, in a case where the first additional weight body 100 includes the first stopper portion 101 that regulates the displacement of the first weight body 21, there is no need to provide the top plate 71 illustrated in FIG. 22.

An upper surface 101U of the first stopper portion 101 is positioned below an upper surface 102U of the first main body portion 102. For example, when manufacturing the first additional weight body 100, it is possible to form the upper surface 101U of the first stopper portion 101 by partially removing the upper surface of the first additional weight body 100 by etching, machining, or the like. In this manner, when the first weight body 21 is in the neutral position, the first stopper portion 101 is spaced apart from the first seat 111 of the pedestal 10 by a predetermined distance d3. With this configuration, the first weight body 21 can be displaced upward until the first stopper portion 101 abuts the first seat 111. This distance d3 may be equal to the distance d1 or may be shorter than the distance d1. With this configuration, the first stopper portion 101 can function as a stopper for upward displacement of the first weight body 21. The lower surface of the first weight body 21 is flush with the lower surface of the pedestal 10.

The first additional weight body 100 may be fabricated separately from the first weight body 21 by a same material (silicon) as the first weight body 21. In this case, the first additional weight body 100 may be joined to the lower surface of the first weight body 21 using a direct joining technique. Alternatively, the first additional weight body 100 may be fabricated with glass or metal. In this case, the first additional weight body 100 may be joined to the lower surface of the first weight body 21 fabricated with silicon using anodic bonding technology. Similarly, the additional pedestal 110 can also be joined to the lower surface of the pedestal 10. The thickness of the first additional weight body 100 is 1 mm to 2 mm, for example.

In this manner, according to the present embodiment, the first additional weight body 100 is provided on the lower surface of the first weight body 21. This configuration makes it possible to achieve a lower combined center of gravity of the first weight body 21 and the first additional weight body 100 compared with the center of gravity of the first weight body 21 in a case where the first additional weight body 100 is not provided. This makes it possible to increase the stress generated in each of the first bridge supporting portions 30A to 30D in a case where the vibration acceleration is applied in each of the X-axis direction and the Y-axis direction. Moreover, it is possible to increase the mass of the weight body (the first weight body 21 and the first additional weight body 100) coupled to the first bridge supporting portions 30A to 30D, achieving an increase in the stress generated in each of the first bridge supporting portions 30A to 30D in a case where the vibration acceleration is applied in each of the X-axis direction, the Y-axis direction, and the Z-axis direction. As a result, it is possible to increase the charge generated from the piezoelectric element 40, leading to enhancement of the power generation efficiency of three-axis power generation.

Moreover, according to the present embodiment, the first additional weight body 100 includes the first stopper portion 101 provided so as to be able to abut the first seat 111 of the pedestal 10. This makes it possible to regulate the upward displacement of the first weight body 21 even in a case where vibration acceleration in any of the X-axis direction, the Y-axis direction, and the Z-axis direction is applied. Therefore, it is possible to further prevent plastic deformation and breakage of the first bridge supporting portions 30A to 30D, leading to enhancement of the reliability of the power generating element 1.

Moreover, according to the present embodiment, the first stopper portion 101 abuts the second seat 112 provided on the additional pedestal 110 in a case where the first weight body 21 is displaced in the direction along the XY plane. This makes it possible to regulate the displacement of the first weight body 21 in the direction along the XY plane even in a case where the vibration acceleration is applied in any of the X-axis direction, the Y-axis direction, and the Z-axis direction. Therefore, it is possible to further prevent plastic deformation and breakage of the first bridge supporting portions 30A to 30D, leading to enhancement of the reliability of the power generating element 1.

Moreover, according to the present embodiment, the first additional weight body 100 abuts the third seat 113 provided on the bottom plate 74 in a case where the first weight body 21 is displaced downward. This makes it possible to regulate the downward displacement of the first weight body 21 even in a case where the vibration acceleration in any of the X-axis direction, the Y-axis direction, and the Z-axis direction is applied. Therefore, it is possible to further prevent plastic deformation and breakage of the first bridge supporting portions 30A to 30D, leading to enhancement of the reliability of the power generating element 1. In particular, according to the present embodiment, since the third seat 113 includes the bottom plate-side projection 76, it is possible to ensure a gap between the first additional weight body 100 and the bottom plate facing surface 75 even in a case where the first additional weight body 100 abuts the bottom plate-side projection 76. This makes it possible to prevent generation of damping action of air between the first additional weight body 100 and the bottom plate facing surface 75, leading to prevention of suppression of the vibration of the first additional weight body 100. This makes it possible to prevent deterioration of the power generation efficiency of the power generating element 1.

Fourth Embodiment

Next, the power generating element according to a fourth embodiment of the present invention will be described with reference to FIGS. 23 to 25.

Figure 23:
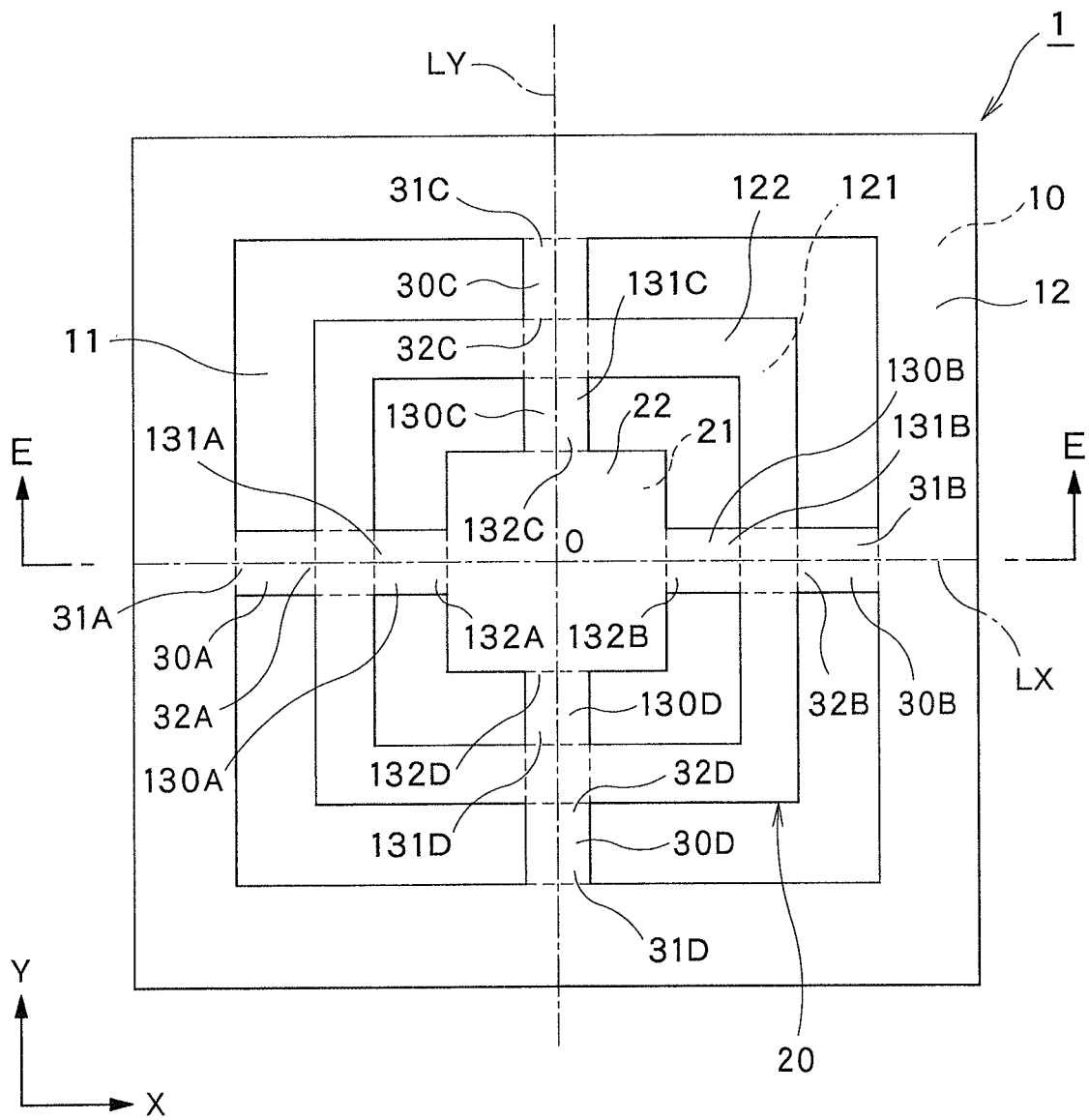
FIG. 23 is a plan view illustrating a power generating element according to a fourth embodiment of the present invention.
Figure 24:
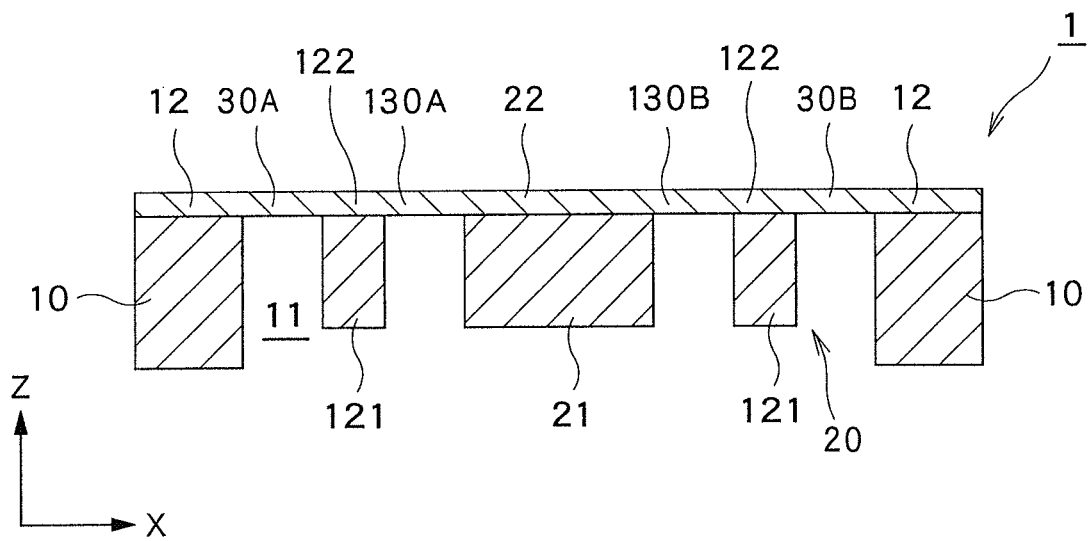
FIG. 24 is a cross-sectional view of the power generating element illustrated in FIG. 23, taken along line E-E.
Figure 25:
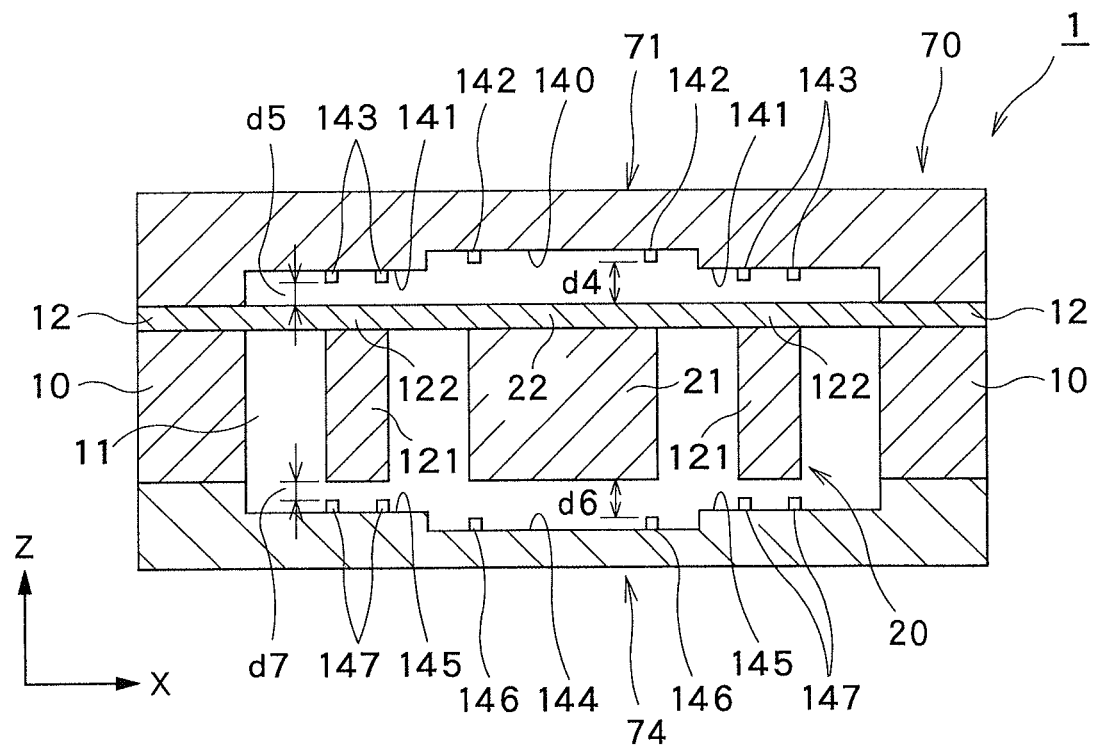
FIG. 25 is a cross-sectional view illustrating the power generating element illustrated in FIG. 24 including a casing.

In the fourth embodiment illustrated in FIGS. 23 to 25, a main difference is in that the vibrating body includes a first weight body, a second weight body, and a second bridge supporting portion coupling the first weight body and the second weight body. The other configurations are substantially the same as those of the first embodiment illustrated in FIGS. 1 to 15. In FIGS. 23 to 25, the same portions as those of the first embodiment illustrated in FIGS. 1 to 15 will be denoted by the same reference numerals, and a detailed description thereof will be omitted.

FIG. 23 is a plan view of a power generating element according to the fourth embodiment of the present invention. FIG. 24 illustrates a cross section taken along line E-E in FIG. 23.

In the present embodiment, as illustrated in FIG. 23, the vibrating body 20 includes the first weight body 21, a second weight body 121, and a second bridge supporting portions 130A to 130D coupling the first weight body 21 and the second weight body 121. Among them, the second weight body 121 is formed in a rectangular frame shape in plan view, and the first weight body 21 is arranged inside the second weight body 121. The first weight body 21 and the second weight body 121 are spaced apart from each other. The first bridge supporting portions 30A to 30D couple the second weight body 121 and the pedestal 10.

The first weight body 21 and the second weight body 121 are coupled with each other by the same number of second bridge supporting portions 130A to 130D as the first bridge supporting portions 30A to 30D. That is, the first weight body 21 and the second weight body 121 are coupled by the four second bridge supporting portions 130A to 130D in the present embodiment. Each of the second bridge supporting portions 130A to 130D includes a second extending axis and extends from the first weight body 21 toward the second weight body 121 (or from the second weight body 121 toward the first weight body 21) along the corresponding second extending axis. In the present embodiment, the second bridge supporting portions 130A to 130D are aligned along the corresponding first bridge supporting portions 30A to 30D, and the second extending axes of the second bridge supporting portions 130A to 130D extend along the corresponding first extending axes of the first bridge supporting portions 30A to 30D. That is, the second extending axis of each of the second bridge supporting portions 130A and 130B is the center axis LX and the second extending axis of each of the second bridge supporting portions 130C and 130D is the center axis LY. In the mode illustrated in FIG. 23, the second bridge supporting portions 130A to 130D may extend in an elongated shape from the first weight body 21 toward the second weight body 121, and the second extending axis extends in the longitudinal direction of the second bridge supporting portions 130A to 130D. Alternatively, however, the second bridge supporting portions 130A to 130D may be formed to be wide. In this case, the second extending axis extends in a direction perpendicular to the second bridge supporting portions 130A to 130D.

In this manner, the second extending axes of the four second bridge supporting portions 130A to 130D are radially arranged with respect to the first weight body 21 in plan view. The angles formed by the second extending axes of a pair of the second bridge supporting portions 130A to 130D adjacent to each other are equal in the circumferential direction with the first weight body 21 defined as a center (circumferential direction about the center O)

More specifically, the second extending axis of the second bridge supporting portion 130A extends along the first extending axis of the first bridge supporting portion 30A, while the second extending axis of the second bridge supporting portion 130B extends along the first extending axis of the first bridge supporting portion 30B. This configuration allows the first bridge supporting portions 30A and 30B and the second bridge supporting portions 130A and 130B to be arranged on the center axis LX extending in the X-axis direction of the first weight body 21 in plan view. The second bridge supporting portion 130A is arranged on the negative side on the X-axis with respect to the first weight body 21, while the second bridge supporting portion 130B is arranged on the positive side on the X-axis with respect to the first weight body 21. Therefore, the second bridge supporting portions 130A and 130B are formed symmetrically to each other with respect to the center axis LY in plan view.

The second extending axis of the second bridge supporting portion 130C extends along the first extending axis of the first bridge supporting portion 30C while the second extending axis of the second bridge supporting portion 130D extends along the first extending axis of the first bridge supporting portion 30D. This configuration allows the first bridge supporting portions 30C and 30D and the second bridge supporting portions 130C and 130D to be arranged on the center axis LY extending in the Y-axis direction of the first weight body 21 in plan view. The second bridge supporting portion 130C is arranged on the positive side on the Y-axis with respect to the first weight body 21, while the second bridge supporting portion 130D is arranged on the negative side on the Y-axis with respect to the first weight body 21. Therefore, the second bridge supporting portions 130C and 130D are formed symmetrically to each other with respect to the center axis LX in plan view.

In this manner, the second bridge supporting portions 130A to 130D according to the present embodiment are formed symmetrically with respect to the center axis LX while being formed symmetrically with respect to the center axis LY in plan view. This allows the four second bridge supporting portions 130A to 130D to be arranged in a cross shape. Accordingly, the power generating element 1 according to the present embodiment has a double-supported beam structure in each of the X-axis direction and the Y-axis direction.

In the present embodiment, the second weight body 121 is coupled with the end 32A of the first bridge supporting portion 30A on the positive side on the X-axis, the end 32B of the first bridge supporting portion 30B on the negative side on the X-axis, the end 32C of the first bridge supporting portion 30C on the negative side on the Y-axis, and the end 32D of the first bridge supporting portion 30D on the positive side on the Y-axis.

As illustrated in FIGS. 23 and 24, the vibrating body 20 according to the present embodiment further includes a second weight body supporting portion 122 provided on an upper surface (surface on the positive side on the Z-axis) of the second weight body 121. The second weight body supporting portion 122 extends from the first bridge supporting portions 30A to 30D and from the second bridge supporting portions 130A to 130D to the upper surface of the second weight body 121 and is formed continuously and integrally with the bridge supporting portions 30A to 30D and 130A to 130D. The second weight body supporting portion 122 is formed on the entire upper surface of the second weight body 121, and the second weight body 121 is joined to the lower surface of the second weight body supporting portion 122 (surface on the negative side on the Z-axis) and supported by the second weight body supporting portion 122. With this configuration, the second weight body 121 is coupled to the end 32A of the first bridge supporting portion 30A on the positive side on the X-axis, the end 32B of the first bridge supporting portion 30B on the negative side on the X-axis, the end 32C of the first bridge supporting portion 30C on the negative side on the Y-axis, and the end 32D of the first bridge supporting portion 30D on the positive side on the Y-axis via the second weight body supporting portion 122. In this manner, the second weight body 121 is supported by each of the first bridge supporting portions 30A to 30D via the second weight body supporting portion 122.

The end 131A of the second bridge supporting portion 130A on the negative side on the X-axis is coupled to the second weight body 121, while the end 132A on the positive side on the X-axis is coupled to the first weight body 21. The end 131B of the second bridge supporting portion 130B on the positive side on the X-axis is coupled to the second weight body 121, while the end 132B on the negative side on the X-axis is coupled to the first weight body 21. The end 131C of the second bridge supporting portion 130C on the positive side on the Y-axis is coupled to the second weight body 121, while the end 132C on the negative side on the Y-axis is coupled to the first weight body 21. The end 131D of the second bridge supporting portion 130D on the negative side on the Y-axis is coupled to the second weight body 121, while the end 132D on the positive side on the Y-axis is coupled to the first weight body 21.

The first weight body supporting portion 22 provided on the upper surface of the first weight body 21 extends from the second bridge supporting portions 130A to 130D to the upper surface of the first weight body 21 and is formed continuously and integrally with the second bridge supporting portions 130A to 130D. The first weight body 21 is coupled to the end 132A of the second bridge supporting portion 130A on the positive side on the X-axis, the end 132B of the second bridge supporting portion 130B on the negative side on the X-axis, the end 132C of the second bridge supporting portion 130C on the negative side on the Y-axis, and the end 132D of the second bridge supporting portion 130D on the positive side on the Y-axis, via the first weight body supporting portion 22. In this manner, the first weight body 21 is supported by each of the first bridge supporting portions 30A to 30D via the first weight body supporting portion 22, the second bridge supporting portions 130A to 130D, and the second weight body supporting portion 122.

As illustrated in FIG. 24, the lower surface of the first weight body 21 and the lower surface of the second weight body 121 are positioned above the lower surface of the pedestal 10. As illustrated in FIG. 25, the first weight body 21 and the second weight body 121 can be displaced to the negative side on the Z-axis (downward) until they abut the bottom plate 74. The lower surface of the first weight body 21 and the lower surface of the second weight body 121 are flush with each other.

In FIG. 23, illustration of the upper electrode layer of the piezoelectric element 40 is omitted. In FIG. 23, the four upper electrode layers E11 to E44 may also be provided in each of the first bridge supporting portions 30A to 30D as illustrated in FIG. 2, or the two upper electrode layers E1 and E2 may be provided as illustrated in FIGS. 12 to 14. Furthermore, the number of upper electrode layers may be one.

Although not illustrated, each of the second bridge supporting portions 130A to 130D may include four upper electrode layers similarly to the upper electrode layer provided on the first bridge supporting portions 30A to 30D, or may include two upper electrode layers E1 and E2 as illustrated in FIGS. 12 to 14. Furthermore, the number of upper electrode layers may be one. It is preferable that the upper electrode layers provided in the second bridge supporting portions 130A to 130D are arranged in a region where a stress is generated when the first weight body 21 and the second weight body 121 are displaced (region where the second bridge supporting portions 130A to 130D themselves are deformed) in the second bridge supporting portions 130A to 130D. The upper electrode layers on the second bridge supporting portions 130A to 130D are also electrically independent from each other.

The power generating circuit 60 according to the present embodiment can be configured similarly to the power generating circuit 60 illustrated in FIG. 6, and thus, the detailed description thereof will be omitted.

FIG. 25 is a cross-sectional view of the power generating element 1 including the casing 70 in FIG. 23. The top plate 71 includes a first top plate facing surface 140 in flat shape facing the first weight body supporting portion 22 and includes a second top plate facing surface 141 in flat shape facing the second weight body supporting portion 122. The first top plate facing surface 140 is positioned above the second top plate facing surface 141. The first top plate facing surface 140 includes a plurality of first top plate-side projections 142. In a case where the first weight body 21 is displaced upward, the first weight body 21 can abut the first top plate-side projections 142 via the first weight body supporting portion 22. The second top plate facing surface 141 includes a plurality of second top plate-side projections 143. In a case where the second weight body 121 is displaced upward, the second weight body 121 can abut the second top plate-side projections 143 via the second weight body supporting portion 122.

When the vibrating body 20 is in a neutral position, the first weight body supporting portion 22 is spaced apart from the first top plate-side projection 142 by a predetermined distance d4, and the first weight body 21 can be displaced upward until it abuts the top plate 71. Moreover, the second weight body supporting portion 122 is spaced apart from the second top plate-side projection 143 by a predetermined distance d5, and the second weight body 121 can be displaced upward until it abuts the top plate 71. When the vibrating body 20 is in the neutral position, the distance d4 between the first weight body supporting portion 22 and the first top plate-side projection 142 is longer than the distance d5 between the second weight body supporting portion 122 and the second top plate-side projection 143. In the mode illustrated in FIG. 25, the height of the first top plate-side projection 142 is equal to the height of the second top plate-side projection 143, while the distance between the first top plate facing surface 140 and the first weight body supporting portion 22 is longer than the distance between the second top plate facing surface 141 and the second weight body supporting portion 122.

The bottom plate 74 includes a first bottom plate facing surface 144 in flat shape facing the first weight body 21 and includes a second bottom plate facing surface 145 in flat shape facing the second weight body 121. The first bottom plate facing surface 144 is positioned below the second bottom plate facing surface 145. The first bottom plate facing surface 144 includes a plurality of first bottom plate-side projections 146. The first weight body 21 can abut the first bottom plate-side projection 146 in a case where the first weight body 21 is displaced downward. The second bottom plate facing surface 145 includes a plurality of second bottom plate-side projections 147. The second weight body 121 can abut the second bottom plate-side projection 147 in a case where the second weight body 121 is displaced downward.

When the vibrating body 20 is in the neutral position, the first weight body 21 is spaced apart from the first bottom plate-side projection 146 by a predetermined distance d6, and the first weight body 21 can be displaced downward until it abuts the first bottom plate-side projection 146. Moreover, the second weight body 121 is spaced apart from the second bottom plate-side projection 147 by a predetermined distance d7, and the second weight body 121 can be displaced downward until it abuts the second bottom plate-side projection 147. When the vibrating body 20 is in the neutral position, the distance d6 between the first weight body 21 and the first bottom plate-side projection 146 is longer than the distance d7 between the second weight body 121 and the second bottom plate-side projection 147. In the mode illustrated in FIG. 25, the height of the first bottom plate-side projection 146 is equal to the height of the second bottom plate-side projection 147, while the distance between the first bottom plate facing surface 144 and the first weight body 21 is longer than the distance between the second bottom plate facing surface 145 and the second weight body 121.

Meanwhile, a power generating element that generates electric power by converting vibration energy into electric energy has a unique resonance frequency determined according to its structure. In a case where the frequency of external vibration is this resonance frequency or a value close to the resonance frequency, it is possible to achieve efficient vibration of the weight body. In a case, however, where the frequency of the external vibration is a value distant from the resonance frequency, there is a problem that it is difficult to achieve sufficient vibration of the vibrating body 20.

In contrast, since the vibrating body 20 of the power generating element 1 according to the present embodiment includes the first weight body 21 and the second weight body 121, the power generating element 1 constitutes a combined vibration system including a resonance system I and a resonance system II. Among them, the resonance system I is a resonance system mainly defined on the basis of the first weight body 21 and the second bridge supporting portions 130A to 130D, and has a unique resonance frequency I. The resonance system II is a resonance system mainly defined on the basis of the second weight body 121 and the first bridge supporting portions 30A to 30D and has a unique resonance frequency II different from the resonance frequency I. In the case of setting the resonance frequency I to differ from the resonance frequency II, for example, the mass of the first weight body 21 and the mass of the second weight body 121 may be set to different masses, or a spring constant (more specifically, the width, the thickness, the elastic modulus) of each of the first bridge supporting portions 30A to 30D and a spring constant of the second bridge supporting portions 130A to 130D may be set to differ from each other. Alternatively, both the mass and the spring constant may be set different.

By constructing the combined vibration system including the resonance system I and the resonance system II as described above, it is possible to expand a power-generatable frequency band of vibration. In this case, by adjusting the inherent resonance frequency of each of the resonance systems, it is possible to expand or narrow the power-generatable frequency band.

In this manner, according to the present embodiment, the vibrating body 20 includes the first weight body 21, the second weight body 121, and the second bridge supporting portions 130A to 130D coupling the first weight body 21 and the second weight body 121. With this configuration, it is possible to achieve the power generating element 1 of a combined vibration system including the resonance system I defined on the basis of the first weight body 21 and the second bridge supporting portions 130A to 130D, and the resonance system II defined on the basis of the second weight body 121 and the first bridge supporting portions 30A to 30D. This makes it possible to expand the power-generatable frequency band of vibration to perform efficient power generation in various usage environments. In particular, according to the present embodiment, the resonance system I defined on the basis of the first weight body 21 and the second bridge supporting portions 130A to 130D has a resonance frequency different from the resonance frequency of the resonance system II defined on the basis of the second weight body 121 and the first bridge supporting portions 30A to 30D. This makes it possible to further expand the power-generatable frequency band of vibration.

Moreover, according to the present embodiment, the first top plate facing surface 140 of the top plate 71 includes the plurality of first top plate-side projections 142 to which the first weight body 21 can abut in a case where it is displaced upward. This makes it possible ensure a gap between the first weight body supporting portion 22 and the first top plate facing surface 140 even when the first weight body supporting portion 22 abuts the first top plate-side projection 142. This makes it possible to prevent generation of damping action of air between the first weight body supporting portion 22 and the first top plate facing surface 140, leading to prevention of suppression of the vibration of the first weight body 21. Moreover, the second top plate facing surface 141 of the top plate 71 includes the plurality of second top plate-side projections 143 to which the second weight body 121 can abut in a case where it is displaced upward. This makes it possible to ensure a gap between the second weight body supporting portion 122 and the second top plate facing surface 141 even when the second weight body supporting portion 122 abuts the second top plate-side projection 143. This makes it possible to prevent generation of damping action of air between the second weight body supporting portion 122 and the second top plate facing surface 141, leading to prevention of suppression of the vibration of the second weight body 121. As a result, it is possible to prevent deterioration of the power generation efficiency of the power generating element 1.

Moreover, according to the present embodiment, when the vibrating body 20 is in the neutral position, the distance d4 between the first weight body supporting portion 22 and the first top plate-side projection 142 is longer than the distance d5 between the second weight body supporting portion 122 and the second top plate-side projection 143. This makes it possible to prevent restriction of the displacement of the first weight body 21, which can be greater than the displacement of the second weight body 121 and avoid abutment of the first weight body 21 to the top plate 71 in a wider acceleration range. This makes it possible to suppress an escape of the force received by the first weight body 21 to the top plate 71, achieving an increase in the stress generated in the first bridge supporting portions 30A to 30D and in the second bridge supporting portions 130A to 130D. As a result, the vibration energy applied to the first weight body 21 can be efficiently converted into electric energy, achieving an increase in the charge generated from the piezoelectric element 40.

Moreover, according to the present embodiment, the first bottom plate facing surface 144 of the bottom plate 74 includes the plurality of first bottom plate-side projections 146 to which the first weight body 21 can abut in a case where it is displaced downward. This makes it possible to ensure a gap between the first weight body 21 and the first bottom plate facing surface 144 even when the first weight body 21 abuts the first bottom plate-side projection 146. This makes it possible to prevent generation of damping action of air between the first weight body 21 and the first bottom plate facing surface 144, leading to prevention of suppression of the vibration of the first weight body 21. Moreover, the second bottom plate facing surface 145 of the bottom plate 74 includes the plurality of second bottom plate-side projections 147 to which the second weight body 121 can abut in a case where it is displaced downward. This makes it possible to ensure a gap between the second weight body 121 and the second bottom plate facing surface 145 even when the second weight body 121 abuts the second bottom plate-side projection 147. This makes it possible to prevent generation of damping action of air between the second weight body 121 and the second bottom plate facing surface 145, leading to prevention of suppression of the vibration of the second weight body 121. As a result, it is possible to prevent deterioration of the power generation efficiency of the power generating element 1.

Moreover, according to the present embodiment, when the vibrating body 20 is in the neutral position, the distance d6 between the first weight body 21 and the first bottom plate-side projection 146 is longer than the distance d7 between the second weight body 121 and the second bottom plate-side projection 147. This makes it possible to prevent restriction of the displacement of the first weight body 21, which can be greater than the displacement of the second weight body 121 and avoid abutment of the first weight body 21 to the bottom plate 74 in a wider acceleration range. This makes it possible to suppress an escape of the force received by the first weight body 21 to the bottom plate 74, achieving an increase in the stress generated in the first bridge supporting portions 30A to 30D. As a result, the vibration energy applied to the first weight body 21 can be efficiently converted into electric energy, achieving an increase in the charge generated from the piezoelectric element 40.

The above-described embodiment is a case where the first top plate-side projection 142 is provided on the first top plate facing surface 140 and where the second top plate-side projection 143 is provided on the second top plate facing surface 141. However, not limited thereto, it is allowable to omit one of the first top plate-side projection 142 and the second top plate-side projection 143.

Moreover, the above-described embodiment is a case where the first bottom plate-side projection 146 is provided on the first bottom plate facing surface 144 and the second bottom plate-side projection 147 is provided on the second bottom plate facing surface 145. However, not limited thereto, it is allowable to omit one of the first bottom plate-side projection 146 and the second bottom plate-side projection 147.

Fifth Embodiment

Next, the power generating element according to a fifth embodiment of the present invention will be described with reference to FIG. 26.

Figure 26:
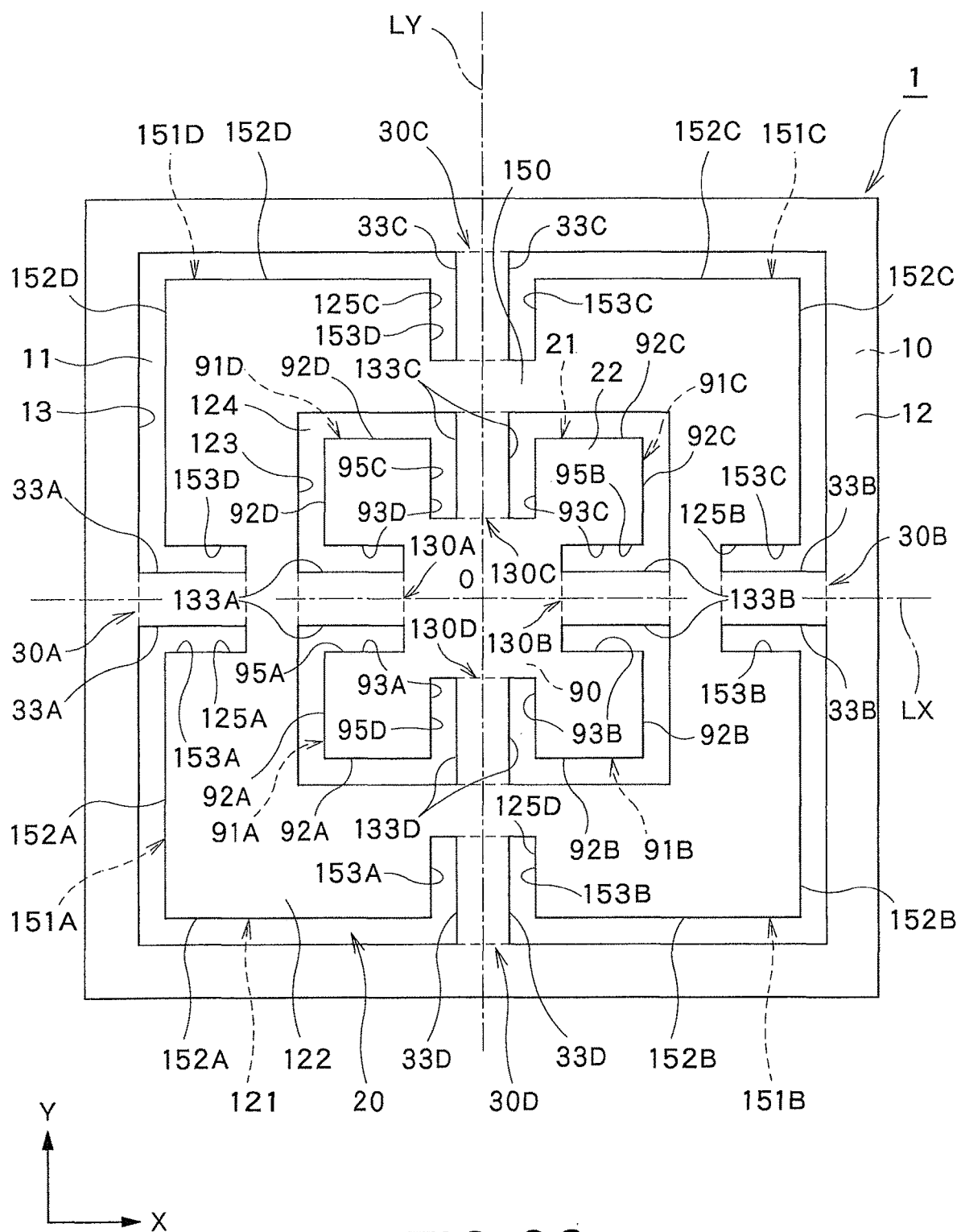
FIG. 26 is a plan view illustrating a power generating element according to a fifth embodiment of the present invention.

In the fifth embodiment illustrated in FIG. 26, main differences are in that the first weight body of the vibrating body includes the first weight body central portion and the first weight body protrusion coupled to the first weight body central portion, and that the second weight body includes a second weight body frame portion and a second weight body protrusion coupled to the second weight body frame portion. The other configurations are substantially the same as those of the fourth embodiment illustrated in FIGS. 23 to 25. In FIG. 26, the same portions as those of the fourth embodiment illustrated in FIGS. 23 to 25 will be denoted by the same reference numerals, and a detailed description thereof will be omitted.

FIG. 26 is a plan view of a power generating element according to the fifth embodiment of the present invention. While FIG. 26 omits illustration of the piezoelectric element 40 in order to simplify the drawing, it is allowable to configure the piezoelectric element 40 similarly to the fourth embodiment.

In the present embodiment, as illustrated in FIG. 26, the first weight body 21 includes the first weight body central portion 90 and the plurality of first weight body protrusions 91A to 91D coupled to the first weight body central portion 90, similarly to the second embodiment illustrated in FIG. 16. Among these, the first weight body protrusions 91A to 91D protrude from the first weight body central portion 90 toward the second weight body 121. In the present embodiment, the first weight body central portion 90 is formed in a rectangular shape (or a square shape) in plan view, and the first weight body protrusions 91A to 91D are formed so as to bulge from corner portions of the first weight body central portion 90. The first weight body protrusions 91A to 91D are also formed in rectangular shapes (or square shapes) in plan view. As a result, the planar shape of the first weight body 21 is a clover shape as a whole. The first weight body central portion 90 is continuously and integrally formed with the first weight body protrusions 91A to 91D. The first weight body supporting portion 22 is integrally formed and joined to the entire upper surface of the first weight body central portion 90 and the entire upper surface of each of the first weight body protrusions 91A to 91D.

The first weight body protrusions 91A to 91D are arranged between the second bridge supporting portions 130A to 130D adjacent to each other in the circumferential direction (circumferential direction with respect to the center O) with the first weight body central portion 90 defined as a center in plan view. In other words, there are provided draw-in recesses 95A to 95D that draw in the ends 132A to 132D (refer to FIG. 23) of the second bridge supporting portions 130A to 130D on the first weight body central portion 90 side, at a portion between the first weight body protrusions 91A to 91D adjacent to each other in the circumferential direction. The draw-in recesses 95A to 95D are formed so as to be recessed from an outer edge of the first weight body 21 toward the inner side. The draw-in recesses 95A to 95D are formed so as to extend along the second extending axis of the corresponding second bridge supporting portions 130A to 130D. In the example illustrated in FIG. 26, the draw-in recesses 95A to 95D draw in a large area including the ends 132A to 132D, of the corresponding second bridge supporting portions 130A to 130D. As a result, the second bridge supporting portions 130A to 130D are arranged between the first weight body protrusions 91A to 91D adjacent to each other in the circumferential direction.

The outer edges 92A to 92D of the first weight body protrusions 91A to 91D on the second weight body 121 side are formed along (or parallel to) an inner edge 123 (inner edge 123 defining a second weight body opening 124) of the second weight body 121. The outer edges 93A to 93D of the first weight body protrusions 91A to 91D on the opposing second bridge supporting portions 130A to 130D sides are formed along (or parallel to) side edges 133A to 133D of the second bridge supporting portions 130A to 130D.

More specifically, one first weight body protrusion 91A is arranged between the second bridge supporting portion 130A and the second bridge supporting portion 130D. The first weight body protrusion 91A is surrounded by the two second bridge supporting portions 130A and 130D and the second weight body 121. The outer edge 92A of the first weight body protrusion 91A on the second weight body 121 side is formed along the inner edge 123 of the second weight body 121. The outer edge 93A of the first weight body protrusion 91A on the opposing second bridge supporting portion 130A side is formed along the side edge 133A of the second bridge supporting portion 130A while the outer edge 93A on the opposing second bridge supporting portion 130D side is formed along the side edge 133D of the second bridge supporting portion 130D.

One first weight body protrusion 91B is arranged between the second bridge supporting portion 130D and the second bridge supporting portion 130B. The first weight body protrusion 91B is surrounded by the two second bridge supporting portions 130B and 130D and the second weight body 121. The outer edge 92B of the first weight body protrusion 91B on the second weight body 121 side is formed along the inner edge 123 of the second weight body 121. The outer edge 93B of the first weight body protrusion 91B on the opposing second bridge supporting portion 130D side is formed along the side edge 133D of the second bridge supporting portion 130D while the outer edge 93B on the opposing second bridge supporting portion 130B side is formed along the side edge 133B of the second bridge supporting portion 130B.

One first weight body protrusion 91C is arranged between the second bridge supporting portion 130B and the second bridge supporting portion 130C. The first weight body protrusion 91C is surrounded by the two second bridge supporting portions 130B and 130C and the second weight body 121. The outer edge 92C of the first weight body protrusion 91C on the second weight body 121 side is formed along the inner edge 123 of the second weight body 121. The outer edge 93C of the first weight body protrusion 91C on the opposing second bridge supporting portion 130B side is formed along the side edge 133B of the second bridge supporting portion 130B while the outer edge 93C on the opposing second bridge supporting portion 130C side is formed along the side edge 133C of the second bridge supporting portion 130C.

One first weight body protrusion 91D is arranged between the second bridge supporting portion 130C and the second bridge supporting portion 130A. The first weight body protrusion 91D is surrounded by the two second bridge supporting portions 130A and 130C and the second weight body 121. The outer edge 92D of the first weight body protrusion 91D on the second weight body 121 side is formed along the inner edge 123 of the second weight body 121. The outer edge 93D of the first weight body protrusion 91D on the opposing second bridge supporting portion 130C side is formed along the side edge 133C of the second bridge supporting portion 130C while the outer edge 93D on the opposing second bridge supporting portion 130A side is formed along the side edge 133A of the second bridge supporting portion 130A.

Although not illustrated, the lower surface of the first weight body central portion 90 is positioned above the lower surface of the pedestal 10. The lower surfaces of the first weight body protrusions 91A to 91D are flush with the lower surface of the first weight body central portion 90. In this manner, the first weight body 21 can be displaced downward until it abuts the above-described bottom plate 74.

Moreover, as illustrated in FIG. 26, the second weight body 121 includes a second weight body frame portion 150, a plurality of second weight body protrusions 151A to 151D coupled to the second weight body frame portion 150. The second weight body protrusions 151A to 151D protrude from the second weight body frame portion 150 toward the pedestal 10. The second weight body frame portion 150 is formed in a rectangular frame shape in plan view, and the second weight body protrusions 151A to 151D are formed so as to bulge from the corner portions of the second weight body frame portion 150. The second weight body protrusions 151A to 151D are also formed in rectangular shapes (or so as to form a portion of a square shape) in plan view. As a result, the planar shape of the second weight body 121 as a whole is a clover shape including the second weight body opening 124 arranging inside thereof the first weight body 21. The second weight body opening 124 is formed in a rectangular shape in plan view. The second weight body frame portion 150 and the second weight body protrusions 151A to 151D are continuously and integrally formed. The second weight body supporting portion 122 is integrally formed and joined to the entire upper surface of the second weight body frame portion 150 and the entire upper surface of each of the second weight body protrusions 151A to 151D.

The second weight body protrusions 151A to 151D are arranged between the first bridge supporting portions 30A to 30D adjacent to each other in the circumferential direction with the first weight body central portion 90 defined as a center in plan view. In other words, there are provided draw-in recesses 125A to 125D that draw in the ends 32A to 32D (refer to FIG. 23) of the first bridge supporting portions 30A to 30D on the first weight body central portion 90 side, at a portion between the second weight body protrusions 151A to 151D adjacent to each other in the circumferential direction. The draw-in recesses 125A to 125D are formed so as to be recessed from an outer edge of the second weight body 121 toward the inner peripheral side. The draw-in recesses 125A to 125D are formed so as to extend along the first extending axis of the corresponding first bridge supporting portions 30A to 30D. In the example illustrated in FIG. 26, the draw-in recesses 125A to 125D draw in a large area including the ends 32A to 32D, of the corresponding first bridge supporting portions 30A to 30D. As a result, the first bridge supporting portions 30A to 30D are arranged between the second weight body protrusions 151A to 151D adjacent to each other in the circumferential direction.

Outer edges 152A to 152D of the second weight body protrusions 151A to 151D on the pedestal 10 side are formed along (or parallel to) the inner edge 13 of the pedestal 10. Outer edges 153A to 153D of the second weight body protrusions 151A to 151D on the opposing first bridge supporting portions 30A to 30D sides are formed along (or parallel to) the side edges 33A to 33D of the first bridge supporting portions 30A to 30D.

More specifically, one second weight body protrusion 151A is arranged between the first bridge supporting portion 30A and the first bridge supporting portion 30D. The second weight body protrusion 151A is surrounded by the two first bridge supporting portions 30A and 30D and the pedestal 10. The outer edge 152A of the second weight body protrusion 151A on the pedestal 10 side is formed along the inner edge 13 of the pedestal 10. The outer edge 153A of the second weight body protrusion 151A on the opposing first bridge supporting portion 30A side is formed along the side edge 33A of the first bridge supporting portion 30A while the outer edge 153A on the opposing first bridge supporting portion 30D side is formed along the side edge 33D of the first first bridge supporting portion 30D.

One second weight body protrusion 151B is arranged between the first bridge supporting portion 30D and the first bridge supporting portion 30B. The second weight body protrusion 151B is surrounded by the two first bridge supporting portions 30B and 30D and the pedestal 10. The outer edge 152B of the second weight body protrusion 151B on the pedestal 10 side is formed along the inner edge 13 of the pedestal 10. The outer edge 153B of the second weight body protrusion 151B on the opposing first bridge supporting portion 30D side is formed along the side edge 33D of the first bridge supporting portion 30D while the outer edge 153B on the opposing first bridge supporting portion 30B side is formed along the side edge 33B of the first bridge supporting portion 30B.

One second weight body protrusion 151C is arranged between the first bridge supporting portion 30B and the first bridge supporting portion 30C. The second weight body protrusion 151C is surrounded by the two first bridge supporting portions 30B and 30C and the pedestal 10. The outer edge 152C of the second weight body protrusion 151C on the pedestal 10 side is formed along the inner edge 13 of the pedestal 10. The outer edge 153C of the second weight body protrusion 151C on the opposing first bridge supporting portion 30B side is formed along the side edge 33B of the first bridge supporting portion 30B while the outer edge 153C on the opposing first bridge supporting portion 30C side is formed along the side edge 33C of the first bridge supporting portion 30C.

One second weight body protrusion 151D is arranged between the first bridge supporting portion 30C and the first bridge supporting portion 30A. The second weight body protrusion 151D is surrounded by the two first bridge supporting portions 30A and 30C and the pedestal 10. The outer edge 152D of the second weight body protrusion 151D on the pedestal 10 side is formed along the inner edge 13 of the pedestal 10. The outer edge 153D of the second weight body protrusion 151D on the opposing first bridge supporting portion 30C side is formed along the side edge 33C of the first bridge supporting portion 30C while the outer edge 153D on the opposing first bridge supporting portion 30A side is formed along the side edge 33A of the first bridge supporting portion 30A.

Although not illustrated, the lower surface of the second weight body frame portion 150 is positioned above the lower surface of the pedestal 10. The lower surfaces of the second weight body protrusions 151A to 151D are flush with the lower surface of the second weight body frame portion 150. In this manner, the second weight body 121 can be displaced downward until it abuts the above-described bottom plate 74. The lower surface of the first weight body 21 and the lower surface of the second weight body 121 may also be flush with each other.

In this manner, according to the present embodiment, the first weight body 21 includes the first weight body central portion 90 and the plurality of first weight body protrusions 91A to 91D coupled to the first weight body central portion 90. This makes it possible to increase the planar area of the first weight body 21 to increase the mass of the first weight body 21, achieving an increase in the stress generated in the first bridge supporting portions 30A to 30D and the second bridge supporting portions 130A to 130D in a case where the vibration acceleration is applied. This makes it possible to increase the charge generated from the upper electrode of the piezoelectric element 40, leading to enhancement of the power generation efficiency of three-axis power generation.

Moreover, according to the present embodiment, the first weight body protrusions 91A to 91D are arranged between the second bridge supporting portions 130A to 130D adjacent to each other in the circumferential direction with the first weight body central portion 90 defined as a center in plan view. This makes it possible to position the ends 132A to 132D of the second bridge supporting portions 130A to 130D on the first weight body central portion 90 side so as to be away from the ends 131A to 131D on the pedestal 10 side while increasing the planar area of the first weight body 21. This makes it possible to increase the lengths of the second bridge supporting portions 130A to 130D while increasing the mass of the first weight body 21, leading to achievement of a lower resonance frequency.

Moreover, according to the present embodiment, the outer edges 92A to 92D of the first weight body protrusions 91A to 91D on the second weight body 121 side are formed along the inner edge 123 of the second weight body 121, while the outer edges 93A to 93D of the first weight body protrusions 91A to 91D on the opposing second bridge supporting portions 130A to 130D sides are formed along the side edges 133A to 133D of the second bridge supporting portions 130A to 130D. This makes it possible to increase the occupancy of the first weight body protrusions 91A to 91D in a space between the second bridge supporting portions 130A to 130D adjacent to each other in the circumferential direction with the first weight body central portion 90 defined as a center. This makes it possible to effectively increase the mass of the first weight body protrusions 91A to 91D, leading to a further increase in the mass of the first weight body 21.

Moreover, according to the present embodiment, the second weight body 121 includes the second weight body frame portion 150 and the plurality of second weight body protrusions 151A to 151D coupled to the second weight body frame portion 150. This makes it possible to increase the planar area of the second weight body 121 to increase the mass of the second weight body 121, achieving an increase in the stress generated in the first bridge supporting portions 30A to 30D in a case where the vibration acceleration is applied. This makes it possible to increase the charge generated from the upper electrode layers E11 to E44 of the piezoelectric element 40, leading to enhancement of the power generation efficiency of three-axis power generation.

Moreover, according to the present embodiment, the second weight body protrusions 151A to 151D are arranged between the first bridge supporting portions 30A to 30D adjacent to each other in the circumferential direction with the first weight body central portion 90 defined as a center in plan view. This makes it possible to position the ends 32A to 32D of the first bridge supporting portions 30A to 30D on the first weight body central portion 90 side so as to be away from the ends 31A to 31D on the pedestal 10 side while increasing the planar area of the second weight body 121. This makes it possible to increase the lengths of the first bridge supporting portions 30A to 30D while increasing the mass of the second weight body 121, leading to achievement of a lower resonance frequency.

Moreover, according to the present embodiment, the outer edges 152A to 152D of the second weight body protrusions 151A to 151D on the pedestal 10 side are formed along the inner edge 13 of the pedestal 10, while the outer edges 153A to 153D of the second weight body protrusions 151A to 151D on the opposing first bridge supporting portions 30A to 30D sides are formed along the side edges 33A to 33D of the first bridge supporting portions 30A to 30D. This makes it possible to increase the occupancy of the second weight body protrusions 151A to 151D in a space between the first bridge supporting portions 30A to 30D adjacent to each other in the circumferential direction with the first weight body central portion 90 defined as a center. This makes it possible to effectively increase the mass of the second weight body protrusions 151A to 151D, leading to a further increase in the mass of the second weight body 121.

Sixth Embodiment

Next, the power generating element according to a sixth embodiment of the present invention will be described with reference to FIGS. 27 and 28.

Figure 27:
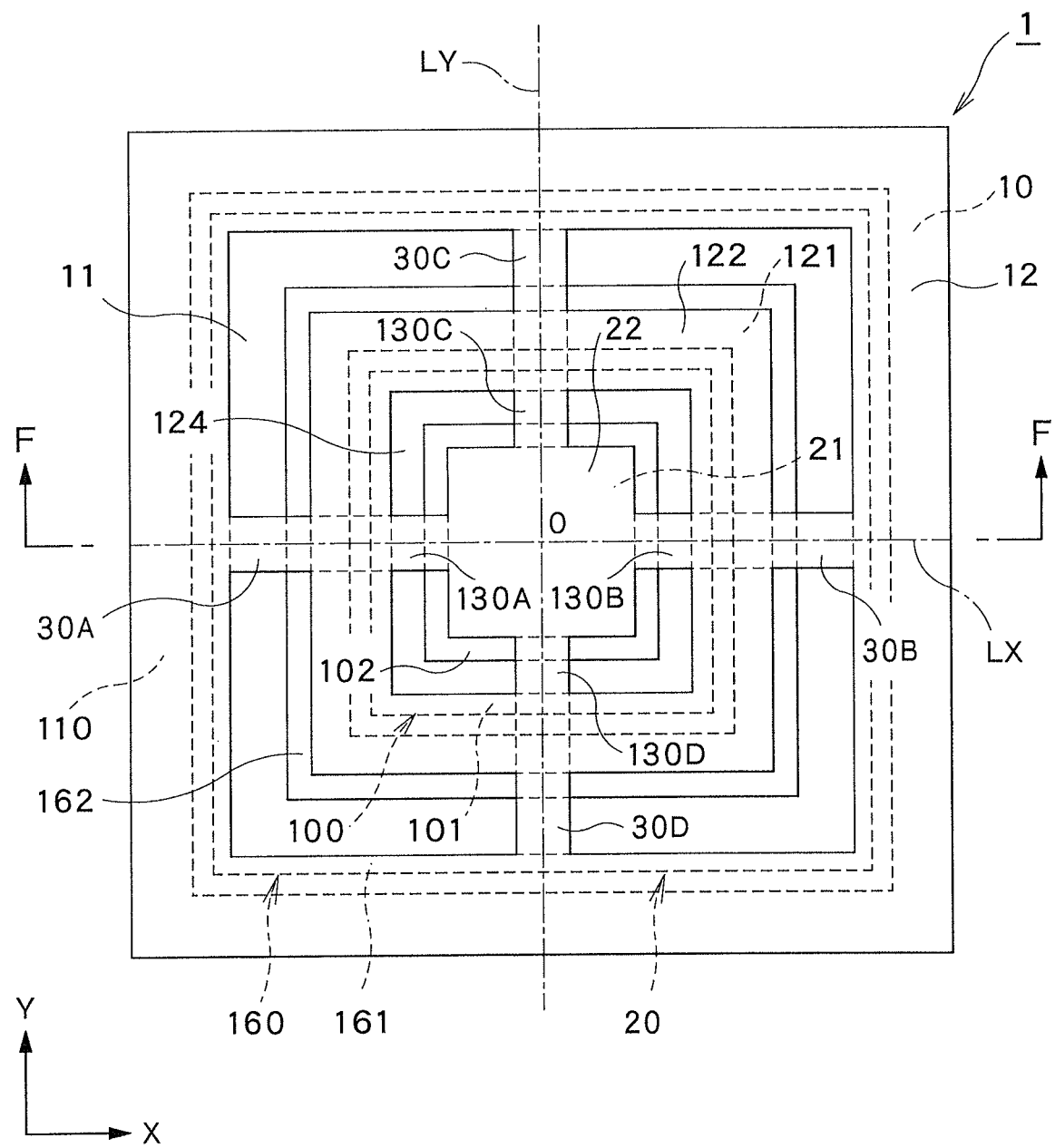
FIG. 27 is a plan view illustrating a power generating element according to a sixth embodiment of the present invention.
Figure 28:
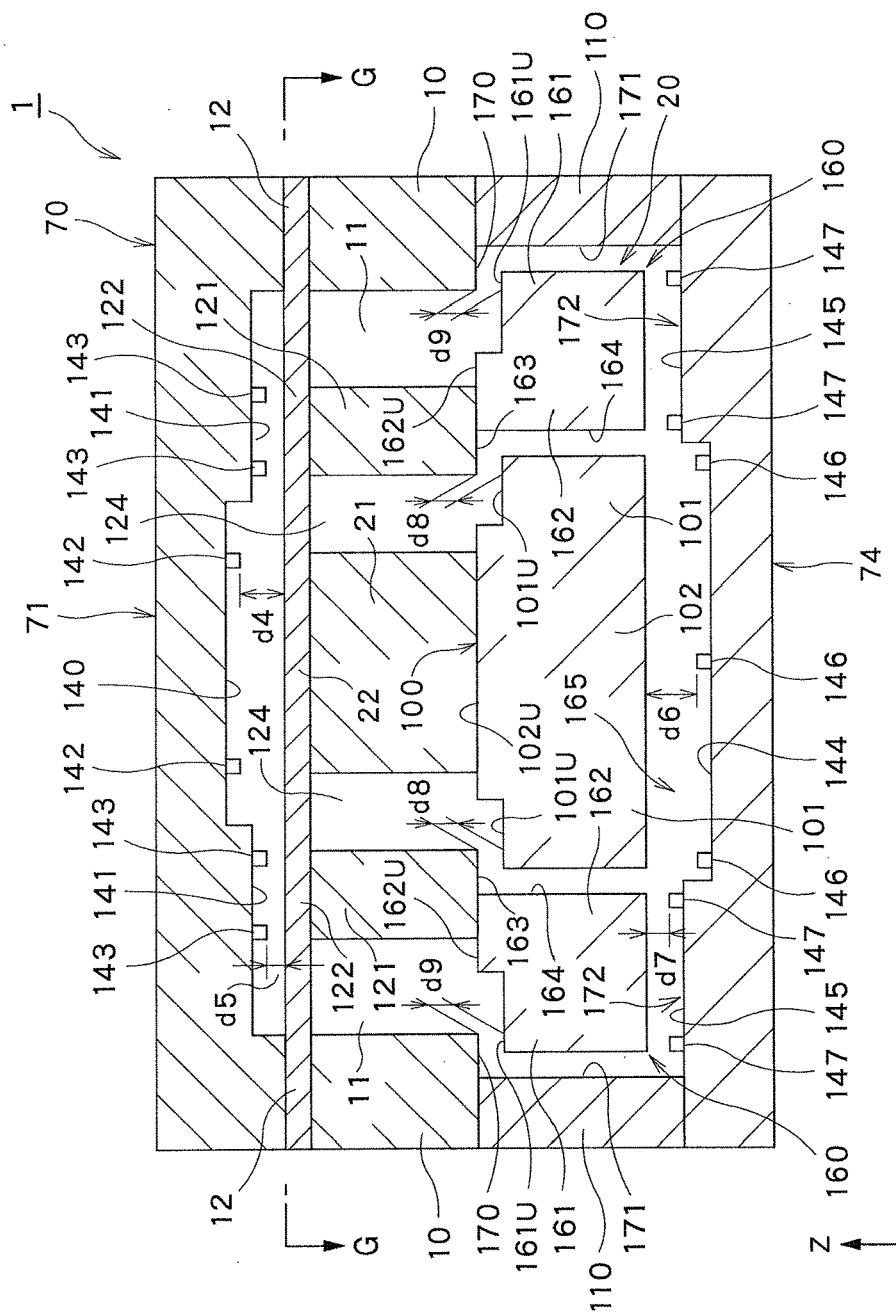
FIG. 28 is a cross-sectional view of the power generating element illustrated in FIG. 27, taken along line F-F.

In the sixth embodiment illustrated in FIGS. 27 and 28, main differences are in that the first weight body of the vibrating body includes the first additional weight body and the second weight body includes a second additional weight body. The other configurations are substantially the same as those of the fourth embodiment illustrated in FIGS. 23 to 25. In FIGS. 27 and 28, the same portions as those of the fourth embodiment illustrated in FIGS. 23 to 25 will be denoted by the same reference numerals, and a detailed description thereof will be omitted.

FIG. 27 is a plan view of a power generating element according to the sixth embodiment of the present invention. FIG. 28 illustrates a cross section taken along line F-F in FIG. 27. Note that FIG. 27 corresponds to the plan view seen from line G-G in FIG. 28. While FIG. 27 omits illustration of the piezoelectric element 40 in order to simplify the drawing, it is allowable to configure the piezoelectric element 40 similarly to the fourth embodiment. The similar applies to FIG. 29 described below.

In the present embodiment, as illustrated in FIGS. 27 and 28, the first additional weight body 100 is provided on a lower surface of the first weight body 21 (opposite side of the first weight body supporting portion 22 side). This configuration allows the first weight body 21 and the first additional weight body 100 to be coupled to the tip ends of the second bridge supporting portions 130A to 130D, increasing the mass of the weight body coupled to the second bridge supporting portions 130A to 130D. Moreover, a combined center of gravity of the first weight body 21 and the first additional weight body 100 (position of the center of gravity of the weight body formed by the first weight body 21 and the first additional weight body 100) is at a position lower than the center of gravity of the first weight body 21 in a case where the first additional weight body 100 is not provided (refer to FIGS. 23 to 25).

As illustrated in FIG. 28, the first additional weight body 100 includes the first stopper portion 101 that regulates the displacement of the first weight body 21. The first stopper portion 101 can abut a first seat for first weight body 163 (described below) of the second weight body 121 in a case where the first weight body 21 is displaced upward (on the first weight body supporting portion 22 side, the positive side on the Z-axis). The first additional weight body 100 is formed so as to outwardly extend more toward the pedestal 10 than the first weight body 21 in plan view, and the first stopper portion 101 is formed at an outer peripheral side portion of the first additional weight body 100. More specifically, the first additional weight body 100 includes a first main body portion 102 joined to the first weight body 21, and the first stopper portion 101 arranged on more toward the outer peripheral side than the first main body portion 102.

As illustrated in FIG. 28, a second additional weight body 160 is provided on a lower surface of the second weight body 121 (opposite side of the second weight body supporting portion 122 side). This configuration allows the second weight body 121 and the second additional weight body 160 to be coupled to the tip ends of the first bridge supporting portions 30A to 30D, increasing the mass of the weight body coupled to the first bridge supporting portions 30A to 30D. Moreover, a combined center of gravity of the second weight body 121 and the second additional weight body 160 (position of the center of gravity of the weight body formed by the second weight body 121 and the second additional weight body 160) is at a position lower than the center of gravity of the second weight body 121 in a case where the second additional weight body 160 is not provided (refer to FIGS. 23 to 25). The second additional weight body 160 is formed in a rectangular frame shape in plan view arranging inside thereof the first additional weight body 100.

As illustrated in FIG. 28, the second additional weight body 160 includes a second stopper portion 161 that regulates the displacement of the second weight body 121. The second stopper portion 161 can abut a first seat for second weight body 170 (described below) of the pedestal 10 in a case where the second weight body 121 is displaced upward (on the second weight body supporting portion 122 side, the positive side on the Z-axis). The second additional weight body 160 is formed so as to outwardly extend toward the pedestal 10 with respect to the second weight body 121 in plan view, and the second stopper portion 161 is formed at an outer peripheral side portion of the second additional weight body 160. More specifically, the second additional weight body 160 includes a second main body portion 162 joined to the second weight body 121, and includes the second stopper portion 161 arranged on more toward the outer peripheral side than the second main body portion 162.

An additional pedestal 110 is provided on the lower surface of the pedestal 10. The additional pedestal 110 is formed in a rectangular frame shape in plan view, such that the second additional weight body 160 is arranged inside the additional pedestal 110. This configuration allows the additional pedestal 110 to face the second stopper portion 161 of the second additional weight body 160. The lower surface of the first additional weight body 100 and the lower surface of the second additional weight body 160 are positioned above the lower surface of the additional pedestal 110.

The lower surface of the second weight body 121 includes the first seat for first weight body 163 to which the first stopper portion 101 abuts. The first seat for first weight body 163 is formed on an inner peripheral side portion of the second weight body 121 in plan view. The inner surface of the second additional weight body 160 is retreated more outwardly than the inner surface of the second weight body 121 so as to expose the first seat for first weight body 163 downward.

The inner surface of the second additional weight body 160 includes a second seat for first weight body 164 to which the first stopper portion 101 can abut. The first stopper portion 101 abuts the second seat for first weight body 164 in a case where the first weight body 21 is displaced in the direction along the XY plane (plane including the first extending axis of each of the first bridge supporting portions 30A to 30D).

The lower surface of the pedestal 10 includes the first seat for second weight body 170 to which the second stopper portion 161 abuts. The first seat for second weight body 170 is formed on an inner peripheral side portion of the pedestal 10 in plan view. The inner surface of the additional pedestal 110 is retreated more outwardly than the inner surface of the pedestal 10 so as to expose the first seat for second weight body 170 downward.

The inner surface of the additional pedestal 110 includes a second seat for second weight body 171 to which the second stopper portion 161 can abut. The second stopper portion 161 abuts the second seat for second weight body 171 in a case where the second weight body 121 is displaced in the direction along the XY plane (plane including the first extending axis of each of the first bridge supporting portions 30A to 30D).

The above-described bottom plate 74 is coupled to the pedestal 10 via the additional pedestal 110. With this configuration, the first weight body 21 and the first additional weight body 100, and the second weight body 121 and the second additional weight body 160 can be displaced downward until they abut the bottom plate 74. The bottom plate 74 includes a third seat for first weight body 165 to which the first additional weight body 100 can abut in a case where the first weight body 21 is displaced downward, and includes a third seat for second weight body 172 to which the second additional weight body 160 can abut in a case where the second weight body 121 is displaced downward.

The third seat for first weight body 165 is constituted with the first bottom plate facing surface 144 and the plurality of first bottom plate-side projections 146 illustrated in FIG. 25. In the present embodiment, the first bottom plate facing surface 144 faces the first additional weight body 100. The first additional weight body 100 can abut the first bottom plate-side projection 146 in a case where the first weight body 21 is displaced downward.

The third seat for second weight body 172 is constituted with the second bottom plate facing surface 145 and the plurality of second bottom plate-side projections 147 illustrated in FIG. 25. In the present embodiment, the second bottom plate facing surface 145 faces the second additional weight body 160. The second additional weight body 160 can abut the second bottom plate-side projection 147 in a case where the second weight body 121 is displaced downward.

When the vibrating body 20 is in the neutral position, the first additional weight body 100 is spaced apart from the first bottom plate-side projection 146 by the predetermined distance d6, and the first additional weight body 100 can be displaced downward until it abuts the first bottom plate-side projection 146. Moreover, the second additional weight body 160 is spaced apart from the second bottom plate-side projection 147 by a predetermined distance d7, and the second additional weight body 160 can be displaced downward until it abuts the second bottom plate-side projection 147. When the vibrating body 20 is in the neutral position, the distance d6 between the first additional weight body 100 and the first bottom plate-side projection 146 is longer than the distance d7 between the second additional weight body 160 and the second bottom plate-side projection 147. In the mode illustrated in FIG. 28, the height of the first bottom plate-side projection 146 is equal to the height of the second bottom plate-side projection 147, while the distance between the first bottom plate facing surface 144 and the first additional weight body 100 is longer than the distance between the second bottom plate facing surface 145 and the second additional weight body 160.

Additionally, as illustrated in FIG. 28, it is allowable to provide the top plate 71 similar to that of FIG. 25 in the present embodiment. The top plate 71 includes the first top plate facing surface 140 facing the first weight body supporting portion 22 and includes the second top plate facing surface 141 facing the second weight body supporting portion 122. Among these, the first top plate facing surface 140 includes the plurality of first top plate-side projections 142, while the second top plate facing surface 141 includes the plurality of second top plate-side projections 143. When the vibrating body 20 is in a neutral position, the first weight body supporting portion 22 is spaced apart from the first top plate-side projection 142 by the predetermined distance d4, and the second weight body supporting portion 122 is spaced apart from the second top plate-side projection 143 by the predetermined distance d5. As described above, in a case where the first additional weight body 100 includes the first stopper portion 101 that regulates the displacement of the first weight body 21, and where the second additional weight body 160 includes the second stopper portion 161 that regulates the displacement of the second weight body 121, there is no need to provide the top plate 71 illustrated in FIG. 28.

The upper surface 101U of the first stopper portion 101 is positioned below the upper surface 102U of the first main body portion 102. For example, when manufacturing the first additional weight body 100, it is possible to form the upper surface 101U of the first stopper portion 101 by partially removing the upper surface of the first additional weight body 100 by etching, machining, or the like. In this manner, when the first weight body 21 is in the neutral position, the first stopper portion 101 is spaced apart from the first seat for first weight body 163 of the second weight body 121 by a predetermined distance d8. With this configuration, the first weight body 21 can be displaced upward until the first stopper portion 101 abuts the first seat for first weight body 163. This distance d8 may be equal to the distance d4 or may be shorter than the distance d4. With this configuration, the first stopper portion 101 can function as a stopper for upward displacement of the first weight body 21. The lower surface of the first weight body 21 is flush with the lower surface of the pedestal 10.

An upper surface 161U of the second stopper portion 161 is positioned below an upper surface 162U of the second main body portion 162. For example, when manufacturing the second additional weight body 160, it is possible to form the upper surface 161U of the second stopper portion 161 by partially removing the upper surface of the second additional weight body 160 by etching, machining, or the like. In this manner, when the second weight body 121 is in the neutral position, the second stopper portion 161 is spaced apart from the first seat for second weight body 170 of the pedestal 10 by a predetermined distance d9. With this configuration, the second weight body 121 can be displaced upward until the second stopper portion 161 abuts the first seat for second weight body 170. This distance d9 may be equal to the distance d5 or may be shorter than the distance d5. With this configuration, the second stopper portion 161 can function as a stopper for upward displacement of the second weight body 121. The lower surface of the second weight body 121 is flush with the lower surface of the pedestal 10. In addition, since the first seat for second weight body 170 is formed over the entire circumference, it is possible to stabilize the posture of the second additional weight body 160 when the second stopper portion 161 abuts the first seat for second weight body 170. This configuration makes it possible to regulate the upward displacement of the second weight body 121 further reliably.

It is possible to fabricate the first additional weight body 100, the second additional weight body 160 and the additional pedestal 110 in a similar manner as the first additional weight body 100 and the additional pedestal 110 according to the third embodiment, and thus, detailed description thereof will be omitted.

In this manner, according to the present embodiment, the first additional weight body 100 is provided on the lower surface of the first weight body 21. This configuration makes it possible to achieve a lower combined center of gravity of the first weight body 21 and the first additional weight body 100 compared with the center of gravity of the first weight body 21 in a case where the first additional weight body 100 is not provided. This makes it possible to increase the stress generated in each of the first bridge supporting portions 30A to 30D and the second bridge supporting portions 130A to 130D in a case where the vibration acceleration is applied in each of the X-axis direction and the Y-axis direction. Moreover, it is possible to increase the mass of the weight body (the first weight body 21 and the first additional weight body 100) coupled to the first bridge supporting portions 30A to 30D and the second bridge supporting portions 130A to 130D, achieving an increase in the stress generated in each of the first bridge supporting portions 30A to 30D and the second bridge supporting portions 130A to 130D in a case where the vibration acceleration is applied to each of the X-axis direction, the Y-axis direction, and the Z-axis direction. As a result, it is possible to increase the charge generated from the piezoelectric element 40, leading to enhancement of the power generation efficiency of three-axis power generation.

Moreover, according to the present embodiment, the second additional weight body 160 is provided on the lower surface of the second weight body 121. As a result, similarly to the first additional weight body 100, it is possible to further increase the stress generated in each of the first bridge supporting portions 30A to 30D. This makes it possible to further increase the charge generated from the piezoelectric element 40, leading to further enhancement of the power generation efficiency of three-axis power generation.

Moreover, according to the present embodiment, the first additional weight body 100 includes the first stopper portion 101 provided so as to be able to abut the first seat for first weight body 163 of the second weight body 121. This makes it possible to regulate the upward displacement of the first weight body 21 even in a case where vibration acceleration in any of the X-axis direction, the Y-axis direction, and the Z-axis direction is applied. Therefore, plastic deformation and breakage of the first bridge supporting portions 30A to 30D and the second bridge supporting portions 130A to 130D can be further prevented, leading to enhancement of the reliability of the power generating element 1.

Moreover, according to the present embodiment, the first stopper portion 101 abuts the second seat for first weight body 164 provided on the second additional weight body 160 in a case where the first weight body 21 is displaced in the direction along the XY plane. This makes it possible to regulate the displacement of the first weight body 21 in the direction along the XY plane even in a case where the vibration acceleration is applied in any of the X-axis direction, the Y-axis direction, and the Z-axis direction. Therefore, plastic deformation and breakage of the first bridge supporting portions 30A to 30D and the second bridge supporting portions 130A to 130D can be further prevented, leading to enhancement of the reliability of the power generating element 1.

Moreover, according to the present embodiment, the first additional weight body 100 abuts the third seat for weight body 165 provided on the bottom plate 74 in a case where the first weight body 21 is displaced downward. This makes it possible to regulate the downward displacement of the first weight body 21 even in a case where the vibration acceleration in any of the X-axis direction, the Y-axis direction, and the Z-axis direction is applied. Therefore, plastic deformation and breakage of the first bridge supporting portions 30A to 30D and the second bridge supporting portions 130A to 130D can be further prevented, leading to enhancement of the reliability of the power generating element 1. In particular, according to the present embodiment, since the third seat for first weight body 165 includes the first bottom plate-side projection 146, it is possible to ensure a gap between the first additional weight body 100 and the first bottom plate facing surface 144 even in a case where the first additional weight body 100 abuts the first bottom plate-side projection 146. This makes it possible to prevent generation of damping action of air between the first additional weight body 100 and the first bottom plate facing surface 144, leading to prevention of suppression of the vibration of the first additional weight body 100. This makes it possible to prevent deterioration of the power generation efficiency of the power generating element 1.

Moreover, according to the present embodiment, the second additional weight body 160 includes the second stopper portion 161 provided so as to be able to abut the first seat for second weight body 170 of the pedestal 10. This makes it possible to regulate the upward displacement of the second weight body 121 even in a case where vibration acceleration in any of the X-axis direction, the Y-axis direction, and the Z-axis direction is applied. Therefore, it is possible to further prevent plastic deformation and breakage of the first bridge supporting portions 30A to 30D, leading to enhancement of the reliability of the power generating element 1.

Moreover, according to the present embodiment, the second stopper portion 161 abuts the second seat for second weight body 171 provided on the additional pedestal 110 in a case where the second weight body 121 is displaced in the direction along the XY plane. This makes it possible to regulate the displacement of the second weight body 121 in the direction along the XY plane even in a case where the vibration acceleration in any of the X-axis direction, the Y-axis direction, and the Z-axis direction is applied. Therefore, it is possible to further prevent plastic deformation and breakage of the first bridge supporting portions 30A to 30D, leading to enhancement of the reliability of the power generating element 1.

Moreover, according to the present embodiment, the second additional weight body 160 abuts the third seat for second weight body 172 provided on the bottom plate 74 in a case where the second weight body 121 is displaced downward. This makes it possible to regulate the downward displacement of the second weight body 121 even in a case where the vibration acceleration in any of the X-axis direction, the Y-axis direction, and the Z-axis direction is applied. Therefore, it is possible to further prevent plastic deformation and breakage of the first bridge supporting portions 30A to 30D, leading to enhancement of the reliability of the power generating element 1. In particular, according to the present embodiment, since the third seat for second weight body 172 includes the second bottom plate-side projection 147, it is possible to ensure a gap between the second additional weight body 160 and the second bottom plate facing surface 145 even in a case where the second additional weight body 160 abuts the second bottom plate-side projection 147. This makes it possible to prevent generation of damping action of air between the second additional weight body 160 and the second bottom plate facing surface 145, leading to prevention of suppression of the vibration of the second additional weight body 160. This makes it possible to prevent deterioration of the power generation efficiency of the power generating element 1.

Moreover, according to the present embodiment, when the vibrating body 20 is in the neutral position, the distance between the first additional weight body 100 and the first bottom plate-side projection 146 is longer than the distance between the second additional weight body 160 and the second bottom plate-side projection 147. This makes it possible to prevent restriction of the displacement of the first weight body 21, which can be greater than the displacement of the second weight body 121 and avoid abutment of the first additional weight body 100 to the bottom plate 74 in a wider acceleration range. This makes it possible to suppress an escape of the force received by the first weight body 21 to the bottom plate 74, achieving an increase in the stress generated in the first bridge supporting portions 30A to 30D and in the second bridge supporting portions 130A to 130D. As a result, the vibration energy applied to the first weight body 21 can be efficiently converted into electric energy, achieving an increase in the charge generated from the piezoelectric element 40.

Seventh Embodiment

Next, the power generating element according to a seventh embodiment of the present invention will be described with reference to FIGS. 29 to 36.

Figure 29:
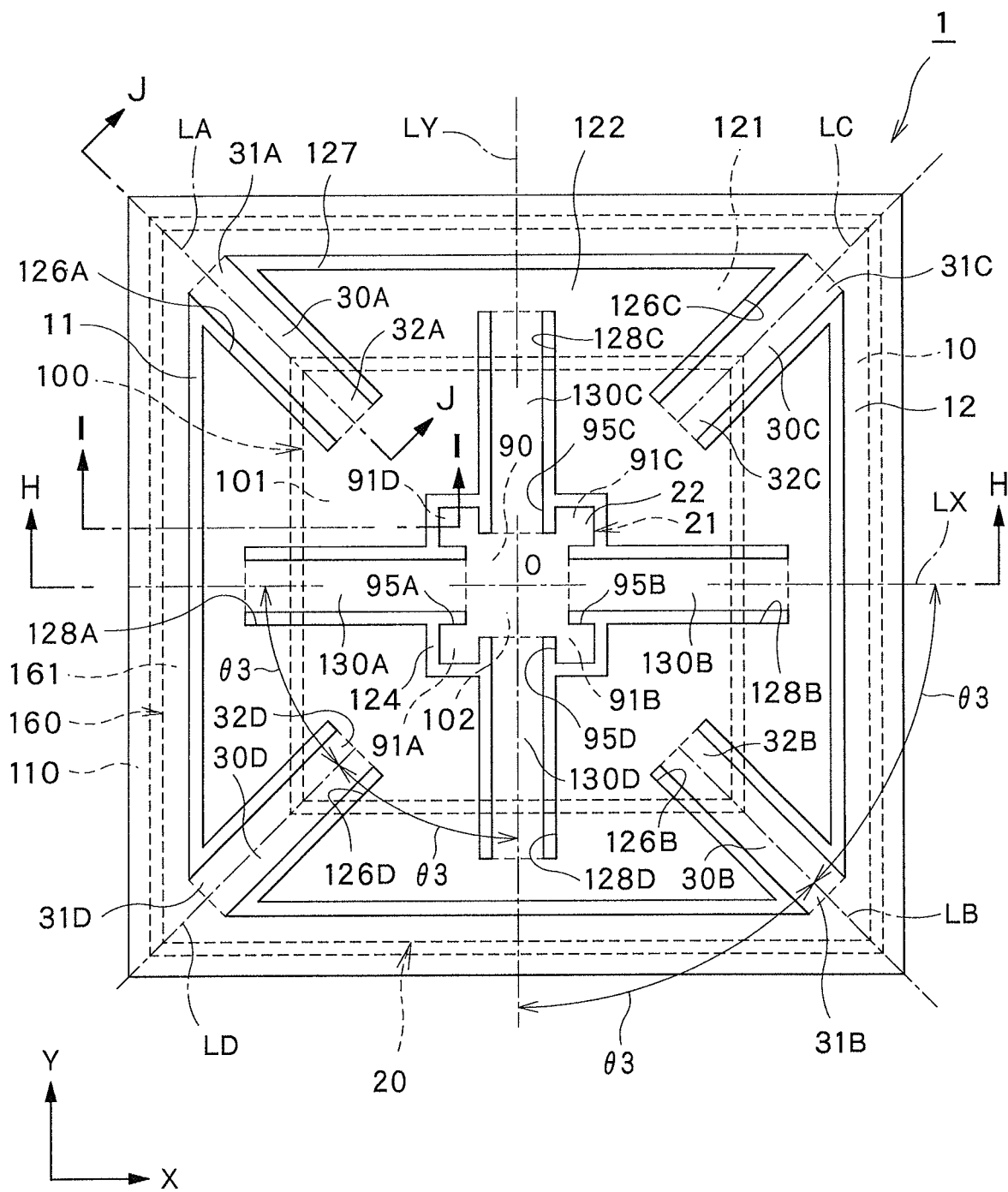
FIG. 29 is a plan view illustrating a power generating element according to a seventh embodiment of the present invention.
Figure 34:
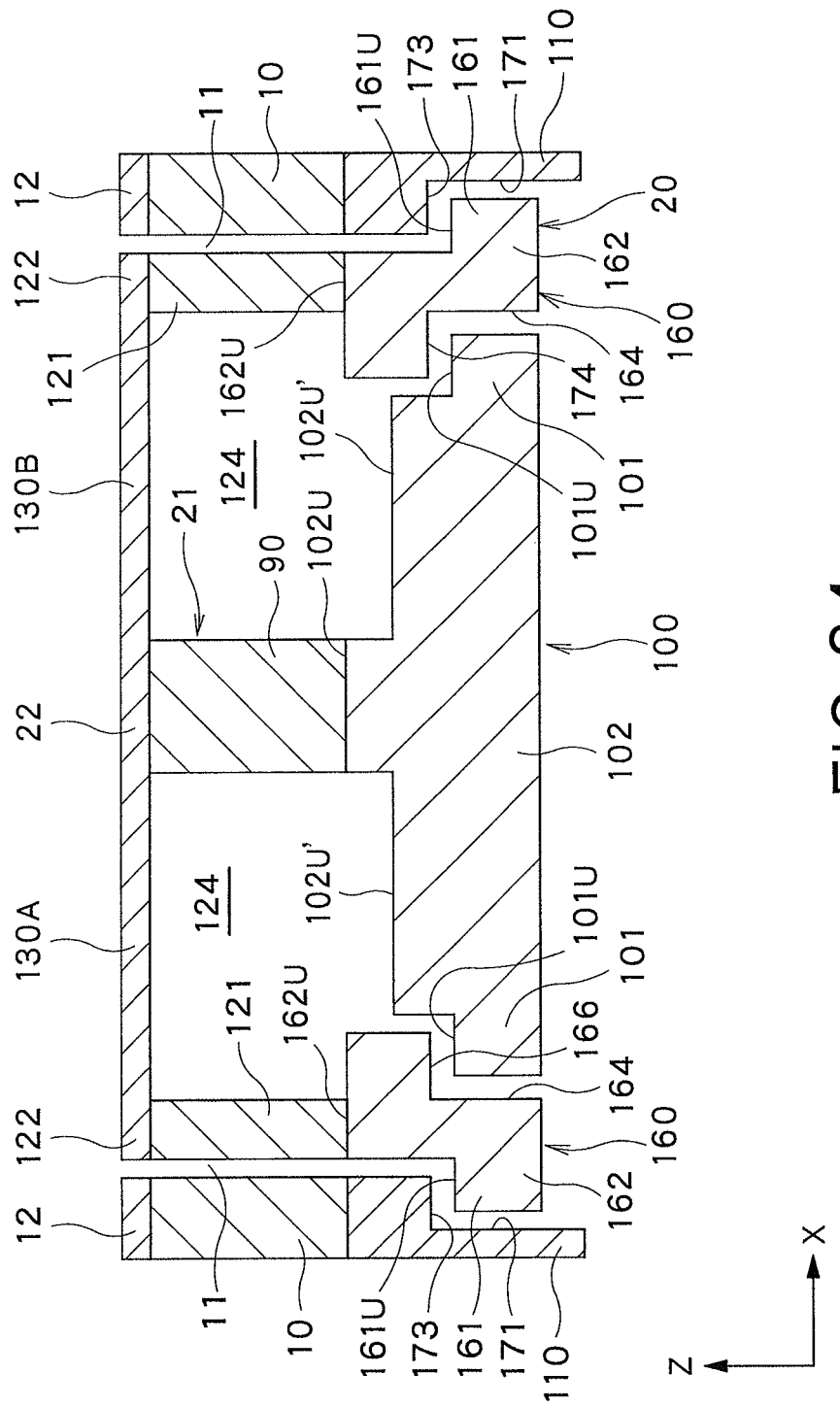
FIG. 34 is a diagram illustrating a modification of a cross-sectional view of the power generating element illustrated in FIG. 29, taken along line H-H.
Figure 35:
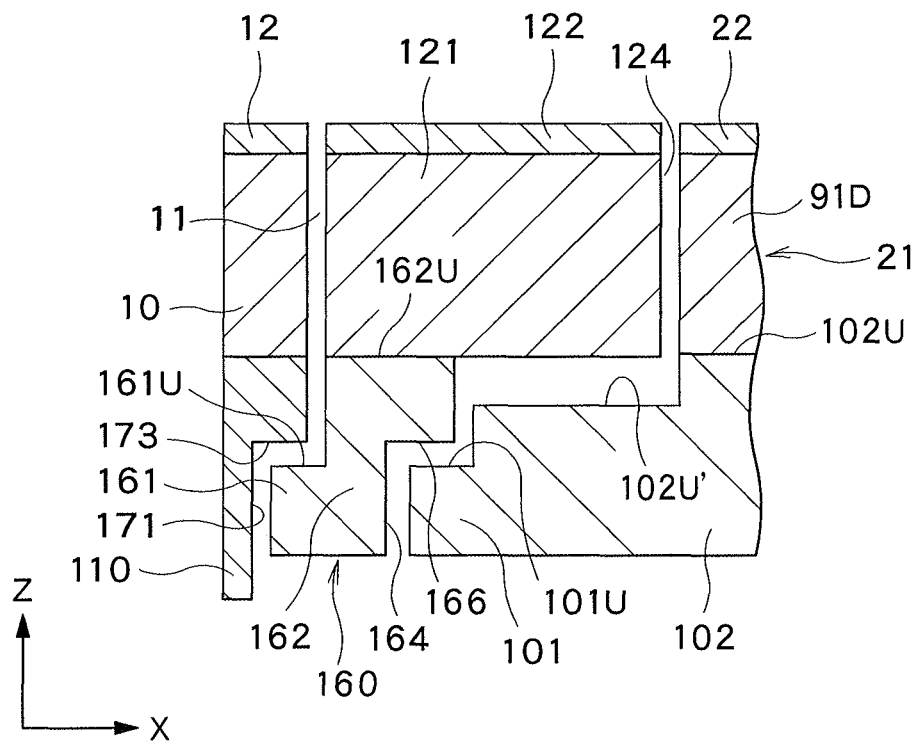
FIG. 35 is a diagram illustrating a modification of a cross-sectional view of the power generating element illustrated in FIG. 29, taken along line I-I.
Figure 36:
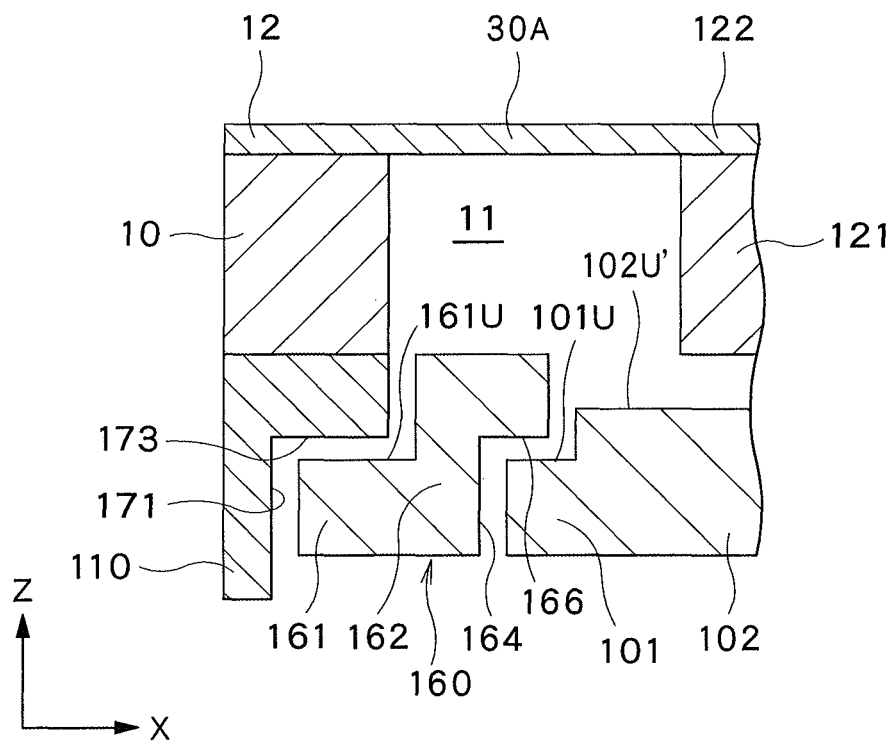
FIG. 36 is a diagram illustrating a modification of a cross-sectional view of the power generating element illustrated in FIG. 29, taken along line J-J.

In the seventh embodiment illustrated in FIGS. 29 to 36, main differences are in that the second extending axes of the second bridge supporting portions are arranged between the first extending axes of a pair of the first bridge supporting portions adjacent to each other in the circumferential direction with the first weight body defined as a center in the plan view The other configurations are substantially the same as those of the sixth embodiment illustrated in FIGS. 27 and 28. In FIGS. 29 and 36, the same portions as those of the sixth embodiment illustrated in FIGS. 27 and 28 will be denoted by the same reference numerals, and a detailed description thereof will be omitted.

Figure 30:
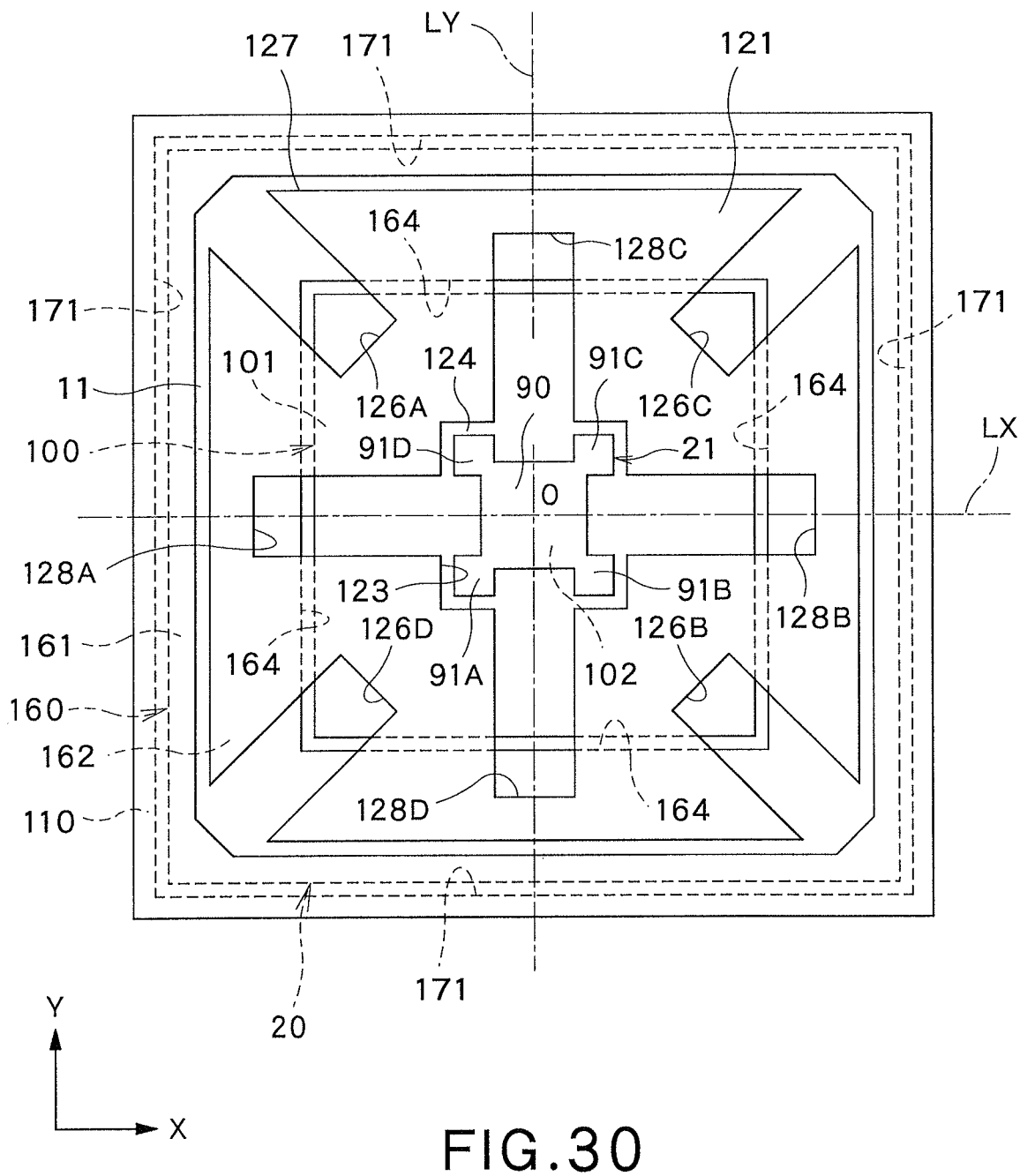
FIG. 30 is a plan view illustrating a pedestal, a first weight body and a second weight body in the power generating element illustrated in FIG. 29.
Figure 31:
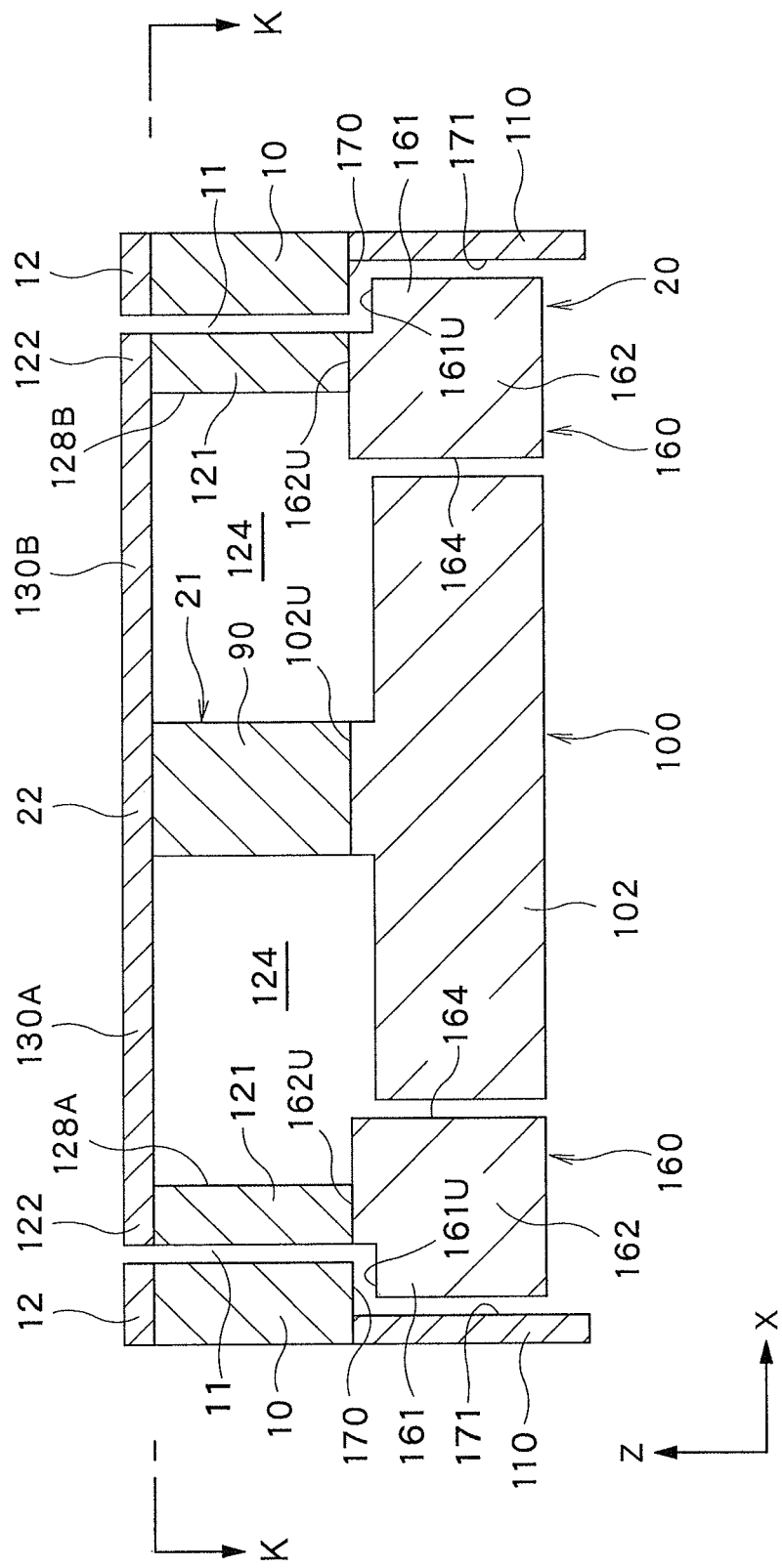
FIG. 31 is a cross-sectional view of the power generating element illustrated in FIG. 29, taken along line H-H.
Figure 32:
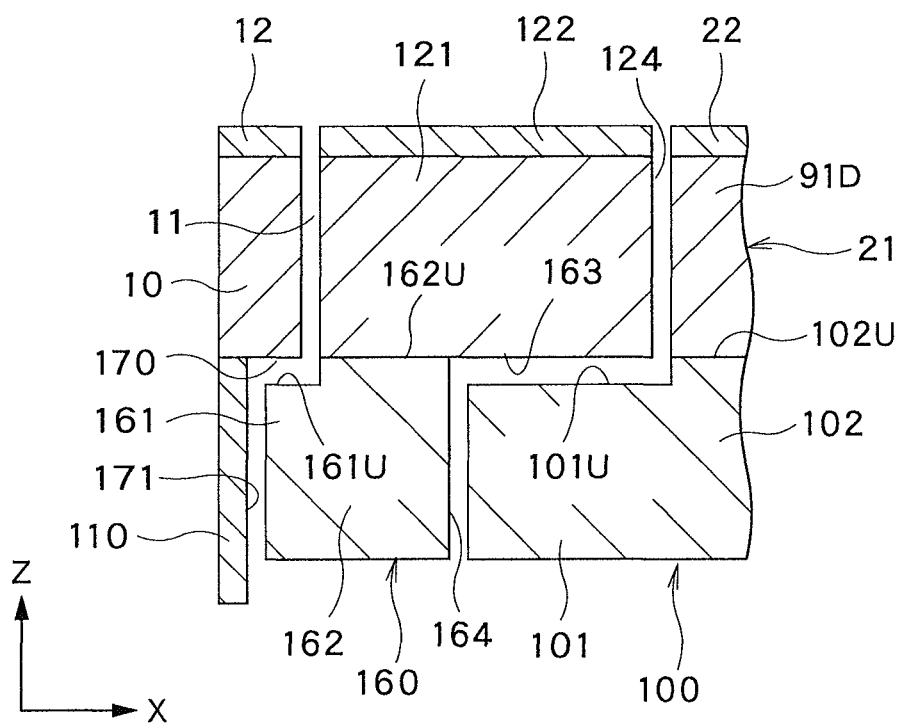
FIG. 32 is a cross-sectional view of the power generating element illustrated in FIG. 29, taken along line I-I.
Figure 33:
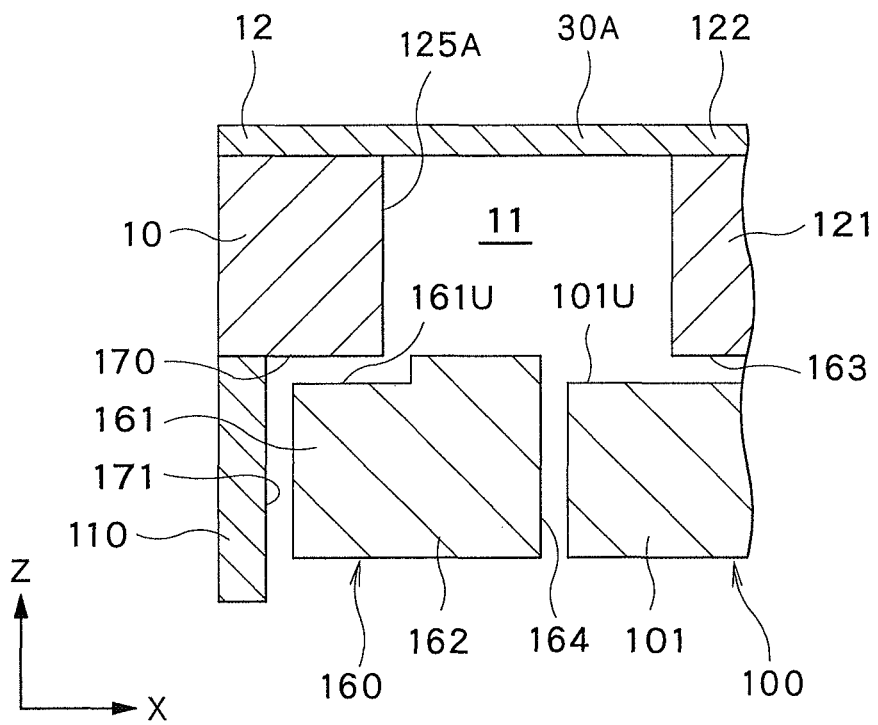
FIG. 33 is a cross-sectional view of the power generating element illustrated in FIG. 29, taken along line 3-3.

FIG. 29 is a plan view of a power generating element according to the seventh embodiment of the present invention. FIG. 30 is a plan view of the pedestal, the first weight body and the second weight body. FIG. 31 illustrates a cross section taken along line H-H in FIG. 29, FIG. 32 illustrates a cross section taken along line I-I in FIG. 29, and FIG. 33 illustrates a cross section taken along line J-J in FIG. 29. Note that FIG. 29 corresponds to the plan view seen from line K-K in FIG. 31. While FIG. 29 omits illustration of the piezoelectric element 40 in order to simplify the drawing, it is allowable to configure the piezoelectric element 40 similarly to the fourth embodiment. The similar applies to FIG. 29 described below.

The sixth embodiment illustrated in FIGS. 27 and 28 has described an exemplary case where the second extending axes of the second bridge supporting portions 130A to 130D extend along the first extending axis of the corresponding first bridge supporting portions 30A to 30D, that is, the first extending axis of each of the first bridge supporting portions 30A and 30B and the second extending axis of each of the second bridge supporting portions 130A and 130B are the center axis LX, and the first extending axis of each of the first bridge supporting portions 30C and 30D and the second extending axis of each of the second bridge supporting portions 130C and 130D are the center axis LY.

In contrast, the present embodiment is a case, as illustrated in FIG. 29, where the second extending axes of the second bridge supporting portions 130A to 130D are arranged between the first extending axes of a pair of the first bridge supporting portions 30A to 30D adjacent to each other in the circumferential direction (circumferential direction with respect to the center O) with the first weight body 21 defined as a center in the plan view.

In the present embodiment, the angle formed by each of the first extending axes of a pair of the first bridge supporting portions 30A to 30D adjacent to each other in the circumferential direction with the vibrating body 20 defined as a center in plan view is 90°. More specifically, a first extending axis LA of the first bridge supporting portion 30A is a line extending from the center O of the first weight body 21 to the second quadrant of the XY coordinate system, being a line inclined at 45° with respect to the center axis LX and the center axis LY. Similarly, a first extending axis LB of the first bridge supporting portion 30B is a line extending from the center O of the first weight body 21 to the fourth quadrant, being a line inclined at 45° with respect to the center axis LX and the center axis LY. A first extending axis LC of the first bridge supporting portion 30C is a line extending from the center O of the first weight body 21 to the first quadrant, being a line inclined at 45° with respect to the center axis LX and the center axis LY. A first extending axis LD of the first bridge supporting portion 30D is a line extending from the center O of the first weight body 21 to the third quadrant, being a line inclined at 45° with respect to the center axis LX and the center axis LY.

In contrast, the second extending axis of each of the second bridge supporting portions 130A and 130B is the center axis LX and the second extending axis of each of the second bridge supporting portions 130C and 130D is the center axis LY.

In this manner, the second extending axis of the second bridge supporting portion 130A is arranged between the first extending axis LA of the first bridge supporting portion 30A and the first extending axis LD of the first bridge supporting portion 30D in the circumferential direction. Similarly, the second extending axis of the second bridge supporting portion 130B is arranged between the first extending axis LB of the first bridge supporting portion 30B and the first extending axis LC of the first bridge supporting portion 30C. The second extending axis of the second bridge supporting portion 130C is arranged between the first extending axis LC of the first bridge supporting portion 30C and the first extending axis LA of the first bridge supporting portion 30A. The second extending axis of the second bridge supporting portion 130D is arranged between the first extending axis LD of the first bridge supporting portion 30D and the first extending axis LB of the first bridge supporting portion 30B.

Furthermore, the angle formed by the second extending axis of each of the second bridge supporting portions 130A to 130D and the first extending axis of one of the first bridge supporting portions 30A to 30D adjacent thereto in the circumferential direction is equal to the angle formed by said second extending axis and the first extending axis of the other first bridge supporting portions 30A to 30D. For example, the angle ($\theta 3$ illustrated in FIG. 29) formed by the second extending axis of the second bridge supporting portion 130A and the first extending axis LA of the first bridge supporting portion 30A is equal to the angle ($\theta 3$ illustrated in FIG. 29) formed by the second extending axis of the second bridge supporting portion 130A and the first extending axis LD of the first bridge supporting portion 30D. Similarly, each of the angles formed by the second extending axis of the second bridge supporting portions 130B to 130D and the first extending axis of the adjacent first bridge supporting portions 30A to 30D is also θ3. In the present embodiment, the angle θ3 is 45°. Note that the angles formed by the second extending axis of the second bridge supporting portions 130A to 130D and the first extending axis of the first bridge supporting portions 30A to 30D adjacent to each other in the circumferential direction are not limited to being equal. For example, the angle (θ3) may be 35° to 55° instead of 45°.

In the mode illustrated in FIG. 29, the first weight body 21 includes the first weight body central portion 90 and four first weight body protrusions 91A to 91D coupled to the first weight body central portion 90, similarly to the fifth embodiment illustrated in FIG. 26. The first weight body 21 illustrated in FIG. 29 is formed in the similar manner as the first weight body 21 illustrated in FIG. 26, and thus, a detailed description thereof will be omitted.

As illustrated in FIGS. 29 and 30, the second weight body 121 includes, in plan view, four pieces of the first draw-in recesses 126A to 126D that draw in the ends 32A to 32D of the first bridge supporting portions 30A to 30D on the second weight body 121 side. The first draw-in recesses 126A to 126D are formed so as to be recessed from an outer edge 127 of the second weight body 121 toward the inner peripheral side. The first draw-in recesses 126A to 126D are formed so as to extend in an elongated shape along the first extending axes LA to LD of the corresponding first bridge supporting portions 30A to 30D.

More specifically, the first draw-in recessed portion 126A is formed to be recessed from the outer edge 127 toward the center O side (first weight body 21 side) so as to draw in the end 32A on the second weight body 121 side. In the present embodiment, a large area of the first bridge supporting portion 30A, including the end 32A is drawn in. As a result, the end 32A of the first bridge supporting portion 30A is located away from the end 31A on the pedestal 10 side. Similarly, the first draw-in recessed portion 126B is formed so as to be recessed from the outer edge 127 toward the center O side, and draws in the end 32B on the second weight body 121 side. As a result, the end 32B of the first bridge supporting portion 30B is located away from the end 31B on the pedestal 10 side. The first draw-in recessed portion 126C is formed so as to be recessed from the outer edge 127 toward the center O side, and draws in the end 32C on the second weight body 121 side. As a result, the end 32C of the first bridge supporting portion 30C is located away from the end 31C on the pedestal 10 side. The first draw-in recessed portion 126D is formed so as to be recessed from the outer edge 127 toward the center O side, and draws in the end 32D on the second weight body 121 side. As a result, the end 32D of the first bridge supporting portion 30D is located away from the end 31D on the pedestal 10 side.

Moreover, the second weight body 121 includes, in plan view, four second draw-in recesses 128A to 128D that draw in the ends 131A to 131D (refer to FIG. 26) of the second bridge supporting portions 130A to 130D on the second weight body 121 side. The second draw-in recesses 128A to 128D are formed so as to be recessed from an inner edge 123 of the second weight body 121 toward the outer peripheral side. The second draw-in recesses 128A to 128D are formed so as to extend in an elongated shape along the second extending axis of the corresponding second bridge supporting portions 130A to 130D.

More specifically, the second draw-in recessed portion 128A is formed to be recessed from the inner edge 123 toward the X-axis negative side and draws in the end 131A on the second weight body 121 side. Here, a large area of the second bridge supporting portion 130A, including the end 131A is drawn in. As a result, the end 131A of the second bridge supporting portion 130A is located away from the end 132A (refer to FIG. 26) on the first weight body 21 side. Similarly, the second draw-in recessed portion 128B is formed so as to be recessed from the inner edge 123 toward the positive side on the X-axis, and draws in the end 131B on the second weight body 121 side. As a result, the end 131B of the second bridge supporting portion 130B is located away from the end 132B on the first weight body 21 side. The second draw-in recessed portion 128C is formed so as to be recessed from the inner edge 123 toward the positive side on the Y-axis, and draws in the end 131C on the second weight body 121 side. As a result, the end 131C of the second bridge supporting portion 130C is located away from the end 132C on the first weight body 21 side. The second draw-in recessed portion 128D is formed so as to be recessed from the inner edge 123 toward the negative side on the Y-axis, and draws in the end 131D on the second weight body 121 side. As a result, the end 131D of the second bridge supporting portion 130D is located away from the end 132D on the first weight body 21 side.

Moreover, in the mode illustrated in FIG. 29, the first seat for first weight body 163 to which the first stopper portion 101 of the first additional weight body 100 abuts is indicated by the cross section illustrated in FIG. 32. In the cross section illustrated in FIG. 31, the first seat for first weight body 163 does not appear due to the presence of the second draw-in recesses 128A to 128D. Moreover, in the cross section illustrated in FIG. 33, the first seat for first weight body 163 does not appear due to the presence of the first draw-in recesses 126A to 126D. That is, the first seat for first weight body 163 is arranged in a region where the first draw-in recesses 126A to 126D are absent and in a region where the second draw-in recesses 128A to 128D are absent, in the lower surface of the second weight body 121. While FIGS. 31 to 33 omit illustrations of the top plate 71 and the bottom plate 74 as illustrated in FIG. 28 for clarity of the drawing, the top plate 71 and/or the bottom plate 74 may be provided.

In this manner, according to the present embodiment described above, the second bridge supporting portions 130A to 130D are arranged between the first extending axes of a pair of the first bridge supporting portions 30A to 30D adjacent to each other in the circumferential direction with the first weight body 21 defined as a center in plan view. This makes it possible to avoid a state in which the first bridge supporting portions 30A to 30D and the second bridge supporting portions 130A to 130D are arranged on a straight line. This makes it possible to increase the lengths of the first bridge supporting portions 30A to 30D and the lengths of the second bridge supporting portions 130A to 130D while enhancing space efficiency, leading to achievement of a lower resonance frequency.

Moreover, according to the present embodiment, the angle formed by the second extending axis of each of the second bridge supporting portions 130A to 130D and the first extending axis of one of the first bridge supporting portions 30A to 30D adjacent thereto in the circumferential direction is equal to the angle formed by said second extending axis and the first extending axis of the other first bridge supporting portions 30A to 30D. This makes it possible to increase the lengths of the first bridge supporting portions 30A to 30D by enhancing space efficiency, leading to achievement of a lower resonance frequency.

Moreover, according to the present embodiment, the second weight body 121 includes, in plan view, the four first draw-in recesses 126A to 126D that draw in the ends 32A to 32D of the first bridge supporting portions 30A to 30D on the second weight body 121 side. This makes it possible to locate the ends 32A to 32D of the first bridge supporting portions 30A to 30D away from the ends 31A to 31D on the pedestal 10 side. Additionally, since the second weight body 121 can be formed around the first draw-in recesses 126A to 126D, making it possible to increase the planar area of the second weight body 121. This leads to achievement of an increased length of the first bridge supporting portions 30A to 30D while increasing the mass of the second weight body 121. As a result, it is possible to lower the resonance frequency of the resonance system II defined mainly on the basis of the second weight body 121 and the first bridge supporting portions 30A to 30D.

Furthermore, according to the present embodiment, the second weight body 121 includes, in plan view, the four second draw-in recesses 128A to 128D that draw in the ends 131A to 131D of the second bridge supporting portions 130A to 130D on the second weight body 121 side. This makes it possible to locate the ends 131A to 131D of the second bridge supporting portions 130A to 130D away from the ends 132A to 132D on the first weight body 21 side. Additionally, since the second weight body 121 can be formed around the second draw-in recesses 128A to 128D, achieving an increase in the planar area of the second weight body 121. This leads to achievement of an increased length of the second bridge supporting portions 130A to 130D while increasing the mass of the second weight body 121. This makes it possible to lower the resonance frequency of the resonance system I defined mainly on the basis of the first weight body 21 and the second bridge supporting portions 130A to 130D.

In the present embodiment, modification is possible as illustrated in FIGS. 34 to 36. FIG. 34 illustrates a modification of the cross section taken along line H-H in FIG. 29, FIG. 35 illustrates a modification of the cross section taken along line I-I in FIG. 29, and FIG. 36 illustrates a modification of the cross section taken along line J-J in FIG. 29.

In the modification illustrated in FIGS. 34 to 36, the second additional weight body 160 includes a fourth seat for first weight body 166 to which the first stopper portion 101 of the first additional weight body 100 can abut in a case where the first weight body 21 is displaced upward. The fourth seat for first weight body 166 is formed on the inner peripheral side portion of the second additional weight body 160 in plan view. An upper portion of the inner peripheral side portion of the second additional weight body 160 protrudes toward the inner peripheral side so as to form the fourth seat for first weight body 166. Additionally, in FIGS. 34 to 36, the lower portion of the outer peripheral side portion of the first additional weight body 100 protrudes to the outer peripheral side, thereby forming the first stopper portion 101.

As illustrated in FIGS. 34 to 36, when the first weight body 21 is in the neutral position, the first stopper portion 101 is spaced apart from the fourth seat for first weight body 166 of the second additional weight body 160 by a predetermined distance. With this configuration, the first weight body 21 can be displaced upward until the first stopper portion 101 abuts the fourth seat for first weight body 166.

Moreover, as illustrated in FIGS. 34 to 36, the first additional weight body 100 includes an upper surface 102U' positioned below the upper surface 102U of the first main body portion 102. The upper surface 102U' is positioned above the upper surface 101O of the first stopper portion 101. As illustrated in FIGS. 34 to 36, a portion of the upper surface 102U' faces the lower surface of the second weight body 121, and the distance between the upper surface 102U' and the lower surface of the second weight body 121 in the neutral position is longer than the distance between the upper surface 101U of the first stopper portion 101 and the fourth seat for first weight body 166. In this manner, in a case where the first weight body 21 is displaced upward, an upward displacement of the first weight body 21 is regulated by abutment of the upper surface 101U to the fourth seat for first weight body 166 instead of abutment of the upper surface 102U' to the second weight body 121. In particular, in the example case illustrated in FIGS. 34 to 36, it is possible to form the fourth seat for first weight body 166 over the entire circumference. This makes it possible to stabilize the posture of the first additional weight body 100 when the first stopper portion 101 abuts the fourth seat for first weight body 166. This configuration makes it possible to regulate the upward displacement of the first weight body 21 further reliably.

Moreover, as illustrated in FIGS. 34 to 36, the additional pedestal 110 includes the fourth seat for second weight body 173 to which the second stopper portion 161 of the second additional weight body 160 can abut in a case where the second weight body 121 is displaced upward. The fourth seat for second weight body 173 is formed on an inner peripheral side portion of the additional pedestal 110 in plan view. An upper portion of the inner peripheral side portion of the additional pedestal 110 protrudes toward the inner peripheral side so as to form the fourth seat for second weight body 173. Additionally, in FIGS. 34 to 36, the lower portion of the outer peripheral side portion of the second additional weight body 160 protrudes to the outer peripheral side, thereby forming the second stopper portion 161.

As illustrated in FIGS. 34 to 36, when the second weight body 121 is in the neutral position, the second stopper portion 161 is spaced apart from the fourth seat for second weight body 173 of the additional pedestal 110 by a predetermined distance. With this configuration, the second weight body 121 can be displaced upward until the second stopper portion 161 abuts the fourth seat for second weight body 173. Moreover, in the exemplary case illustrated in FIGS. 34 to 36, in a case where the second weight body 121 is displaced upward, an upward displacement of the second weight body 121 is regulated by abutment of the upper surface 161U to the fourth seat for second weight body 173. Note that in the example case illustrated in FIGS. 34 to 36, it is possible to form the fourth seat for second weight body 173 over the entire circumference. This makes it possible to stabilize the posture of the second additional weight body 160 when the second stopper portion 161 abuts the fourth seat for second weight body 173. This configuration makes it possible to regulate the upward displacement of the second weight body 121 further reliably.

Eighth Embodiment

Next, the power generating element according to an eighth embodiment of the present invention will be described with reference to FIGS. 37 and 38.

Figure 37:
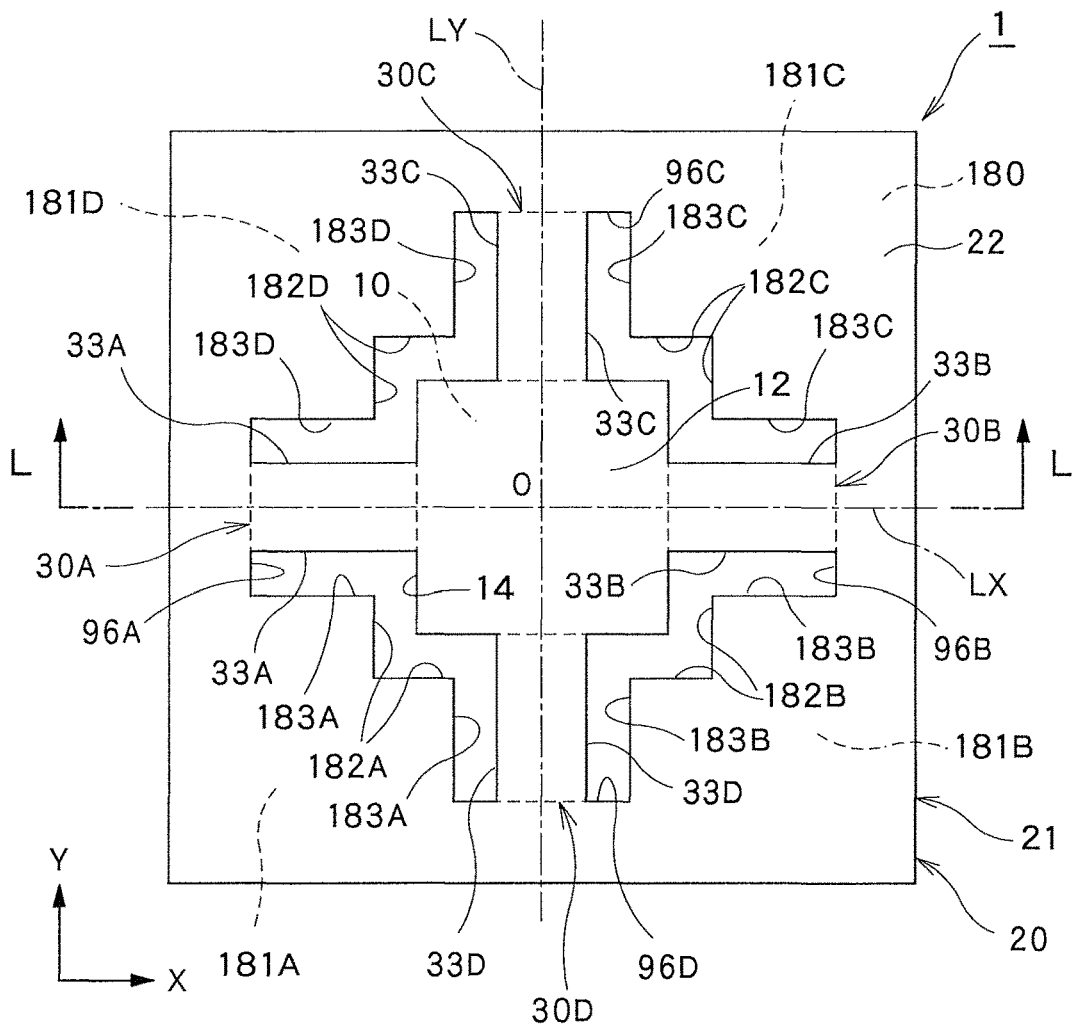
FIG. 37 is a plan view illustrating a power generating element according to an eighth embodiment of the present invention.
Figure 38:
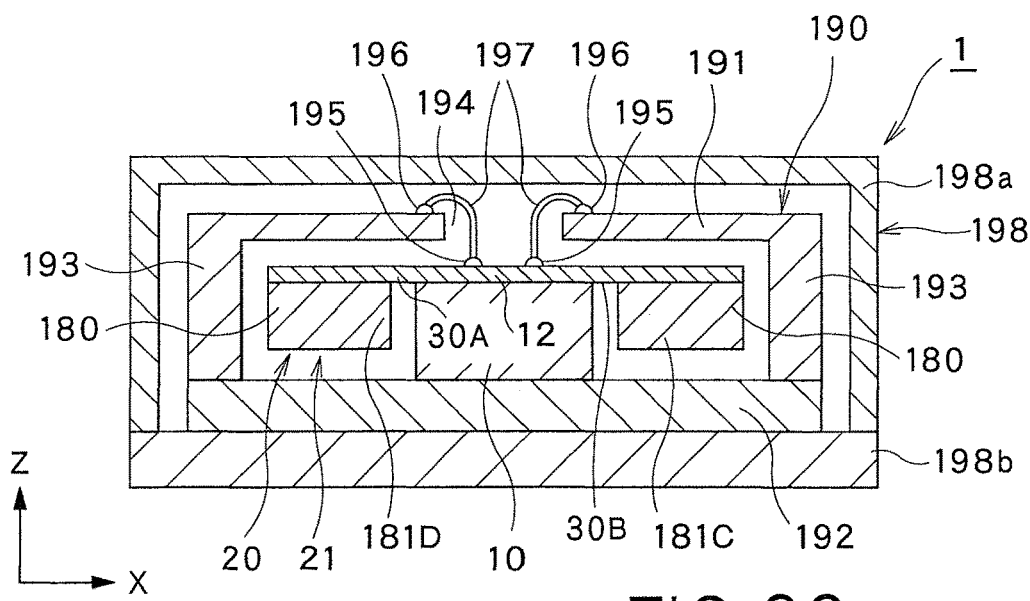
FIG. 38 is a cross-sectional view of the power generating element illustrated in FIG. 37, taken along line L-L.

In the eighth embodiment illustrated in FIGS. 37 and 38, a main difference is in that a pedestal is provided on the inside of the vibrating body formed in a frame shape in plan view. The other configurations are substantially the same as those of the first embodiment illustrated in FIGS. 1 to 15. In FIGS. 37 and 38, the same portions as those of the first embodiment illustrated in FIGS. 1 to 15 will be denoted by the same reference numerals, and a detailed description thereof will be omitted.

FIG. 37 is a plan view of a power generating element according to the eighth embodiment of the present invention. FIG. 38 illustrates a cross section of the power generating element illustrated in FIG. 37, taken along line L-L. In FIG. 37, the illustration of the upper electrode layer of the piezoelectric element 40 is omitted for clarity of the drawing. In FIG. 37, the four of the upper electrode layers E11 to E44 may also be provided in each of the first bridge supporting portions 30A to 30D as illustrated in FIG. 2, or the two upper electrode layers E1 and E2 may be provided as illustrated in FIGS. 12 to 14. Furthermore, the number of the upper electrode layers may be one.

In the present embodiment, as illustrated in FIG. 37, the first weight body 21 of the vibrating body 20 is formed in a frame shape in plan view. The pedestal 10 is arranged inside the vibrating body 20, and is formed in a rectangular (or square) shape in plan view. The first weight body 21 is supported on the pedestal 10 by the four first bridge supporting portions 30A to 30D. In the present embodiment, similarly to the first embodiment illustrated in FIG. 2, the angles formed by the first extending axes of a pair of the first bridge supporting portions 30A to 30D adjacent to each other are equal in the circumferential direction (circumferential direction with respect to the center O) with the pedestal 10 defined as a center in plan view. In addition, the first bridge supporting portions 30A to 30D are formed symmetrically with respect to the center axis LX while being formed symmetrically with respect to the center axis LY in plan view.

As illustrated in FIG. 37, the first weight body 21 includes a first weight body frame portion 180, a plurality of first weight body inner side portions 181A to 181D coupled to the first weight body frame portion 180. Among them, the first weight body inner side portions 181A to 181D protrude from the first weight body frame portion 180 toward the pedestal 10. The first weight body frame portion 180 is formed in a rectangular frame shape in plan view, and the first weight body inner side portions 181A to 181D are formed so as to bulge from the corner portions of the first weight body frame portion 180 to the inside. The first weight body frame portion 180 and the first weight body inner side portions 181A to 181D are continuously and integrally formed. The first weight body supporting portion 22 is integrally formed and joined to the entire upper surface of the first weight body frame portion 180 and the entire upper surface of each of the first weight body inner side portions 181A to 181D.

The first weight body inner side portions 181A to 181D are arranged between the first bridge supporting portions 30A to 30D adjacent to each other in the circumferential direction with the pedestal 10 defined as a center in plan view. In other words, there are provided draw-in recesses 96A to 96D that draw in the ends 31A to 31D (refer to FIG. 2) of the first bridge supporting portions 30A to 30D on the first weight body frame portion 180 side, at a portion between the first weight body inner side portions 181A to 181D adjacent to each other in the circumferential direction. The draw-in recesses 96A to 96D are formed so as to be recessed from the inner edge of the first weight body 21 toward the outer peripheral side. The draw-in recesses 96A to 96D are formed so as to extend along the first extending axis of the corresponding first bridge supporting portions 30A to 30D. In the example illustrated in FIG. 37, the draw-in recesses 96A to 96D draw in a large area including the ends 31A to 31D, of the corresponding first bridge supporting portions 30A to 30D. As a result, the first bridge supporting portions 30A to 30D are arranged between the first weight body inner side portions 181A to 181D adjacent to each other in the circumferential direction.

Inner edges 182A to 182D of the first weight body inner side portions 181A to 181D on the pedestal 10 side are formed along (or parallel to) an outer edge 14 of the pedestal 10. Inner edges 183A to 183D of the first weight body inner side portions 181A to 181D on the opposing first bridge supporting portions 30A to 30D sides are formed along (or parallel to) the side edges 33A to 33D of the first bridge supporting portions 30A to 30D.

More specifically, one first weight body inner side portion 181A is arranged between the first bridge supporting portion 30A and the first bridge supporting portion 30D. The first weight body inner side portion 181A is surrounded by the two first bridge supporting portions 30A and 30D, and the pedestal 10. The inner edge 182A of the first weight body inner side portion 181A on the pedestal 10 side is formed along the outer edge 14 of the pedestal 10. The inner edge 183A of the first weight body inner side portion 181A on the opposing first bridge supporting portion 30A side is formed along the side edge 33A of the first bridge supporting portion 30A while the inner edge 183A on the opposing first bridge supporting portion 30D side is formed along the side edge 33D of the first bridge supporting portion 30D.

One first weight body inner side portion 181B is arranged between the first bridge supporting portion 30D and the first bridge supporting portion 30B. The first weight body inner side portion 181B is surrounded by the two first bridge supporting portions 30B and 30D, and the pedestal 10. The inner edge 182B of the first weight body inner side portion 181B on the pedestal 10 side is formed along the outer edge 14 of the pedestal 10. The inner edge 183B of the first weight body inner side portion 181B on the opposing first bridge supporting portion 30D side is formed along the side edge 33D of the first bridge supporting portion 30D while the inner edge 183B on the opposing first bridge supporting portion 30B side is formed along the side edge 33B of the first bridge supporting portion 30B.

One first weight body inner side portion 181C is arranged between the first bridge supporting portion 30B and the first bridge supporting portion 30C. The first weight body inner side portion 181C is surrounded by the two first bridge supporting portions 30B and 30C, and the pedestal 10. The inner edge 182C of the first weight body inner side portion 181C on the pedestal 10 side is formed along the outer edge 14 of the pedestal 10. The inner edge 183C of the first weight body inner side portion 181C on the opposing first bridge supporting portion 30B side is formed along the side edge 33B of the first bridge supporting portion 30B while the inner edge 183C on the opposing first bridge supporting portion 30C side is formed along the side edge 33C of the first bridge supporting portion 30C.

One first weight body inner side portion 181D is arranged between the first bridge supporting portion 30C and the first bridge supporting portion 30A. The first weight body inner side portion 181D is surrounded by the two first bridge supporting portions 30A and 30C, and the pedestal 10. The inner edge 182D of the first weight body inner side portion 181D on the pedestal 10 side is formed along the outer edge 14 of the pedestal 10. The inner edge 183D of the first weight body inner side portion 181D on the opposing first bridge supporting portion 30C side is formed along the side edge 33C of the first bridge supporting portion 30C while the inner edge 183D on the opposing first bridge supporting portion 30A side is formed along the side edge 33A of the first bridge supporting portion 30A.

As illustrated in FIG. 38, the lower surface of the first weight body frame portion 180 is positioned above the lower surface of the pedestal 10. The lower surfaces of the first weight body inner side portions 181A to 181D are flush with the lower surface of the first weight body frame portion 180. In this manner, the first weight body 21 can be displaced downward until it abuts the bottom plate 74 described below.

As illustrated in FIG. 38, a casing 190 includes a top plate 191 provided above the first bridge supporting portions 30A to 30D and the pedestal supporting portion 12, and includes a bottom plate 192 provided below the pedestal 10. The top plate 191 and the bottom plate 192 are coupled by a side plate 193 arranged outside the first weight body 21. Although not illustrated in FIG. 38, the top plate 191 may include the top plate facing surface 72 and the top plate-side projection 73 as illustrated in FIG. 7. Similarly, the bottom plate 192 may include the bottom plate facing surface 75 and the bottom plate-side projection 76.

The top plate 191 includes a top plate opening 194 provided above the first weight body supporting portion 22. The pedestal supporting portion 12 includes a plurality of bonding pads 195 electrically connected to each of the electrode layers of the piezoelectric element 40, while the top plate 191 includes a plurality of bonding pads 196 to be electrically connected to the outside of the power generating element 1. Each of the bonding pads 195 and the corresponding bonding pad 196 are connected by a bonding wire 197. The bonding wire 197 penetrates the top plate opening 194 of the top plate 191.

As illustrated in FIG. 38, the casing 190 is accommodated in an outer package 198. The outer package 198 illustrated in FIG. 38 includes a lid 198a and a base 198b. The lid 198a is formed so as to cover the casing 190 on the base 198b.

In this manner, according to the present embodiment, the pedestal 10 is arranged inside the first weight body 21 of the vibrating body 20 formed in a frame shape in plan view. This makes it possible to increase the planar area of the first weight body 21 so as to increase the mass of the first weight body 21, achieving an increase in the stress generated in the first bridge supporting portions 30A to 30D in a case where the vibration acceleration is applied. As a result, it is possible to increase the charge generated from the upper electrode layers E11 to E44 of the piezoelectric element 40, leading to enhancement of the power generation efficiency of three-axis power generation.

Moreover, according to the present embodiment, the first weight body 21 of the vibrating body 20 includes the first weight body frame portion 180 and the plurality of first weight body inner side portions 181A to 181D coupled to the first weight body frame portion 180. This makes it possible to further expand the planar area of the first weight body 21, leading to a further increase in the mass of the first weight body 21.

Moreover, according to the present embodiment, the first weight body inner side portions 181A to 181D are arranged between the first bridge supporting portions 30A to 30D adjacent to each other in the circumferential direction with the pedestal 10 defined as a center in plan view. This makes it possible to locate the ends 31A to 31D of the first bridge supporting portions 30A to 30D on the first weight body frame portion 180 side so as to be away from the ends 32A to 32D on the pedestal 10 side while increasing the planar area of the first weight body 21. This makes it possible to increase the lengths of the first bridge supporting portions 30A to 30D while increasing the mass of the first weight body 21, leading to achievement of a lower resonance frequency.

Moreover, according to the present embodiment, the inner edges 182A to 182D of the first weight body inner side portions 181A to 181D on the pedestal 10 side are formed along the outer edge 14 of the pedestal 10, while the inner edges 183A to 183D of the first weight body inner side portions 181A to 181D on the opposing first bridge supporting portions 30A to 30D sides are formed along the side edges 33A to 33D of the first bridge supporting portions 30A to 30D. This makes it possible to increase the occupancy of the first weight body inner side portions 181A to 181D in a space between the first bridge supporting portions 30A to 30D adjacent to each other in the circumferential direction with the pedestal 10 defined as a center. This makes it possible to effectively increase the mass of the first weight body inner side portions 181A to 181D, leading to a further increase in the mass of the first weight body 21.

Ninth Embodiment

Next, a power generating element according to a ninth embodiment of the present invention will be described with reference to FIGS. 39 to 44.

In the ninth embodiment illustrated in FIGS. 39 to 44, a main difference is in that the vibrating body is supported on the pedestal by a diaphragm supporting portion. The other configurations are substantially the same as those of the first embodiment illustrated in FIGS. 1 to 15. In FIGS. 39 to 44, the same portions as those of the first embodiment illustrated in FIGS. 1 to 15 will be denoted by the same reference numerals, and a detailed description thereof will be omitted.

Figure 39:
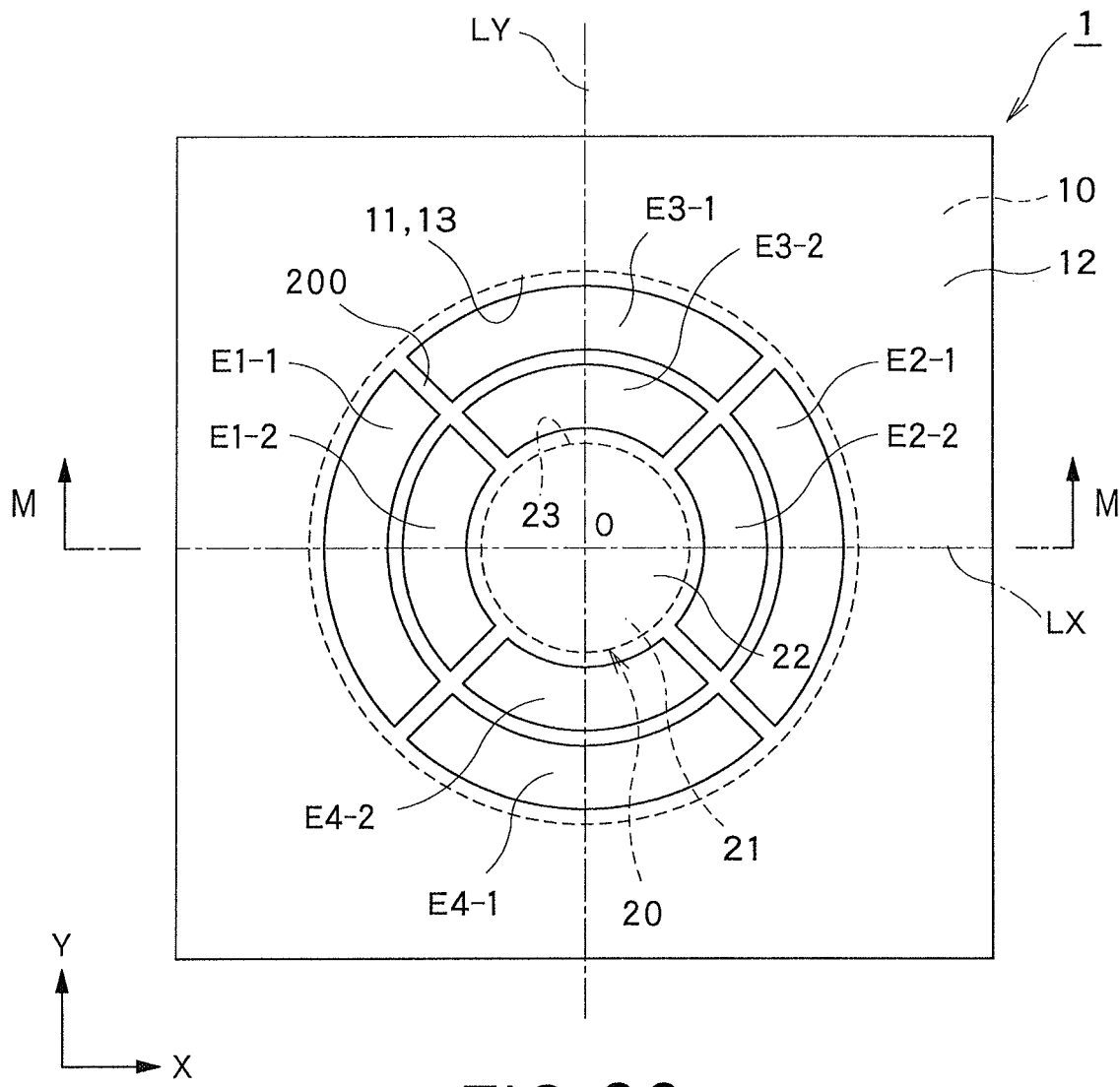
FIG. 39 is a plan view illustrating a power generating element according to a ninth embodiment of the present invention.
Figure 40:
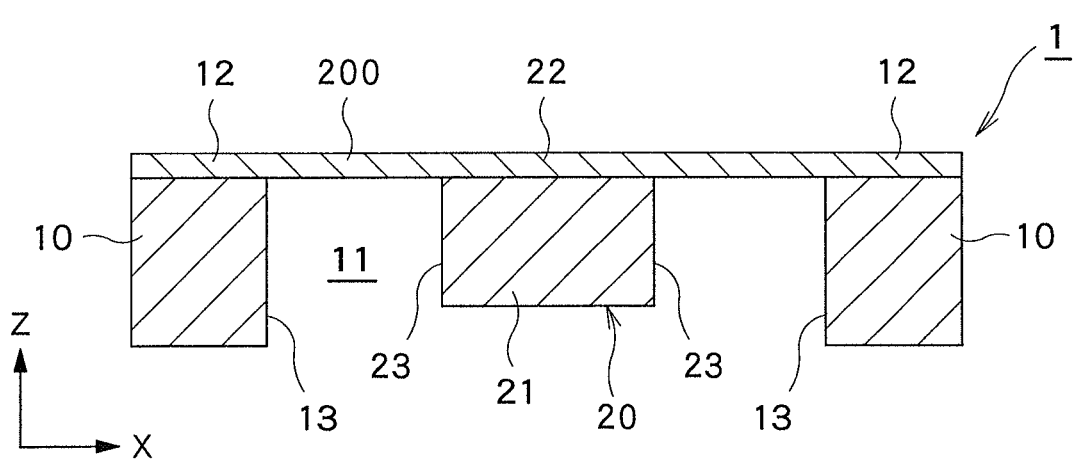
FIG. 40 is a cross-sectional view of the power generating element illustrated in FIG. 39, taken along line M-M.

FIG. 39 is a plan view of a power generating element according to the ninth embodiment of the present invention. FIG. 40 illustrates a cross section of the power generating element illustrated in FIG. 39, taken along line M-M.

In the present embodiment, as illustrated in FIGS. 39 and 40, the first weight body 21 of the vibrating body 20 is supported on the pedestal 10 by a diaphragm supporting portion 200 (supporting portion) being an alternative member of the above-described first bridge supporting portions 30A to 30D.

In the present embodiment, the pedestal 10 is formed in a frame shape in plan view, and the first weight body 21 is arranged inside the pedestal 10. The pedestal opening 11 (opening defined by the inner edge 13) of the pedestal 10 is formed in a circular shape in plan view, and the first weight body 21 is formed in a circular shape in plan view. The pedestal opening 11 of the pedestal 10 is formed concentrically with the first weight body 21. In FIG. 39, the outer edge of the first weight body 21 is indicated by reference sign 23.

The diaphragm supporting portion 200 is arranged between the pedestal 10 and the first weight body 21, and is formed in a ring shape in plan view. The first weight body supporting portion 22 provided on the upper surface of the first weight body 21 is continuously and integrally formed with the diaphragm supporting portion 200. Moreover, the pedestal supporting portion 12 provided on the upper surface of the pedestal 10 is continuously and integrally formed with the diaphragm supporting portion 200.

The piezoelectric element 40 according to the present embodiment includes eight upper electrode layers E1-1 to E4-2. These upper electrode layers E1-1 to E4-2 are provided in the diaphragm supporting portion 200. It is preferable that the upper electrode layers E1-1 to E4-2 are arranged in a region where the stress is generated when the first weight body 21 is displaced (region where the diaphragm supporting portion 200 itself is deformed) of the diaphragm supporting portion 200. These upper electrode layers E1-1 to E4-2 are electrically independent from each other.

In the present embodiment, the upper electrode layers E1-1, E1-2, E2-1, and E2-2 are arranged on both sides of the first weight body 21 in a direction along the center axis LX (first axis) extending in the X-axis direction of the first weight body 21. More specifically, the two upper electrode layers E1-1 and E1-2 are arranged at mutually different positions on the negative side (one side) on the X-axis with respect to the first weight body 21 (or the center O), while the two upper electrode layers E2-1 and E2-2 are arranged at mutually different positions on the positive side (the other side) on the X-axis with respect to the first weight body 21. The upper electrode layer E1-1 is arranged on more negative side on the X-axis than the upper electrode layer E1-2, while the upper electrode layer E2-1 is arranged on more positive side on the X-axis than the upper electrode layer E2-2. The upper electrode layers E1-1, E1-2, E2-1, and E2-2 are arranged on the center axis LX.

Moreover, the upper electrode layers E3-1, E3-2, E4-1, and E4-2 are arranged on both sides of the first weight body 21 in a direction along the center axis LY (second axis) extending in the Y-axis direction of the first weight body 21. More specifically, the two upper electrode layers E3-1 and E3-2 are arranged at mutually different positions on the positive side (one side) on the Y-axis with respect to the first weight body 21, while the two upper electrode layers E4-1 and E4-2 are arranged at mutually different positions on the negative side (the other side) on the Y-axis with respect to the first weight body 21. The upper electrode layer E3-1 is arranged on more positive side on the Y-axis than the upper electrode layer E3-2, while the upper electrode layer E4-1 is arranged on more negative side on the Y-axis than the upper electrode layer E4-2. The upper electrode layers E3-1, E3-2, E4-1, and E4-2 are arranged on the center axis LY.

In plan view, the upper electrode layers E1-1 to E4-2 extend in the circumferential direction (circumferential direction with respect to the center O) with the first weight body 21 defined as a center, so as to be formed concentrically with the first weight body 21. That is, each of the upper electrode layers E1-1 to E4-2 has a planar shape that forms an arc concentric with the first weight body 21. The upper electrode layers E1-1, E1-2, E2-1, and E2-2 are formed symmetrically with respect to the center axis LX, while the upper electrode layers E3-1, E3-2, E4-1, and E4-2 are formed symmetrically with respect to the center axis LY.

In this manner, the upper electrode layers E1-1 to E4-2 according to the present embodiment are formed as a whole symmetrically with respect to the center axis LX while being formed symmetrically with respect to the center axis LY in plan view.

FIG. 41 illustrates a polarity of a charge generated in each of the upper electrode layers E1-1 to E4-2 in a case where vibration acceleration is applied to the positive side on the X-axis, the positive side on the Y-axis, and the positive side on the Z-axis.

In a case where vibration acceleration to the positive side on the X-axis is applied, a tensile stress is generated in the region where the upper electrode layers E1-1 and E2-2 are arranged, and a positive charge is generated in the upper electrode layers E1-1 and E2-2. Compressive stress is generated in the region where the upper electrode layers E1-2 and E2-1 are arranged, and a negative charge is generated in the upper electrode layers E1-2 and E2-1. In the region where the upper electrode layers E3-1, E3-2, E4-1, and E4-2 are arranged, a tensile stress is generated in a portion thereof and compressive stress is generated in another portion thereof. As a result, a positive charge is generated in a portion and a negative charge is generated in another portion in the upper electrode layers E3-1, E3-2, E4-1, and E4-2, causing the charges to be canceled. Due to this, the charge generated in the upper electrode layers E3-1, E3-2, E4-1, and E4-2 is zero. Although not illustrated, in a case where vibration acceleration to the negative side on the X-axis is applied, a negative charge is generated in the upper electrode layers E1-1 and E2-2, and a positive charge is generated in the upper electrode layers E1-2 and E2-1.

In a case where vibration acceleration to the positive side on the Y-axis is applied, compressive stress is generated in the region where the upper electrode layers E3-1 and E4-2 are arranged, and a negative charge is generated in the upper electrode layers E3-1 and E4-2. A tensile stress is generated in the region where the upper electrode layers E3-2 and E4-1 are arranged, and a positive charge is generated in the upper electrode layers E3-2 and E4-1. In the region where the upper electrode layers E1-1, E1-2, E2-1, and E2-2 are arranged, a tensile stress is generated in a portion thereof and compressive stress is generated in another portion thereof. As a result, a positive charge is generated in a portion and a negative charge is generated in another portion in the upper electrode layers E1-1, E1-2, E2-1, and E2-2, causing the charges to be canceled. Due to this, the charge generated in the upper electrode layers E1-1, E1-2, E2-1, and E2-2 is zero. Although not illustrated, in a case where vibration acceleration to the negative side on the Y-axis is applied, a positive charge is generated in the upper electrode layers E3-1 and E4-2, and a negative charge is generated in the upper electrode layers E3-2 and E4-1.

In a case where vibration acceleration to the positive side on the Z-axis (upward) is applied, compressive stress is generated in the region where the upper electrode layers E1-1, E2-1, E3-1 and E4-1 are arranged, and a negative charge is generated in the upper electrode layers E1-1, E2-1, E3-1 and E4-1. A tensile stress is generated in the region where the upper electrode layers E1-2, E2-2, E3-2 and E4-2 are arranged, and a positive charge is generated in the upper electrode layers E1-2, E2-2, E3-2 and E4-2. Although not illustrated, in a case where vibration acceleration to the negative side on the Z-axis (downward) is applied, a positive charge is generated in the upper electrode layers E1-1, E2-1, E3-1 and E4-1, and a negative charge is generated in the upper electrode layers E1-2, E2-2, E3-2 and E4-2.

Even in a case where the vibration acceleration in the X-axis direction, the Y-axis direction, and the Z-axis direction is applied in this manner, it is possible to generate a charge by the upper electrode layers E1-1 to E4-2 and perform three-axis power generation. Therefore, it can be said that the upper electrode layers E1-1 to E4-2 in FIG. 39 are arranged so as to be able to effectively perform three-axis power generation.

Figure 42:
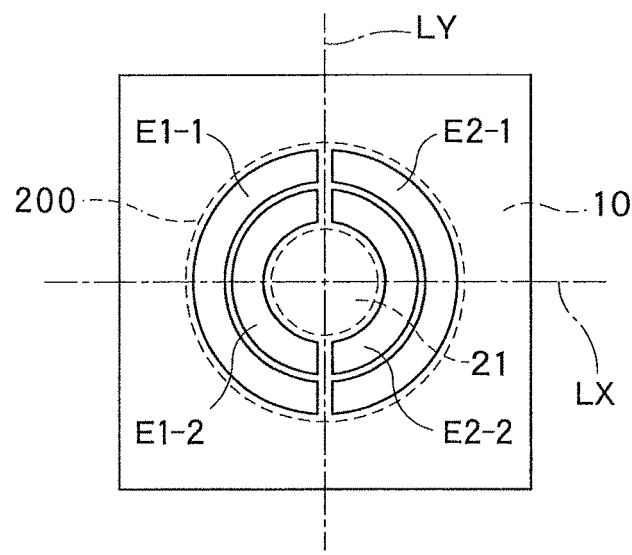
FIG. 42 is a plan view illustrating a modification of the upper electrode layer of the piezoelectric element illustrated in FIG. 39.

The arrangement of the upper electrode layer is not limited to this. For example, in a case where it is sufficient to be able to generate a charge by vibration acceleration in the X-axis direction and the Z-axis direction, it is allowable to arrange the four upper electrode layers E1-1 to E2-2 on the diaphragm supporting portion 200 as illustrated in FIG. 42. In this case, each of the upper electrode layers E1-1 to E2-2 extends in the circumferential direction so as to form an arc concentric with the first weight body 21, and both ends thereof face the center axis LY.

Figure 43:
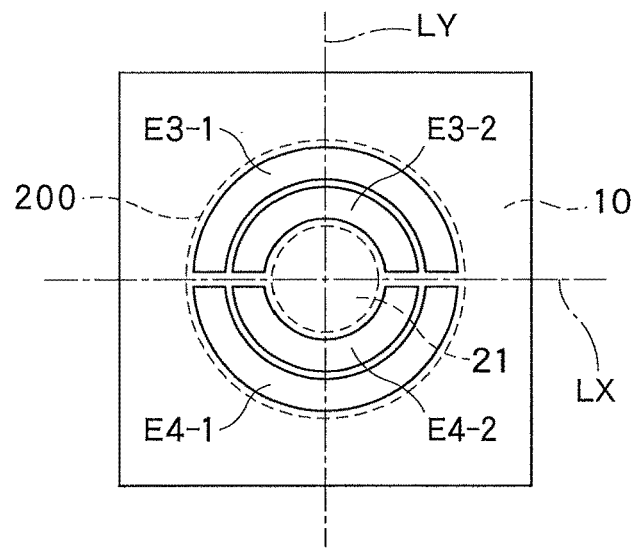
FIG. 43 is a plan view illustrating a modification of the upper electrode layer of the piezoelectric element illustrated in FIG. 39.

In another case where it is sufficient to be able to generate a charge by vibration acceleration in the Y-axis direction and the Z-axis direction, it is allowable to arrange the four upper electrode layers E3-1 to E4-2 on the diaphragm supporting portion 200 as illustrated in FIG. 43. In this case, each of the upper electrode layers E3-1 to E4-2 extends in the circumferential direction so as to form an arc concentric with the first weight body 21, and both ends thereof face the center axis LX.

Figure 44:
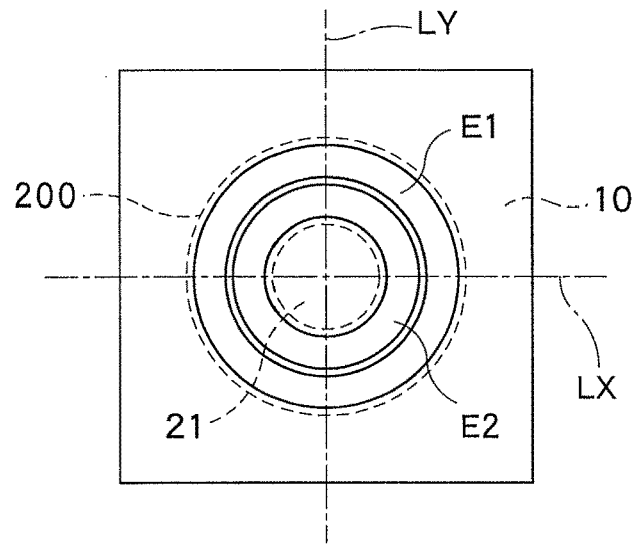
FIG. 44 is a plan view illustrating a modification of the upper electrode layer of the piezoelectric element illustrated in FIG. 39.

In still another case where it is sufficient to be able to generate a charge by vibration acceleration in the Z-axis direction, it is allowable to arrange the two upper electrode layers E1 and E2 on the diaphragm supporting portion 200 as illustrated in FIG. 44. In this case, each of the upper electrode layers E1 and E2 is formed in a ring shape so as to form an arc concentric with the first weight body 21.

In FIG. 41, the charge generated in the upper electrode layers E1-1 to E4-2 is represented by a positive charge (+) or a negative charge (−). In many cases, the stress generated in the diaphragm supporting portion 200 and the charge generated in the upper electrode layers E1-1 to E4-2 are uniquely determined in the case of the thin film-formed piezoelectric material layer 42. In a case, however, where the piezoelectric material layer 42 is formed of a piezoelectric ceramic as described above, it is possible to intentionally change the positive/negative of the charge generated by the compressive stress and the tensile stress by polarization treatment. This makes the present embodiment advantageous from a viewpoint that it is possible to generate a charge in all or a portion of the upper electrode layers E1-1 to E4-2 in any direction in three-dimensions, regardless of positive-negative of the charge generated in the upper electrode layers E1-1 to E4-2. This makes it possible to efficiently perform three-axis power generation.

In this manner, according to the present embodiment, the first weight body 21 of the vibrating body 20 is supported on the pedestal 10 by the diaphragm supporting portion 200. It is possible to generate a relatively great bending stress in a portion of the diaphragm supporting portion 200 even in a case where vibration acceleration is applied from any direction in three-dimensions. This makes it possible to increase the charge generated in the upper electrode layers E1-1 to E4-2 by vibration acceleration from any direction. As a result, it is possible to efficiently generate a charge in each of the upper electrode layers E1-1 to E4-2 from the stress generated in the diaphragm supporting portion 200 by the displacement of the first weight body 21 and to efficiently perform three-axis power generation.

Moreover, according to the present embodiment, the first weight body 21 is supported on the pedestal 10 by the diaphragm supporting portion 200. Accordingly, even in a case where vibration acceleration is applied from any direction in three-dimensions, symmetry can be applied to the deformation state of the diaphragm supporting portion 200. This makes it possible to equalize the total amount of positive charges and the total amount of negative charges generated in each of the upper electrode layers E1-1 to E4-2, leading to enhancement of the power generation efficiency.

Moreover, according to the present embodiment, the first weight body 21 of the vibrating body 20 is supported on the pedestal 10 by the diaphragm supporting portion 200. This makes it possible to suppress the amount of displacement of the first weight body 21 in a case where the vibration acceleration is applied. This makes it possible to prevent the first weight body 21 from abutting the top plate 71 or the bottom plate 74 of the casing 70 in a wider acceleration range. This enables suppressing an escape of the force received by the first weight body 21 to the top plate 71 and the bottom plate 74, and increasing the stress generated in the diaphragm supporting portion 200, so as to increase the charge generated from the piezoelectric element 40. As a result, it is possible to suppress the displacement of the first weight body 21 and increase the power generation amount.

Moreover, according to the present embodiment, the first weight body 21 is supported by the diaphragm supporting portion 200. Therefore, it is possible to suppress generation of warpage in the diaphragm supporting portion 200, leading to an advantage in manufacturing.

Moreover, in the present embodiment, the upper electrode layers E1-1, E1-2, E2-1, and E2-2 are arranged on both sides of the first weight body 21 in a direction along the center axis LX extending in the X-axis direction of the first weight body 21. This configuration enables a charge to be generated in each of the upper electrode layers E1-1, E1-2, E2-1, and E2-2 by the stress generated at the both side portions of the first weight body 21 in the diaphragm supporting portion 200. This makes it possible to efficiently generate a charge from the stress generated in the diaphragm supporting portion 200.

Moreover, according to the present embodiment, the two upper electrode layers E1-1 and E1-2 are arranged at mutually different positions on the negative side on the X-axis with respect to the first weight body 21, while the two upper electrode layers E2-1 and E2-2 are arranged at mutually different positions on the positive side on the X-axis with respect to the first weight body 21. This makes it possible to allow the upper electrode layers E1-1, E1-2, E2-1, and E2-2 to be arranged in a portion where a compressive stress is generated and a portion where a tensile stress is generated in a case where the diaphragm supporting portion 200 is deformed. Therefore, it is possible to prevent the charge generated in one upper electrode layer from being canceled due to simultaneous generation of the negative charge caused by the compressive stress and the positive charge caused by the tensile stress. As a result, it is possible to efficiently generate a charge from the stress generated in the diaphragm supporting portion 200, and to further efficiently perform three-axis power generation.

Moreover, according to the present embodiment, the upper electrode layers E3-1, E3-2, E4-1, and E4-2 are arranged on both sides of the first weight body 21 in a direction along the center axis LY extending in the Y-axis direction of the first weight body 21. This configuration enables a charge to be generated in each of the upper electrode layers E3-1, E3-2, E4-1, and E4-2 by the stress generated at the both side portions of the first weight body 21 in the diaphragm supporting portion 200. This makes it possible to efficiently generate a charge from the stress generated in the diaphragm supporting portion 200.

Moreover, according to the present embodiment, the two upper electrode layers E3-1 and E3-2 are arranged at mutually different positions on the positive side on the Y-axis with respect to the first weight body 21, while the two upper electrode layers E4-1 and E4-2 are arranged at mutually different positions on the negative side on the Y-axis with respect to the first weight body 21. This makes it possible to allow the upper electrode layers E3-1, E3-2, E4-1, and E4-2 to be arranged in a portion where a compressive stress is generated and a portion where a tensile stress is generated in a case where the diaphragm supporting portion 200 is deformed. Therefore, it is possible to prevent the charge generated in one upper electrode layer from being canceled due to simultaneous generation of the negative charge caused by the compressive stress and the positive charge caused by the tensile stress. As a result, it is possible to efficiently generate a charge from the stress generated in the diaphragm supporting portion 200, and to further efficiently perform three-axis power generation.

Moreover, according to the present embodiment, each of the pedestal opening 11 and the first weight body 21 of the pedestal 10 is formed in a circular shape in plan view, and the pedestal opening 11 is concentrically formed with the first weight body 21. With this configuration, further symmetry can be applied to the deformation state of the diaphragm supporting portion 200. For example, in a case where the vibration acceleration is applied in the X-axis direction, it is possible to deform the diaphragm supporting portion 200 symmetrically with respect to the center axis LY. Moreover, in a case where the vibration acceleration is applied in the Y-axis direction, it is possible to deform the diaphragm supporting portion 200 symmetrically with respect to the center axis LX. In a case where the vibration acceleration is applied in the Z-axis direction, it is possible to deform the diaphragm supporting portion 200 symmetrically with respect to each of the center axis LX and the center axis LY. Therefore, the total amount of the positive charges and the total amount of the negative charges generated in the upper electrode layers E1-1 to E4-2 can be further equalized, leading to further enhancement of the power generation efficiency.

Moreover, according to the present embodiment, the upper electrode layers E1-1 to E4-2 extend in the circumferential direction with the first weight body 21 defined as a center in plan view, and are concentrically formed with the first weight body 21. Here, for example, in a case where vibration acceleration is applied to the positive side on the Z-axis, compressive stress is generated in the area (outer peripheral side area) of the diaphragm supporting portion 200 on the pedestal 10 side, and the tensile stress is generated in the region on the first weight body 21 side (inner peripheral side region). In a case where the vibration acceleration is applied to the negative side on the Z-axis, the tensile stress is generated in the region on the pedestal 10 side, while the compressive stress is generated in the region on the first weight body 21 side. As a result, in a case where the diaphragm supporting portion 200 is deformed by the vibration acceleration applied in the Z-axis direction, it is possible to form the upper electrode layer E1-1 to E4-2 along the region where the compressive stress is generated and the region where the tensile stress is generated in the diaphragm supporting portion 200. This makes it possible to efficiently generate a charge from the stress generated in the diaphragm supporting portion 200.

The above-described present embodiment is an exemplary case where the upper electrode layers E1-1 to E4-2 extend in the circumferential direction with the first weight body 21 defined as a center in plan view and are concentrically formed with the first weight body 21. However, not limited thereto, the upper electrode layers E1-1 to E4-2 may be formed in a rectangular shape in plan view as the upper electrode layers E1 and E2 illustrated in FIG. 13. In this case, it is preferable that the upper electrode layers E1-1 to E2-2 are arranged on the center axis LX while the upper electrode layers E3-1 to E4-2 are arranged on the center axis LY. Alternatively, the upper electrode layer on the diaphragm supporting portion 200 may be arranged as illustrated in FIG. 12, or still alternatively, it may be arranged as illustrated in FIG. 2.

The above-described present embodiment is an exemplary case where the first weight body 21 is arranged inside the pedestal 10 formed in a frame shape in plan view. However, not limited thereto, the pedestal 10 may be arranged inside the first weight body 21 by forming the first weight body 21 in a frame shape. This makes it possible to increase the planar area of the first weight body 21 to increase the mass of the first weight body 21, achieving an increase in the stress generated in the diaphragm supporting portion 200 in a case where the vibration acceleration is applied. This leads to an increase in the charge generated from the upper electrode layers E1-1 to E4-2 of the piezoelectric element 40 and enhancement of the power generation efficiency of three-axis power generation.

The present invention is not limited to the above-described embodiments and modifications as they are, and constituent elements can be modified and embodied within the scope not deviating from the spirit thereof at a stage of implementation. Moreover, various inventions can be formed by appropriately combining a plurality of constituent elements disclosed in the embodiment and the modifications. Some constituent elements may be deleted from all the constituent elements illustrated in the embodiments and the modifications. Moreover, constituent elements according to different embodiments and modifications may be appropriately combined with each other.

The invention claimed is:

1. A power generating element comprising:
   a pedestal formed in a frame shape in plan view;
   a vibrating body provided inside the pedestal;
   at least three first bridge supporting portions, each of said at least three first bridge supporting portions extending along a first extending axis and configured to arrange the vibrating body to be supported on the pedestal; and
   a charge generating element that generates a charge at the time of displacement of the vibrating body,
   wherein the first extending axes of a pair of said at least three first bridge supporting portions adjacent to each other in a circumferential direction with the vibrating body defined as a center in plan view form a predetermined angle,
   the charge generating element includes a plurality of first electrode layers being electrically independent from each other,
   at least one of the plurality of first electrode layers is arranged on each of said at least three first bridge supporting portions,
   the vibrating body includes: a first weight body; a second weight body; and at least three second bridge supporting portions coupling the first weight body with the second weight body,
   the first weight body and the second weight body are spaced apart from each other, and
   a second additional weight body is provided on a lower surface of the second weight body.

2. The power generating element according to claim 1, wherein the first extending axes of said at least three first bridge supporting portions are arranged radially with respect to the vibrating body in plan view.

3. The power generating element according to claim 1, wherein the predetermined angles formed by the first extending axes of a pair of said at least three first bridge supporting portions adjacent to each other in the circumferential direction with the vibrating body defined as the center in plan view are equal.

4. The power generating element according to claim 1, wherein the vibrating body is supported by four first bridge supporting portions.

5. The power generating element according to claim 1, wherein the vibrating body is supported by said at least three first bridge supporting portions.

6. The power generating element according to claim 1, wherein the first bridge supporting portion includes:
a first direction portion extending along the corresponding first extending axis; and
a second direction portion provided on more toward the side of the pedestal than the first direction portion and extending in a direction different from the corresponding first extending axis.

7. The power generating element according to claim 1, wherein the first bridge supporting portion includes a vibrating body-side portion, an intermediate portion, and a pedestal-side portion, being arranged at mutually different positions in a direction perpendicular to the corresponding first extending axis,
an end of the vibrating body-side portion on the side of the pedestal is coupled with an end of the intermediate portion on the side of the vibrating body by a first coupling portion, and
an end of the intermediate portion on the side of the pedestal is coupled with an end of the pedestal-side portion on the side of the vibrating body by a second coupling portion.

8. The power generating element according to claim 1, wherein a first additional weight body is provided on a lower surface of the first weight body.

9. The power generating element according to claim 1, wherein, in each of said at least three first bridge supporting portions, the plurality of the first electrode layers is arranged at mutually different positions in a direction along the corresponding first extending axis.

10. The power generating element according to claim 1, wherein a first additional weight body is provided on a lower surface of the first weight body,
a bottom plate coupled to the pedestal is provided below the first additional weight body and the second additional weight body,
the bottom plate includes a bottom plate facing surface facing the first additional weight body and the second additional weight body,
the bottom plate facing surface includes a first bottom plate-side projection to which the first additional weight body can abut in a case where the first weight body is displaced downward, and includes a second bottom plate-side projection to which the second additional weight body can abut in a case where the second weight body is displaced downward, and
when the vibrating body is in a neutral position, a distance between the first additional weight body and the first bottom plate-side projection is longer than a distance between the second additional weight body and the second bottom plate-side projection.

11. The power generating element according to claim 1, wherein each of said at least three second bridge supporting portions extends along a second extending axis, and
the second extending axis of the second bridge supporting portion is extended along the first extending axis of the corresponding first bridge supporting portion.

12. The power generating element according to claim 1, wherein the second weight body includes a first draw-in recessed portion that draws in an end of the first bridge supporting portion on the side of the second weight body in plan view.

13. The power generating element according to claim 1, wherein the second weight body includes a second draw-in recessed portion that draws in an end of the second bridge supporting portion on the side of the second weight body in plan view.

14. The power generating element according to claim 1, wherein at least one of the plurality of the first electrode layers is arranged on each of said at least three second bridge supporting portions.

15. The power generating element according to claim 1, wherein each of said at least three second bridge supporting portions extends along a second extending axis, and
the second extending axis of the second bridge supporting portion is arranged between each of the corresponding first extending axis of a pair of said at least three first bridge supporting portions adjacent to each other in the circumferential direction with the vibrating body defined as the center in plan view.

16. The power generating element according to claim 15, wherein an angle formed by the second extending axis of the second bridge supporting portion and the first extending axis of one of said at least three first bridge supporting portions adjacent to each other in the circumferential direction with the vibrating body defined as a center in plan view is equal to an angle formed by said second extending axis and the first extending axis of the other first bridge supporting portion.

* * * * *